(12) United States Patent
Sadr

(10) Patent No.: US 12,256,641 B2
(45) Date of Patent: *Mar. 18, 2025

(54) GREEN ENERGY HARVESTING METHODS FOR NOVEL CLASS OF BATTERIES AND POWER SUPPLIES

(71) Applicant: Ramin Sadr, Los Angeles, CA (US)

(72) Inventor: Ramin Sadr, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/340,037

(22) Filed: Jun. 23, 2023

(65) Prior Publication Data

US 2023/0413676 A1    Dec. 21, 2023

Related U.S. Application Data

(63) Continuation of application No. 17/699,162, filed on Mar. 20, 2022, now Pat. No. 11,723,277, which is a continuation of application No. 16/378,520, filed on Apr. 8, 2019, now Pat. No. 11,283,003.

(51) Int. Cl.
  *H10N 30/20*   (2023.01)
  *H01L 31/02*   (2006.01)
  *H02N 2/18*    (2006.01)

(52) U.S. Cl.
  CPC ... *H10N 30/2042* (2023.02); *H01L 31/02008* (2013.01); *H02N 2/186* (2013.01)

(58) Field of Classification Search
  CPC .............. H01L 31/02008; H02N 2/186; H10N 30/2042
  See application file for complete search history.

(56) References Cited

U.S. PATENT DOCUMENTS

| | | |
|---|---|---|
| 6,477,028 B1 | 11/2002 | Pinto |
| 6,593,566 B1 | 7/2003 | Pinto |
| 6,650,527 B1 | 11/2003 | Pinto |
| 6,665,167 B2 | 12/2003 | Pinto |
| 6,842,326 B2 | 1/2005 | Pinto |

(Continued)

OTHER PUBLICATIONS

Portions of prosecution history of U.S. Appl. No. 16/378,520, filed Mar. 2, 2022.

(Continued)

*Primary Examiner* — J. San Martin
(74) *Attorney, Agent, or Firm* — Makoui Law, PC; Ali Makoui

(57) ABSTRACT

An energy harvesting device for powering electronic devices such as wireless sensors and IoT devices is described. The device relies on nature's fundamental forces to convert kinetic energy to electrical energy, acting as power source; while accounting for the Casimir force. Nanotechnology and MEMS are used to fabricate the device embedding a mechanical oscillator, electronic circuitry, energy harvester, and transducer integrated in the same packaging. The device supports mechanism to excite and ignite the oscillatory behavior via RF signal from a remote signal source that synthesizes the RF signal on a fix or mobile platform. Additionally, solar and RF signals may be added constructively to boost the output power of the device. The device scales from micron size to blades and racks formed from arrays of the connected devices to increase the output power of the aggregate system to any desired level for powering home appliances or computer networks.

18 Claims, 41 Drawing Sheets

(56) References Cited

U.S. PATENT DOCUMENTS

| | | | |
|---|---|---|---|
| 6,920,032 B2 | 7/2005 | Pinto | |
| 7,268,517 B2 | 9/2007 | Rahmel et al. | |
| 7,379,286 B2 | 5/2008 | Haisch et al. | |
| 7,411,772 B1 | 8/2008 | Tymes | |
| 8,317,137 B2 | 11/2012 | Cormier | |
| 8,436,700 B2 | 5/2013 | Schmit et al. | |
| 8,627,721 B2 | 1/2014 | Uwechue | |
| 8,680,514 B2 | 3/2014 | Park et al. | |
| 8,901,802 B1 * | 12/2014 | Que | H02N 2/186 310/330 |
| 8,975,805 B2 | 3/2015 | Kim et al. | |
| 9,455,649 B2 * | 9/2016 | Al Ahmad | H02N 2/188 |
| 9,691,500 B2 | 6/2017 | Caldeira et al. | |
| 10,680,176 B2 | 6/2020 | Kim et al. | |
| 11,283,003 B2 | 3/2022 | Sadr | |
| 11,723,277 B2 | 8/2023 | Sadr | |
| 2008/0296437 A1 | 12/2008 | Cormier | |
| 2010/0141095 A1 | 6/2010 | Park | |
| 2010/0253184 A1 | 10/2010 | Choi et al. | |
| 2011/0084345 A1 | 4/2011 | Park et al. | |
| 2011/0163636 A1 | 7/2011 | Sirbuly et al. | |
| 2012/0095721 A1 | 4/2012 | Uwechue | |
| 2013/0320807 A1 | 12/2013 | Sakaguchi et al. | |
| 2014/0331368 A1 | 11/2014 | Cannara et al. | |
| 2016/0094088 A1 | 3/2016 | Bjorn et al. | |
| 2016/0197261 A1 | 7/2016 | Abdelkefi et al. | |
| 2017/0200815 A1 | 7/2017 | Caldeira et al. | |
| 2019/0000332 A1 | 1/2019 | Li et al. | |
| 2019/0207537 A1 | 7/2019 | Bressi | |
| 2020/0358375 A1 | 11/2020 | Moddel | |
| 2020/0358376 A1 | 11/2020 | Moddel | |

OTHER PUBLICATIONS

Portions of prosecution history of U.S. Appl. No. 17/699,162 filed Aug. 8, 202.

Chan H.B., et al., "Quantum Mechanical Actuation of Microelectromechanical Systems by the Casimir Force," Science, vol. 291, Mar. 9, 2001, pp. 1941-1944.

Soldano, Henry A., et al., "A Review of Power Harvesting from Vibration using Piezoelectric Materials," the Shock and Vibration Digest, vol. 36, No. 3, May 2004, pp. 197-205.

Chen, Hao, et al., "Controlled Growth and Modification of Vertically-Aligned Carbon Nanotubes for Multifunctional Applications," Materials Science & Engineering, R 70, Jul. 2010, pp. 63-91.

Kim, Sang-Gook, et al., "Piezoelectic MEMS for Energy Harvesting," Materials Research Society (MRS) Bulletin 37.11, Nov. 2012. pp. 1039-1050.

Arefinia, Zahra, et al., "An analytical Model for Optimizing the Performance of Graphene Based Silicon Schottky Barrier Solar Cells," Materials Science in Semiconductor Processing, vol. 35, Jul. 2015, pp. 181-188.

Tiliakos, Athanasios, et al., "Space-Filling Supercapacitor Carpets: Highly Scalable Fractal Architecture for Energy Storage," Journal of Power Sources, 384, Feb. 2018, pp. 145-155.

Bordag M., et al., "Advances in the Casimir Effect," International Series of Monographs on Physics, vol. 145, Oxford Science Publications, Aug. 2009, pp. 351-400.

Derras-Chouk, Amel, et al., "Graphene Cantilever Under Casimir Force," Journal of Physics D: Applied Physics, vol. 51, Apr. 2018, pp. 1-6.

* cited by examiner

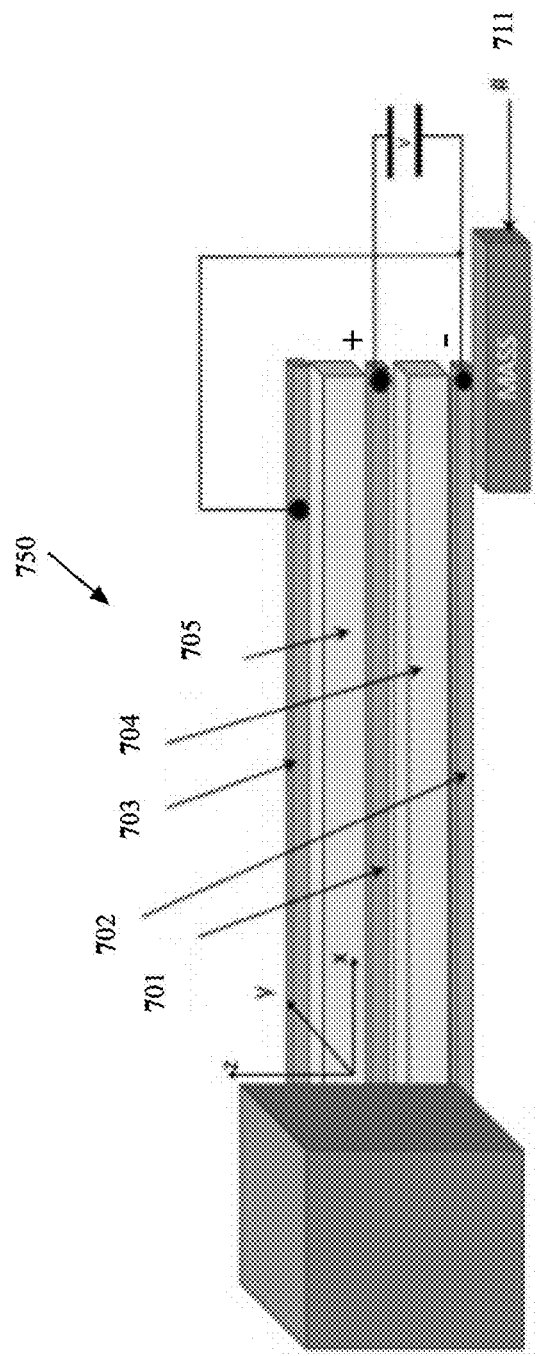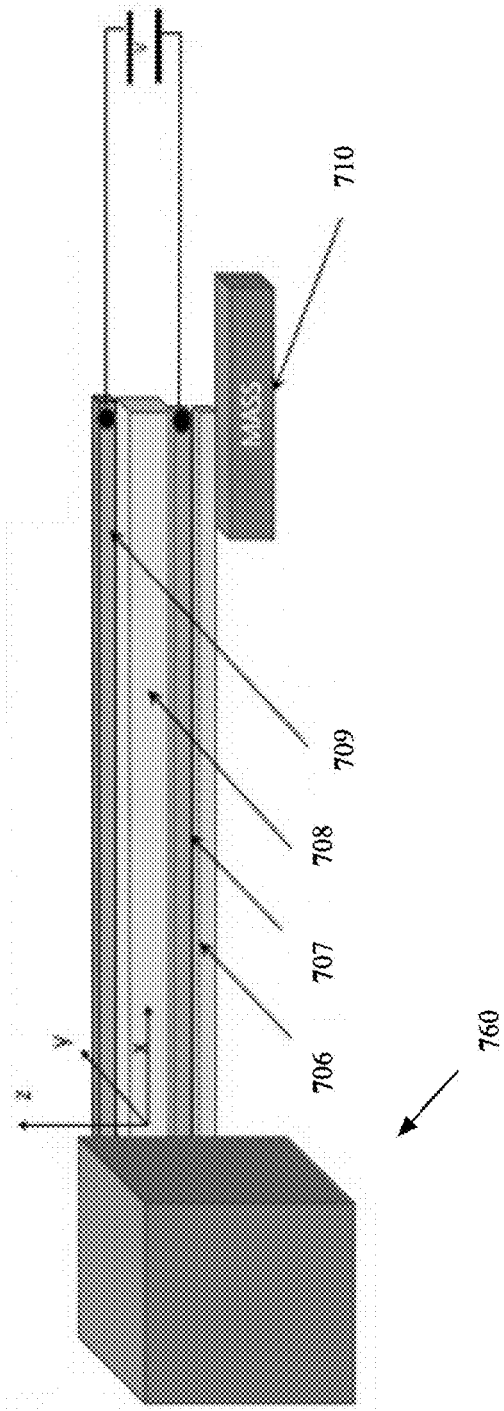
FIG. 7A
FIG. 7B

| | |
|---|---|
| Dimensions of Simulation | 5 um, 5um, 5um |
| Number of Grid Points | 500, 500, 500 |
| Polarizability (Au) | 1.88 x10^-30 m^3/Atom |
| Density | 5.8 x 10^28 Atoms/m^3 |

FIG. 12B ary

DETAILED DESCRIPTION

Figure 1:
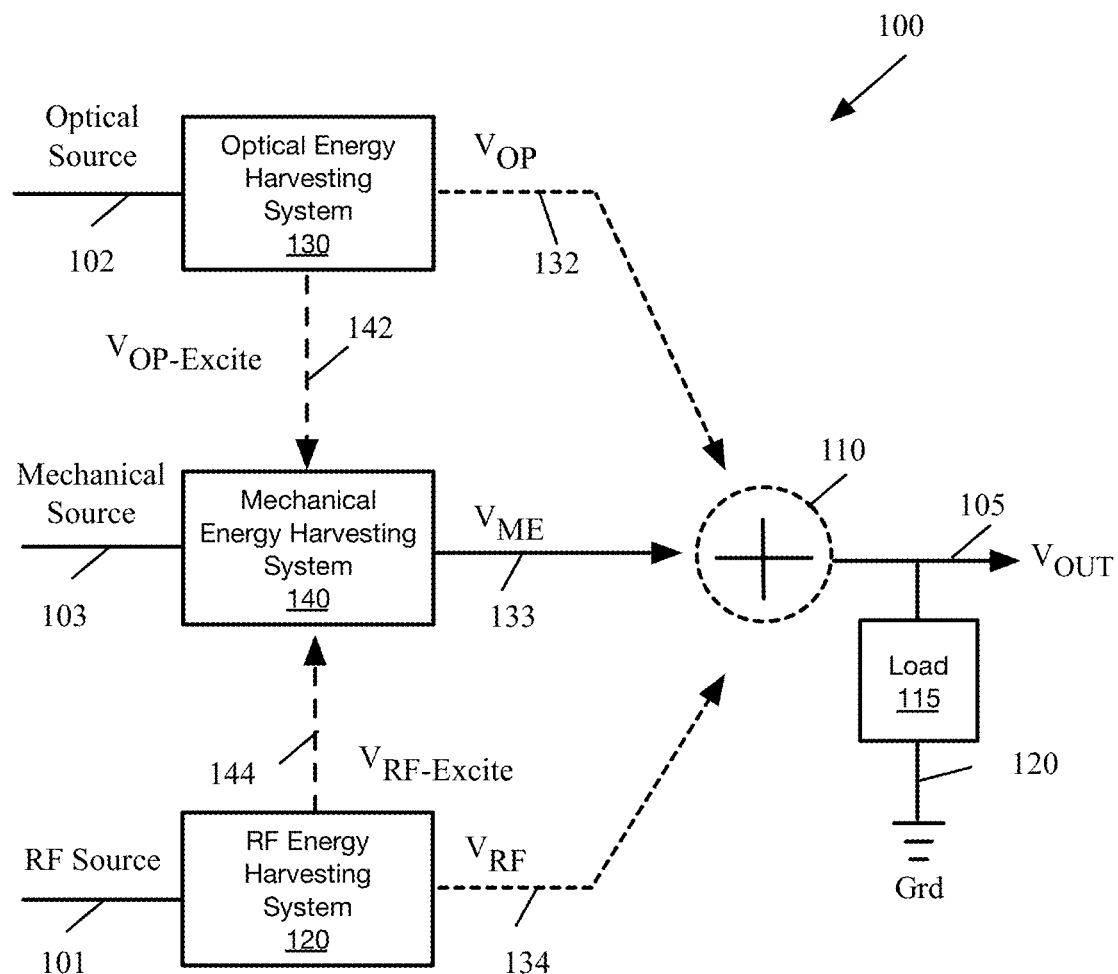

One aspect of the present embodiments includes the realization that past efforts to use the Casimir force as a perpetual energy source has not been successful, as the second law of thermodynamics is a fundamental barrier by nature to realize such a behavior. Quantum fluctuation in zero-point energy (ZPE) field and the Casimir force have been validated and measured to extreme accuracy. It has been attempted in the past to devise metamaterial to create a repulsive Casimir force, which has not led to any practical realization. In the past, xenon gas has been used in a closed cavity for extracting the vacuum energy from the xenon gas flowing through the cavity and attempting to harvest electrical current from pyroelectric detectors.

Embodiments of this disclosure and contemplated variations thereof solve this problem by providing, among other things, an energy harvesting device that uses a mechanical repulsive force to counter act with the attractive Casimir force, creating an emergent oscillatory behavior. A mechanical oscillator is realized by using a set of single or multi-walled carbon nanotubes connected between two metal plates, with one metal plate being free to move towards or away from the other plate.

Some of the present embodiments use nano piezoelectric microelectromechanical system (MEMS) cantilevers to harvest the energy from the mechanical vibration of the metal plate. The moving metal plate is attached to a cantilever (or an array of cantilevers) to convert the mechanical energy released from the oscillation of metal plates to electrical current. During the energy-harvesting normal mode of operation, the cantilever harvests energy from the mechanical oscillation of the moving metal plate. During the excitement mode (e.g., initial startup or reignition), when current is applied to a MEMS nano piezoelectric cantilever by an exciter, the nano piezoelectric flexes and creates a strain on carbon nanotubes, which adds constructively to the Casimir force to start (or continue) a period of oscillation.

Some of the present embodiments overcome the limitation of energy loss due to mechanical vibration and the second law of thermodynamics by providing a mechanism to supercharge the energy harvesting device via a radio frequency (RF) or solar source on a periodic basis. Damping of oscillation, in some of the present embodiments, is compensated by harvesting RF or optical energy sources. The concept of "ignition" and supercharging the device for assuring proper energy harvesting of the device is a novel mechanism for harvesting quantum fluctuation in very small dimensions. In some embodiments, the mechanical and solar sources of energy may be added together to increase the output energy of the energy harvesting device.

Some embodiments use a two-dimensional nanostructured fractal design for the parallel metal plates that are used to harvest the mechanical energy. The fractal design maximizes the area occupied by a conductive surface, while minimizing the total mass required to cover the conductive area. Thereby, reducing the cost of the overall apparatus, in addition to adding lateral current flux across the metal plate to further increase the amount of the output energy.

Some embodiments use curved surfaces instead of parallel plates to exploit the Casimir force. This may simplify fabrication of the device and avoid maintaining two flat plates near perfectly parallel with homogenous flat surfaces and fixed separation in very small distances of nanometers. Some of the present embodiments replace one or both flat plates by a curved surface such as a lens, sphere or cylinder. Some of the present embodiments keep one flat metal plate with a flat surface and use another curved surface with conductive property. In some embodiments one or both surfaces could move freely in one direction.

Some embodiments may use multiple energy sources to combine to increase the output of the energy harvesting device. These sources are kinetic energy of moving mass and the Casimir force, radio frequency signals, and optical power. Each respective energy source is harvested and is converted to electrical current as a power source for powering electronic products and sensors. The use of the nano-technology MEMS devices allows harnessing energy in very small dimensions in the orders of micro-to-nano meters. The energy harvesting devices are highly scalable and may be connected as an array of devices to provide sufficient power level to diverse use cases.

Embodiments of this disclosure and contemplated variations thereof provide green energy harvesting methods that use renewable energy sources with no chemical reactants. Renewable energy sources are referred to energy sources which are naturally replenished and often provide energy for generating electricity. Renewable energy is taken to be clean as they do not impact global warming or harm the environment by release of pollutants such as dangerous chemicals or toxic gas. The present embodiments are at the pinnacle of hierarchy of energy producing devices to emit no gas and require no chemical in production of energy. Furthermore, the energy source used in the present embodiments are sustainable energy, which do not get expired or depleted and may be used over-and-over to meet today's demand for low power sensors and IoT devices as power supply source, when used as a singular unit fabricated together in the same package with integrated circuits. Alternatively, when used as a group of devices working together, the devices seamlessly scale and meet energy required to any application today that is powered by disposable or rechargeable batteries. The present embodiments provide sustainable energy which is green, inexhaustible, safe, as there are no greenhouse gasses, or any pollutants emitted from the device.

The energy producing device, hereinafter referred to as energy harvesting device or simply as "the device," does not use any electrochemical reaction to produce energy. Utilization of any chemical energy is circumvented and "no-charging" is required in classical sense. Due to the second law of thermodynamics, the mechanical vibration cannot be eternal. In course of the lifetime of the device, it may be necessary to re-ignite the oscillation of the device time-to-time. The reignition process, in some of the present embodiments, is achieved by remotely injecting an RF signal which in turn is converted to mechanical energy to kick start power harvesting process. Whenever any reignition is desired, a judicious choice of an RF signal is transmitted to prime the oscillation of the energy harvesting device. The reignition (or kickstart) may be performed remotely from far field electromagnetic radiation in free space. The reignition may also be achieved through an RF energy harvesting mechanism, an optical energy harvesting mechanism, or both. This methodology does not require any coupling or cabling to any external electrical current source to recharge the energy harvesting device. In some of the present embodiments, if the RF signal or the optical signal is perpetually present, the RF power and/or the optical power may also be harvested to constructively add to the overall total output power.

One of the fundamental challenges in deployment of wireless sensor networks and IoT is cabling the device to a power source or using batteries that need to be charged periodically. The present embodiments address these limitations and lend themselves for powering electronic devices such as wireless sensors and IoT devices by providing self-powering devices without any physical interaction with or handling of the device.

In outdoor applications or in the areas where there is sufficient energy in visible light spectrum, some embodiments use light as a back-up energy source. When light is not present or when it is dark outdoor, uninterrupted power is provided to the device through the mechanical and RF energy sources. As an additional option for excitation of the energy harvesting device, some embodiments harvest the solar energy as an energy source for excitation as a forcing function to start oscillation of the moving plate, and/or to use the solar generated power as another additional source to augment to the total output power.

The remaining detailed description describes the present embodiments with reference to the drawings. In the drawings, reference numbers label elements of the present embodiments. These reference numbers are reproduced below in connection with the discussion of the corresponding drawing features.

Some of the present embodiments provide a novel system for energy harvesting in converting mechanical energy to electricity by taking advantage of the Casimir force. The Casimir force (also referred to as the Casimir effect or the Casimir-Polder force) is one of the most direct manifestations of the existence of zero-point vacuum oscillations. This effect is best conceptualized and observed in the attraction between two electrically neutral parallel conducting planes placed in vacuum. It is well established that the ground state of quantum electrodynamics causes the planes to attract each other, due to quantized electromagnetic field.

Due to the second law of thermodynamics, the mechanical vibration cannot be eternal. In course of the lifetime of the device, it may be necessary to re-ignite the oscillation of the device time-to-time. The term excitation (or reignition) used herein refers to priming the energy harvesting device (e.g., at power-up) to kick start the oscillation behavior between the two plates. The excitation may be used as frequently as necessary to either increase the period of the oscillation or re-start it from rest in ground state. The term excitation used herein, refers to a process that, in some of the present embodiments, is achieved by injecting an RF signal which in turn is converted to mechanical energy to kick start power harvesting process. For assuring steady source of energy over time, the energy harvesting device, in some embodiments, may be excited on an as needed basis with RF energy to prime the mechanical oscillation. If the RF signal is perpetually present, the RF energy may be utilized for constructively adding to the total output. In addition to, or in lieu of using the RF energy, some embodiments may complement the device by harvesting energy from solar or optical sources. In which case, the device may be advantageous for outdoor applications that use solar and optical sources as the main source of energy to provide uninterrupted power during nighttime or when dark by using the mechanical sources.

The energy harvesting devices of the present embodiments use a novel approach to a create green power from forces already existing in nature having been untapped collectively to constructively act together as an energy source. The resulting energy harvesting devices are environment friendly and do not employ any chemical agent to adversely impact the environment or produce any byproducts to pollute the air. The lifespan for these class of devices may be years without any human intervention for maintenance or replenishment needs.

With the emergence of wireless sensor networks and different classes of low-power sensing devices, prevalent in the IoT today, there is a challenge to provide power for the IoT devices. The energy harvesting devices of the present embodiments address this challenge by combining multiple power sources available in nature to provide the energy to run electronic devices. In some embodiments, these energy harvesting devices rely on fabrication in nano-scale with tolerances small enough to realize the optimal performance in emerging technologies available in the MEMS industry.

The energy harvesting mechanism of some of the present embodiments may also combine multiple energy sources, namely in addition to kinetic energy from a moving metal plate, RF power harvesting or solar power harvesting may be used to add to the output power of the device. These energy sources are additively summed together to produce an output voltage as an alternative option to increase the output power of the device.

FIG. 1 is a functional diagram illustrating one example embodiment of an energy harvesting device 100 that combines fundamental forces of kinematic and electromagnetic together to provide power supply source, according to various aspects of the present disclosure. The energy harvesting device 100 may utilize multiple sources and methodologies, as described herein, for harvesting energy from each source and providing the harvested energy either as output electricity or to reignite the energy harvesting device. With reference to FIG. 1, the dashed line 132 for $V_{op}$ and the dashed lime 134 for $V_{RF}$ indicate an option when it is desired to use one or both outputs, namely the output 134 harvested from the RF source 101 and/or the output 132 harvested from the optical source 101, to further boost the overall output power. The dashed lines 142 and 144 indicate the option to use some (or all) of the energy harvested from the optical energy harvesting system 130 and/or to use some (or all) of the energy harvested from the RF energy harvesting system 120 to reignite the mechanical energy harvesting system 140 as needed.

In the example of FIG. 1, the energy harvesting device 100 may include an RF input source 101, an optical input source 102, and a mechanical input source 103. The $V_{RF}$ 134 is the electrical voltage and/or current from an RF based energy harvesting system such as the RF energy harvesting system 120 described below with reference to FIG. 17. $V_{RF}$ 134 is the voltage level harvested from an RF source 101 such as the ambient electromagnetic radiation in a prescribed radio frequency range (e.g., 200 MHz to 5 GHz) in the licensed or unlicensed bands. Some or all the energy harvested from the RF energy harvesting system 120 may be used (as shown by $V_{RF-Excite}$ 144) to excite the mechanical energy harvesting system 140 as described below with reference to FIGS. 2A-2B.

The $V_{OP}$ 132 is the electrical voltage and/or current from a solar based energy harvesting device such as the energy harvesting system 130 described below with reference to FIG. 32. The $V_{OP}$ 132 is the voltage level harvested from solar radiation, or more precisely energy harvested in optical frequencies (e.g., 330 THz to 770 THz). Some or all energy harvested from the optical energy harvesting system 130 may be used (as shown by $V_{OP-Excite}$ 142) to excite the mechanical energy harvesting system 140 as described below with reference to FIGS. 2A-2B.

The $V_{ME}$ 133 is the electrical voltage and/or current from a mechanical based (e.g., using piezoelectric and/or the Casimir force sources) energy harvesting system such as the energy harvesting system 140 described below with reference to FIGS. 2A-2B. The Casimir force, in some embodiments, is harvested by one or more nano piezoelectric cantilevers.

In some embodiments, the energy harvesting device 100 may include the mechanical energy harvesting system 140 and only one of the optical energy harvesting system 130 or the RF energy harvesting system 120. The output signal $V_{OUT}$ 105, in some embodiments, may be formed by using a voltage adder 110 to additively sum together the voltage $V_{ME}$ 133 produced by the mechanical energy harvesting system 140, the voltage $V_{OP}$ 132 produced by the optical energy harvesting system 130, and the voltage $V_{RF}$ 134 produced by the RF energy harvesting system 120 to produce the $V_{OUT}$ 105 across the output load 115. In other embodiments, the voltage $V_{ME}$ 133 may be used as the output voltage $V_{OUT}$ 105 without being added to the other voltage outputs. One port of the output load 115 may be connected to ground voltage 120. The voltage from the RF sources 101, the voltage from the optical sources 102, and/or the voltage from the mechanical sources 103 (e.g., piezoelectric and/or Casimir force) may each be harvested independently.

I. Mechanical Energy Harvesting Device

Figure 2A:
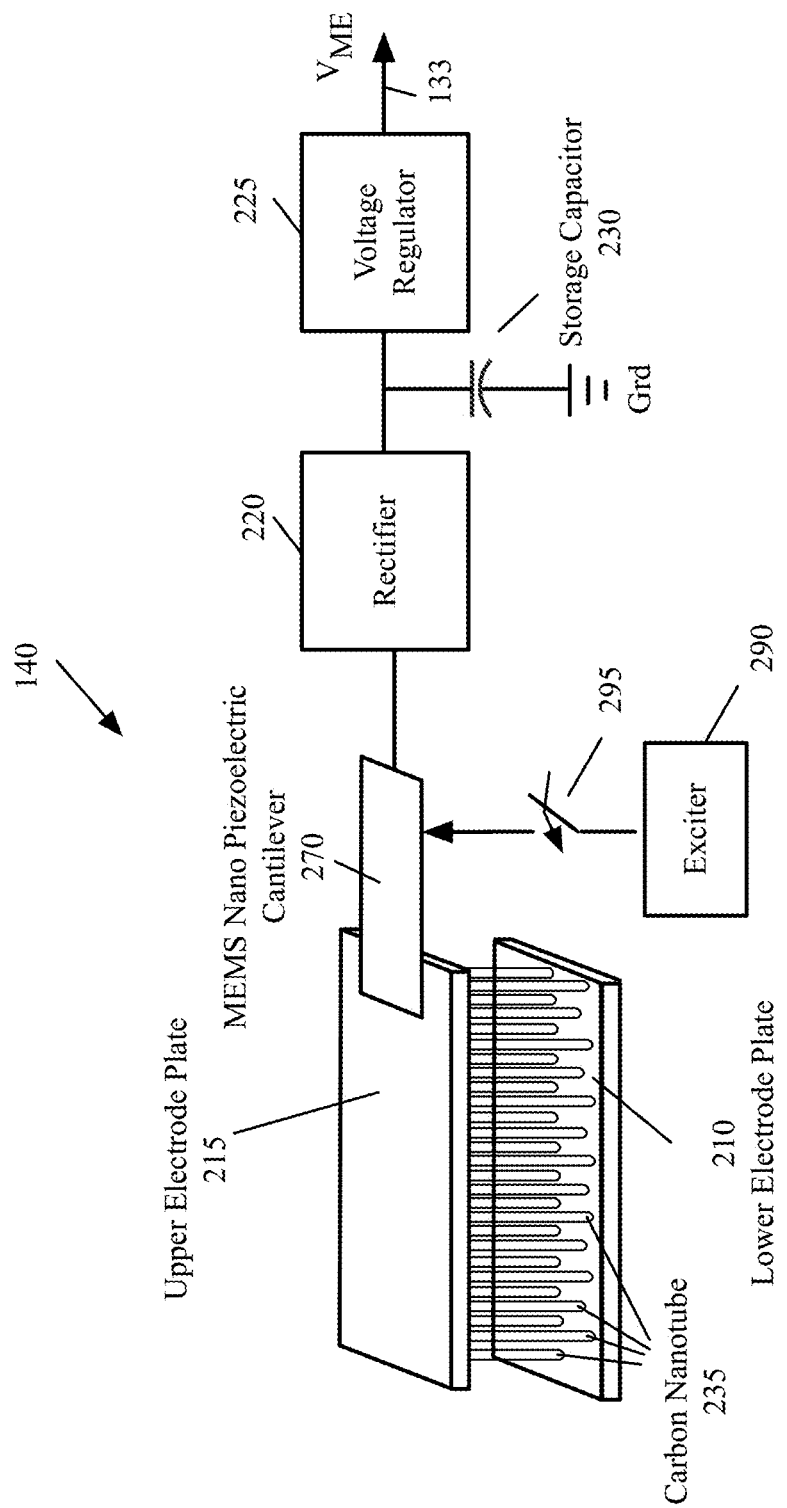

FIG. 2A is a functional diagram illustrating one example embodiment of a mechanical based energy harvesting system 140, according to various aspects of the present disclosure. The mechanical based energy harvesting system 140 combines piezoelectric and Casimir force for generating energy.

The two near-planar interacting surfaces 210 and 215, in some embodiments, may be required to be within distances such as for example, 1 micrometer or less, 100 nanometer or less, etc., to effectively use the Casimir force. The size of the parallel plates may range anywhere from tens of nanometer to few micrometers (e.g., 100 nanometer, 1 micrometer, 20 micrometers, etc.). The two plates may be parallel within a tolerance of a few percent, e.g., 5 percent, 1 percent, 0.5 percent, etc. With judicious choice of underlying parameters as described herein, subsequent oscillation is harvested via a piezoelectric cantilever 270 and converted to electrical current. In the event of damped oscillation due to thermal loss or environmental factors such as temperature variation, the system may receive, as described herein, an excitement or reignition through the RF energy harvesting mechanism, the optical energy harvesting mechanism, or an external RF energy source.

A key issue in the choice of material for the plates is the lack of surface roughness, which is required to possess a small surface roughness amplitude variation compared to the distance between the plates. The characteristics of the material such as the dielectric function, the roughness, the residual electrostatic forces, and the magnetic susceptibility must be considered. The use of liquid metal as an alternative to minimize surface roughness may be considered for applications in reconfigurable plasmonic devices. Although the FIG. 2 and several other examples of the present disclosure are described with referenced to metal (e.g., gold) plates, other material (e.g., liquid metal) with a small-amplitude distortion of the surface compared to the separation of the plates may be used for the plates.

In some embodiments, the Casimir attractive force between two parallel plates (also referred to as electrode plates) 210 and 215 drives the mechanical action on an array of the carbon nanotubes (CNTs) 235, creating axial compression to strain the carbon nanotubes array. In realizing repulsive force to act against the attractive Casimir force to generate mechanical oscillations, different embodiment may use different elastic material such as for example and without any limitations, nanotubes (e.g., carbon nanotubes), liquid, gas, plasma to emulate nano-levitation against the interaction of attractive Casimir force. Although in FIG. 2 and several other examples of the present disclosure, carbon nanotube is used as the elastic material between the two plates (or between spheres and plates as described by reference to FIG. 13 below), other elastic material may be used to counteract the attractive force.

Some embodiments may connect more than one piezoelectric cantilever 270 to the moving plate 215. FIG. 2B is a functional diagram illustrating an alternative example embodiment of a mechanical based energy harvesting system that uses multiple cantilevers, according to various aspects of the present disclosure. With reference to FIG. 2B, the mechanical based energy harvesting system 140 has multiple piezoelectric cantilevers 270. The embodiments of the mechanical based energy harvesting system described in the present disclosure may either use one cantilever 270 (e.g., as shown in FIG. 2A) or several cantilevers 270 (e.g., as shown in FIG. 2B). For simplicity, some of the examples described below may show a mechanical based energy harvesting system with only one cantilever. The same examples are equally applicable to a mechanical based energy harvesting system with multiple cantilevers.

A. Nanotubes for Creating Repulsive Action

Figure 2B:
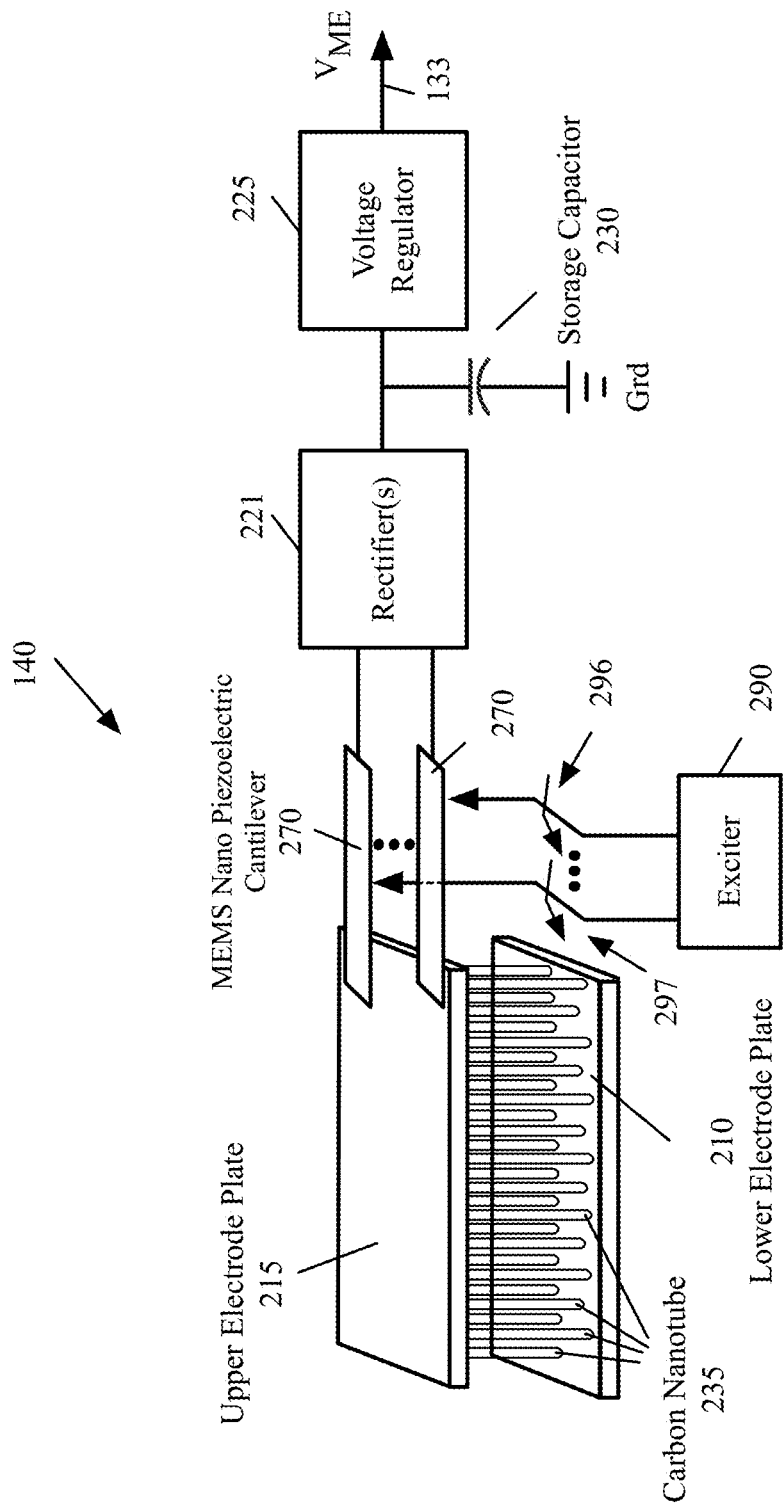

With reference to FIGS. 2A-2B, the nanotubes 235 may be placed between the two electrode plates 210 and 215 to counter the attraction between the two electrode plates 210 and 215. In response to the attractive Casimir force, the carbon nanotubes 235 are strained, while the distance between the two parallel plates decreases until a repulsive force emerges due to the mechanical strain onto the carbon nanotubes. Mechanical energy is released due to the repulsive force and increases the distance between the plates until plates comes to rest again at which time the Casimir force induces again an attractive force and process continues indefinitely, with a reemergent oscillatory behavior, with the upper plate 215 oscillating back-an-forth. In some aspects of the present embodiments, the electrodes 210 and 215 may be made of gold (Au) or silver (Ag). The lower electrode's plate 210 may be stationary and the upper electrode's plate 215 may be movable.

The carbon nanotubes 235 are allotropes of carbon with a cylindrical (or helical) structure. Each nanotube is a hollow structure with the walls formed by one-atom-thick sheets of graphene. Individual nanotubes naturally align themselves into ropes held together by the van der Waals intermolecular force. The van der Waals force is a distance dependent interaction between atoms or molecules. Vertically aligned carbon nanotube arrays are a unique microstructure of carbon nanotubes oriented along their longitudinal axis normal to a substrate surface. The carbon nanotubes 235 may act as coils and provide a repulsive force to the metal plates, resulting into a harmonic mechanical oscillator.

As described herein, the density, diameter, and length of the helical carbon nanotubes may be controlled during the manufacturing process to match the design goal. The vibration energy is recovered by means of electrostatic force. Energy may be harvested by connecting the metal plates 210 and 215, as electrodes formed, driving a voltage regulator 225, which outputs the desired supply voltage $V_{ME}$ 133.

A single sheet of carbon atoms arranged in a hexagonal lattice is known as graphene. Graphite is a stack of graphene sheets held together by van der Waals forces. By rolling a graphene sheet into a cylindrical tube with a diameter of several nanometer, a single-walled carbon nanotube (SWCNT) is produced.

Figure 3A:
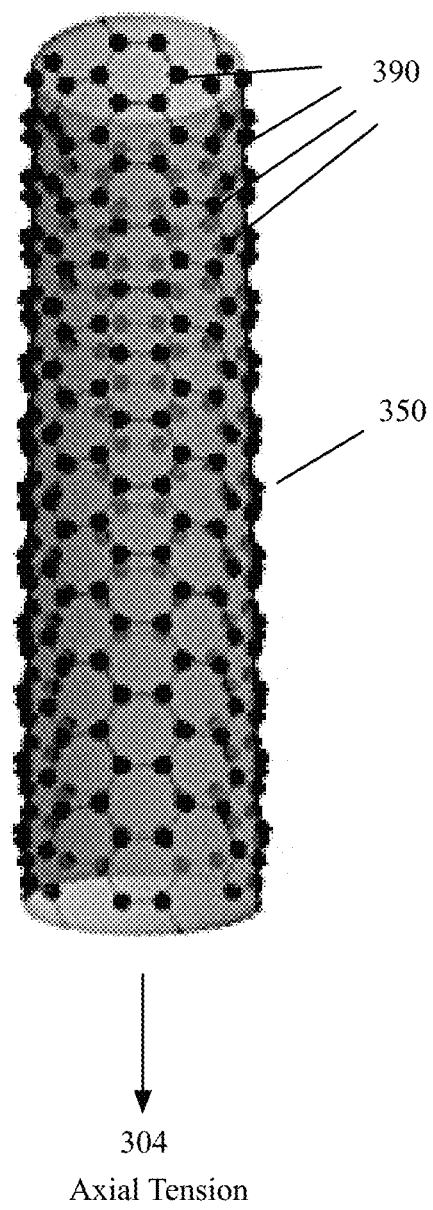
Figure 3B:
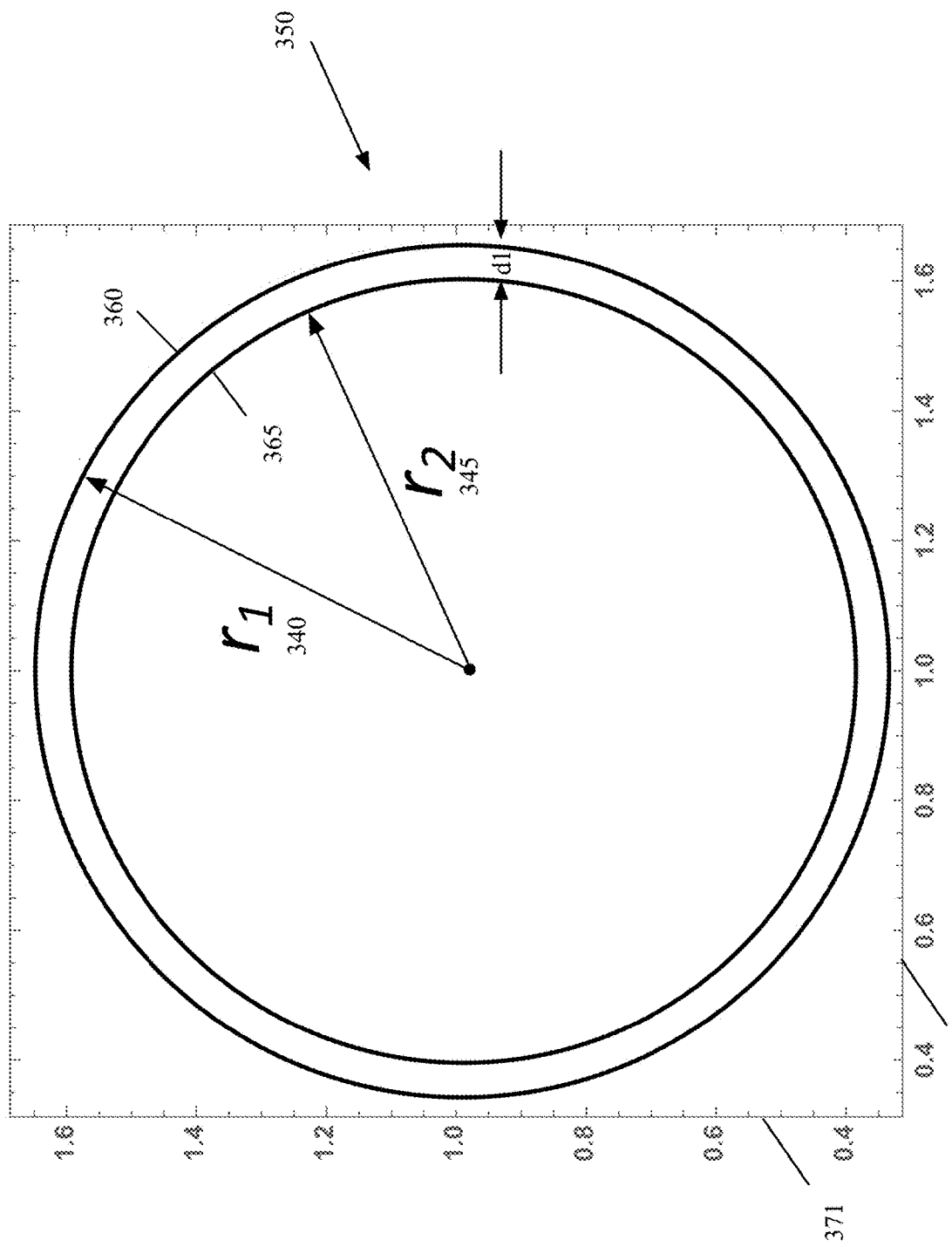

FIG. 3A is a perspective view of a single-walled nanotube, according to various aspects of the present disclosure. With reference to FIG. 3A, a single-walled carbon nanotube 350 is shown. In the example of FIG. 3A, the carbon nanotube 350 would be under axial tension in the direction 304 when the carbon nanotube 350 is placed between the metal plates 210 and 215. FIG. 3B is a cross section of the single-walled nanotube of FIG. 3A, according to various aspects of the present disclosure. With reference to FIG. 3B, the carbon nanotube 350 has a one atom thickness, "d1," an outer surface 360, and an inner surface 365. The carbon nanotube 350 has an outer radius $r_1$ 340 and an inner radius $r_2$ 345. As shown by the scales 371 and 372, $r_1$ and $r_2$ are typically about 0.65 and 0.5 nanometers, respectively.

Key design parameters for construction of the carbon nanotubes rely on two design parameters, namely two chiral indexes (n, m), specifically establishing the distance between each atom in a graphene sheet. A carbon nanotube is essentially a folded graphene sheet as shown in FIG. 3A. Points 390 on the graphene's 350 lattice may be described by vectors of the form "n a+m b", where n, m are integers n≥m and a, b are nonorthogonal unit vectors that may be taken as (1,0) and $$\left(1/2, \sqrt{\frac{3}{2}}\right),$$

respectively. The notation "n a+m b" denotes a vector multiplication with an integer and vector addition of 1×2 dimension vectors n·a and m·b. The chiral indices (n, m) determine the alignment of carbon hexagons around the circumference of the cylinder of the nanotube 350. Three different geometrical classifications or "flavors" of nanotubes may be distinguished. "Armchair" configurations are characterized by indices (n, n), where both indexes are equal, while "zigzag" configurations are described by (n, 0), where the second index is 0. Chiral nanotubes have indices (n, m), with n not equal to m, and m not equal to 0. Chiral nanotubes may occur in two mirror-image forms. A nanotube structure may be designed for different indices (n, m). By way of example, in FIG. 3A, the nanotube with lattice points 390 are chosen as a vector 8 a+3 b with n=8 and m=3.

Carbon nanotubes under a mechanical deformation may be used in energy storage. The total elastic strain energy and average energy density that can be stored in carbon nanotubes may be subject to four modes of mechanical deformation: axial tension, axial compression, pure bending and torsion. Some embodiment may consider some of these mechanical deformations, such as and without limitations, the axial tension and axial compression. One end of each carbon nanotube 235 of FIGS. 2A-2B may be connected to one of the metal plates 210 and 215. The carbon nanotubes 235 may be designed such that, once compressed, the load on the carbon nanotubes does not lead to any bending of the carbon nanotubes structural integrity in axial direction. The metal plates 210 and 215 are designed to tolerate the combined loadings of arrays of carbon nanotubes 235 without any bending or torsion to avoid any buckling. Individual carbon nanotubes 235 may have diameters measured in nanometers and spring properties for energy storage. Carbon nanotubes 235 may be made of SWCNTs or multi-walled carbon nanotubes (MWCNTs) arranged into dense bundles of aligned tubes.

Figure 4B:
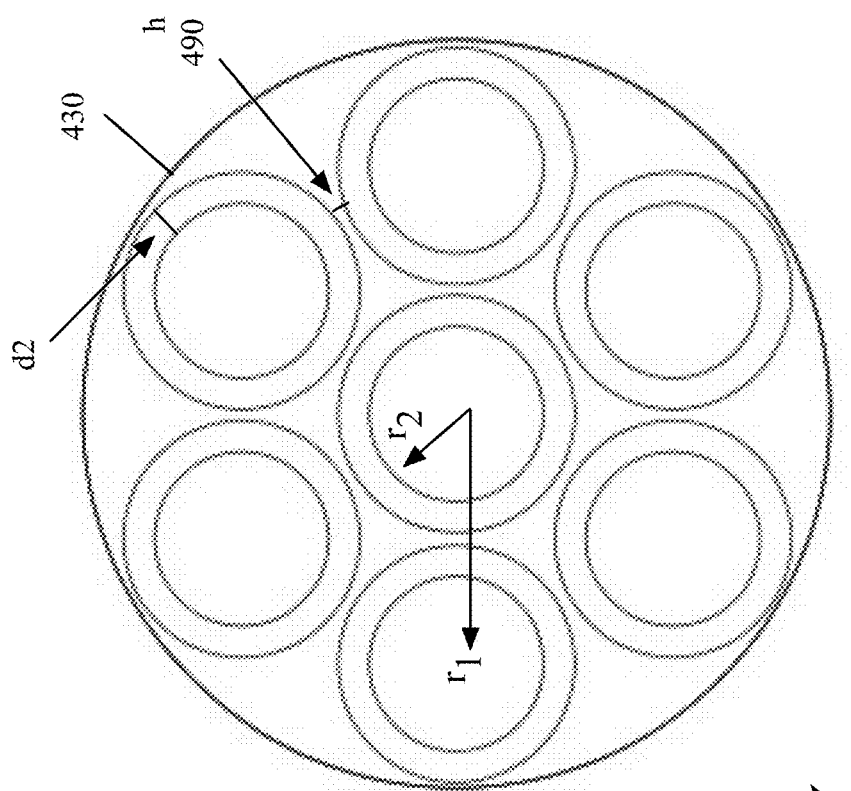
Figure 4A:
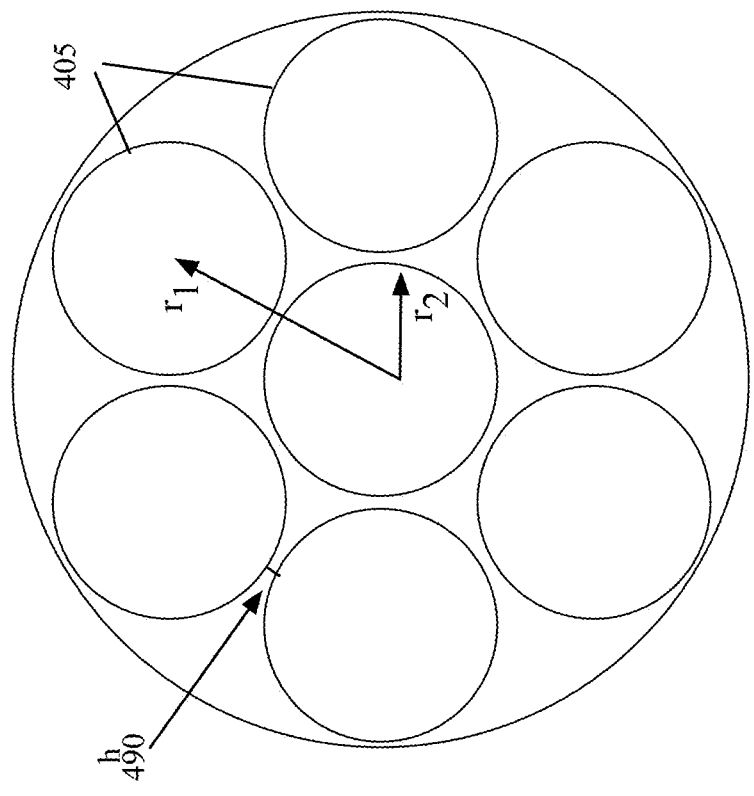

FIG. 4A is a cross section of an array configuration 400A of single-walled carbon nanotubes, according to various aspects of the present disclosure. FIG. 4B is a cross section 400B of an array configuration of multi-walled carbon nanotubes, according to various aspects of the present disclosure. A MWCNT includes multiple rolled layers of concentric tubes of graphene, arranged in concentric cylinders.

With reference to FIG. 4A, in a group of SWCNTs 350, each carbon nanotube layer is treated as a homogenous cylindrical shell's cross section 350. With reference to FIG. 3B, each tube 350 has a thickness of "d1," an outer radius $r_1$ 340, and inner radius $r_2$ 345, that is $r_1-r_2$="d1." Typically, "d" is about 0.3 nm.

With reference to FIG. 4B, each hollow cylinder 430 may have a thickness of "d2", and n represents the number of cylindrical layers in the carbon nanotubes 400B. Typically, "d2" is about 0.3 nm and n is greater than one in MWCNT. The distance between adjacent tubes is h 490. In FIG. 4A, the thickness of each tube is negligible and is not shown for simplicity. With reference to FIG. 4A, with negligible thickness of the SWCNT, $r_1=2*r_2+h$. With reference to FIG. 4B, $r_1=2*r_2+h+2*"d"$, where, by way of example, a two walled MWCNT array is depicted.

When strain is applied by an external tensile force, solid matter is stretched along the direction of the applied force, or contracts due to an external compression force. In the elastic region, the change of length follows Hooke's law and is proportional to the applied stress. Hooke's law, however, holds only approximately for small strains. For higher strains, the relation between normal stress and strain is nonlinear. Young's modulus represents the ratio of stress to strain for a given solid material, when the body is stretched along the direction of the applied force. This quantity depends on the material and is temperature dependent. Given the inner and outer radii of a carbon nanotube, it is possible to compute an effective Young's modulus of denoted by E, for evaluating the stiffness of a carbon nanotube.

Young's modulus is a measure of the ability of a material to withstand changes in length when under lengthwise tension or compression.

Figure 5A:
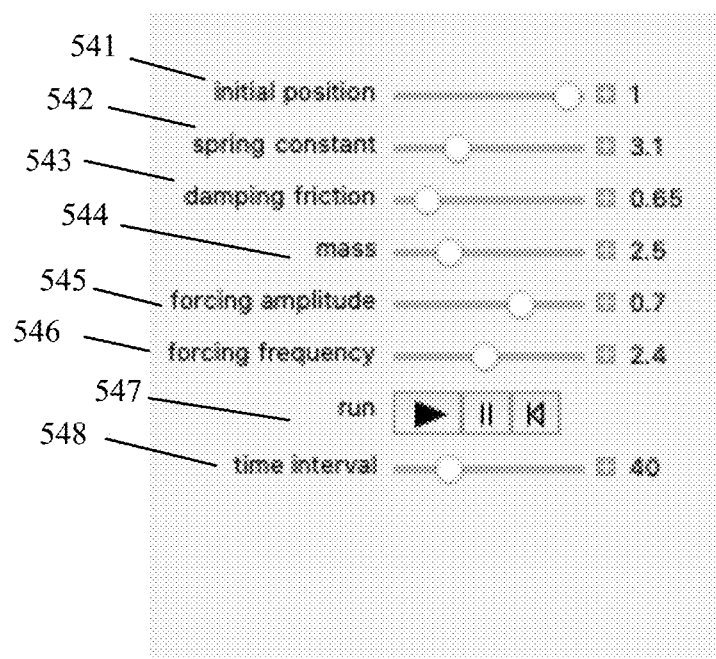
Figure 5B:
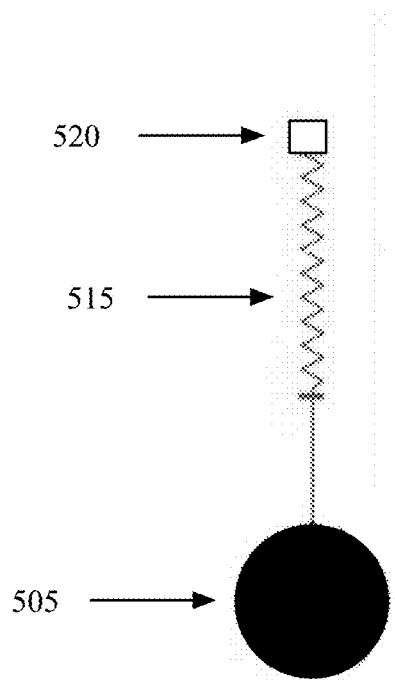

FIGS. 5A-5D demonstrate the simulation of dynamics of a SWCNT under strain, according to various aspects of the present embodiments. By way of example, parameters for a simulation of displacement of the SWCNT is provided in FIG. 5A. The displacement in z-direction is shown in FIG. 5B. The parameters may be adjusted using a series of sliders 541-548 that adjust each parameter, namely, the initial position 541, the spring constant 542, the damping friction 543, the mass 505 attached to the carbon nanotube, the forcing amplitude 545, the forcing frequency 546, and the time duration of the simulation 548. The controls 547 may be used to run, pause, or replay the simulation.

With reference to FIG. 5B, the spring property of the SWCNT is shown as 515, the force is exerted at 520 to the spring model of SWCNT, and the spherical mass is shown as 505. The mass of a fully loaded carbon nanotube array, in some embodiments, is a flat metal plate 215 of FIGS. 2A-2B instead of the sphere 505, which shall also provide sufficiently large area to support the array of carbon nanotube loads under full tension, during compression and deflection, without structural failure.

Figure 5C:
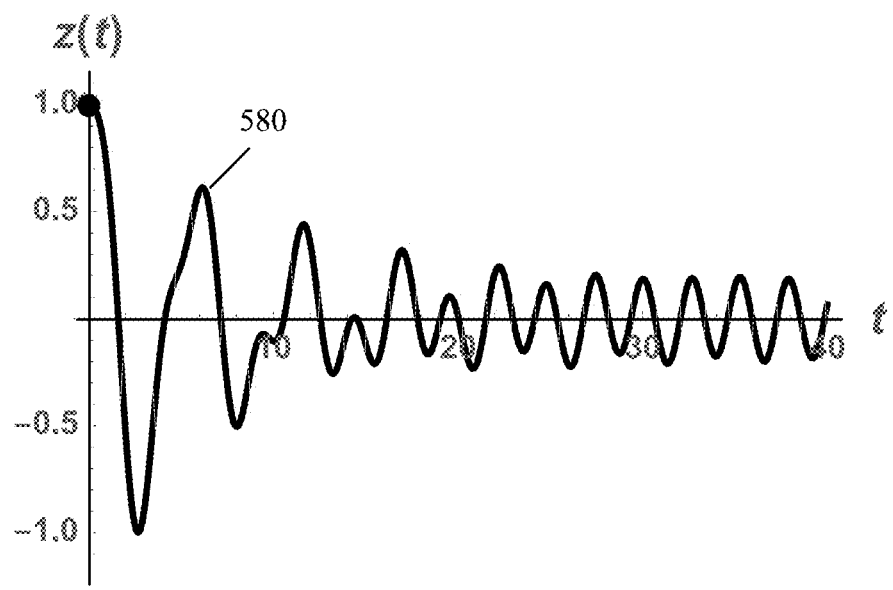

FIG. 5C illustrates the dynamics of the spring action computed from simulation parameters in FIG. 5A. The waveform behaves as a damped sinusoid 580, representing the position of the mass as a function of time, with the displacement denoted as z(t) in the plot of FIG. 5C.

Figure 5D:
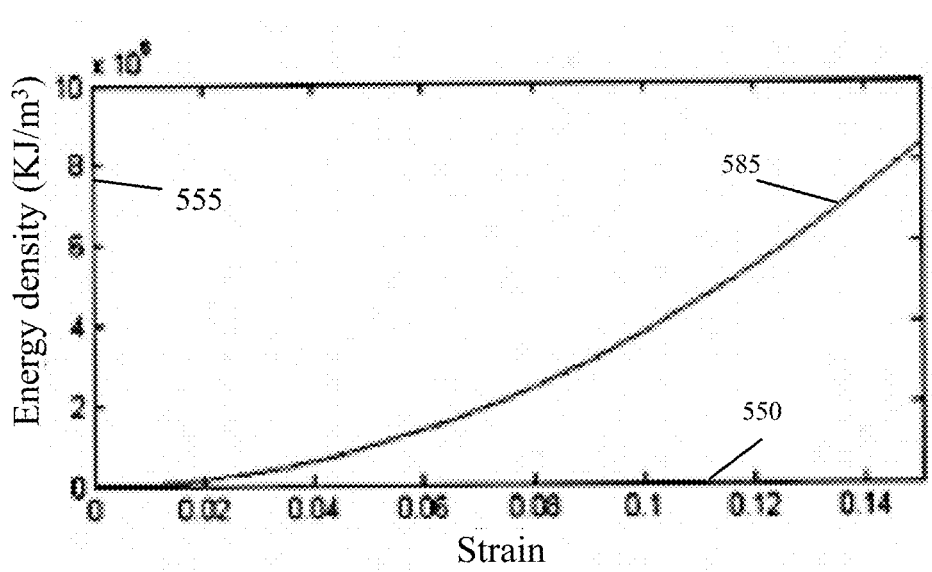

FIG. 5D characterizes the relationship between stress (force per unit volume) kj/m$^3$) and strain in a material experiencing axial deformation to predict the compression and deflection that may occur when a load is applied or shortens under compression. Equation (1) is the energy density of the carbon nanotube acting as a spring in axial tension:

$$E = E\varepsilon^2 k \frac{A}{2A_T} \qquad \text{Eq. (1)}$$

Where ε is the elastic strain, $A_T=\pi r_1^2$ is the total area occupied by carbon nanotube (e.g., the total area of the circle 360 of FIG. 3B) and $A=\pi(r_1^2-r_2^2)$ is total inner enclosed area (the area between the circle 360 and the circle 365) shown in the cross-sectional area of the cylindrical tube 450 of FIG. 3B. Given the total inner area A, k is the fraction of the area in the bundle cross section occupied $$k\frac{A}{2A_T}.$$

With densely packed shell, it is desired to maximize $A/A_T$. For the hexagonal configuration of 400A (FIG. 4A), k is given by Equation (2):

$$k = \frac{\pi\left(r+\frac{nh}{2}\right)^2}{\frac{\sqrt{3}}{2}(2r+nh)^2} = 91\% \qquad \text{Eq. (2)}$$

that is the bundle includes $$k\frac{A}{2A_T}$$

solid CNT shells by volume. Young's modulus of is in units of kilopascals, mega-pascals (Newton/millimeter^2) and giga-pascals (kilonewton/mm^2) and tera-pascals (TeraPa, Meganewton/mm^2).

The position 580 of the mass (i.e., the position of the plate) in the axial direction is shown in FIG. 5C. In FIG. 5D, the energy density 585 is computed from the Young's modulus and plotted in 585, with the energy density axis in kJ/m^3 units in 555, as a function of the applied strain 550.

Vibrating flat surface of the upper plate 215 of FIGS. 2A-2B against the stationary flat surface of the lower plate 210, may be excited into motion via a nano piezoelectric MEMS cantilever (or array of cantilevers) 270 which complements the Casimir force as an additive attractive force to assure sufficient downward attractive force is made to initiate oscillatory behavior between the position of the upper plate and stationary lower plate. A cantilever is a rigid beam or plate that is anchored at one end to a support surface (such as the upper plate 215) from which the cantilever protrudes. Further details of a cantilever is described below with reference to FIGS. 7A-7B.

The general model of a vibration energy harvester is similar to a typical mass-spring-damper system. The maximum power is achieved when the excitation frequency is equal to the natural frequency of the system. The extractable power is also proportional to the acceleration which may limit the energy available for conversion with low acceleration vibrations. The power is linearly proportional to the mass if the maximum power is achieved when the electrical damping matches the mechanical damping.

With reference to FIGS. 2A-2B, in between the conducting metal plates 215 and 210, an array of uniformly equally spaced carbon nanotubes 235 may be attached, manufactured in vacuum sealed packaging. The purpose of the nanotubes 235 is to produce a repulsive force against the overall attractive force and resulting pressure exerted from the upper plate.

The density, the diameter, and the length of the helical carbon nanotubes 235 may be controlled during the manufacturing process to match a design goal. Attaching vertically aligned helical carbon nanotubes to the metal plates 210 and 215 may be realized by synthesizing vertically aligned carbon nanotubes on metal plates by chemical vapor deposition of and amine such as, for example and without any limitations, ethylenediamine as a precursor. The amine serves as both etching reagent for the formation of metal nanoparticles and carbon source for the growth of aligned carbon nanotubes. The density and diameter of carbon nanotubes may be determined by the thickness of the deposited metal film. The length of the carbon nanotubes may be controlled by varying the reaction time.

The carbon nanotubes may be multiwalled with a bamboo-like graphic structure with hollow compartments. The hollow compartments of the tubes are kept separate during the process. Within 10-40 nm range, the action between the tubes keeps them growing in a well sintered to particles of suitable sizes and aligned manner.

B. Piezoelectric Cantilevers

The Piezoelectric MEMS is a proven technology for harvesting small magnitudes of energy from mechanical vibrations in nano-and-micro meter scale. Piezoelectricity is a byproduct of the lack of center of inversion symmetry in a crystal lattice. The general principle for conversion of low frequency mechanical stress into electrical energy with piezoelectric transducer is obtained through the direct piezoelectric effect. A key advantage of MEMS is the seamless fabrication process with integrated circuits. MEMS components may be fabricated using micromachining processes. During this processes, parts of silicon wafer are selectively etched away to form the mechanical and electromechanical devices. This enables fabricating single microchip with MEMS integrated in the same physical packaging with the electronic circuits.

With reference to FIGS. 2A-2B, the piezoelectric cantilever beam 270 may require the resonance frequency of the oscillation to be wide enough to accommodate the uncertain variance of underlying mechanical vibration. In the energy harvesting device 140, the vibration energy is recovered by means of electrostatic force. Energy is harvested from oscillation of the metal plate 215, and the two metal plates 210 and 215, acting as positive and negative electrodes, driving, for example and without any limitations, a rectifier 220 and a voltage regulator 225, which may output the supply voltage $V_{ME}$ 133 at a constant level. The output voltage $V_{ME}$ 133 of the mechanical based energy harvesting system 140 may be supplied to the voltage adder 110 of the energy harvesting device 100 of FIG. 1. The two near-planar interacting surfaces 210 and 215 may be required to be within distances of less than 100 nanometer to effectively use the Casimir force.

Piezoelectric material has a crystalline structure (e.g., and without any limitations, zinc oxide or Wurtzite structure) that transforms mechanical strain to electrical charge or converts an applied electrical potential to a mechanical strain. With recent advances in microelectromechanical system, fabrication and use of nano piezoelectric components has been widely applied. Some of the present embodiments use piezoelectric cantilever(s), which operate(s) to convert the oscillation of the parallel plates 210 and 215 into an electrical energy in operating mode. In excitement mode (e.g., the initial startup or reignition), the cantilever may be used to prime the oscillation, by forcing the upper plate to exert strain on carbon nanotubes.

Some of the present embodiments may use a nano piezoelectric substance as a cantilever for compression of parallel plates with sufficient conductivity to harvest energy from oscillation of a parallel plate. Nano piezoelectric structure interacting with flat conductive plane, as electrode, drives the vibration to exert strain in the appropriate direction. Piezoelectric materials designed for power harvesting with anisotropic behavior depend upon the direction of the strain and the direction of the polarization and with respect to the position of the electrode. It is also possible to structure a bimorph piezoelectric energy harvester based on a cantilever beam. In which case, two piezoelectric layers are fixed to a non-piezoelectric elastic layer in this case The model for the steady-state response of a piezoelectric generator connected to an AC-DC rectifier, followed by a filtering capacitance and a resistor, is herein described. The normalized voltage expressed as a function of electrical resistance, denoted as r, is as shown in Equation (3).

$$V_o = \frac{0.04r}{\left(r+\frac{\pi}{2}\right)\sqrt{\frac{0.0016r^2}{\left(r+\frac{\pi}{2}\right)^4} + \left(\frac{0.08r}{\left(r+\frac{\pi}{2}\right)^2} + 0.06\right)^2}} \quad \text{Eq. (3)}$$

The normalized power is expressed as a function of electrical resistance are as shown in Equation (4).

$$P_o = \frac{11.11r}{\left(r+\frac{\pi}{2}\right)^2} \quad \text{Eq. (4)}$$

Figure 6A:
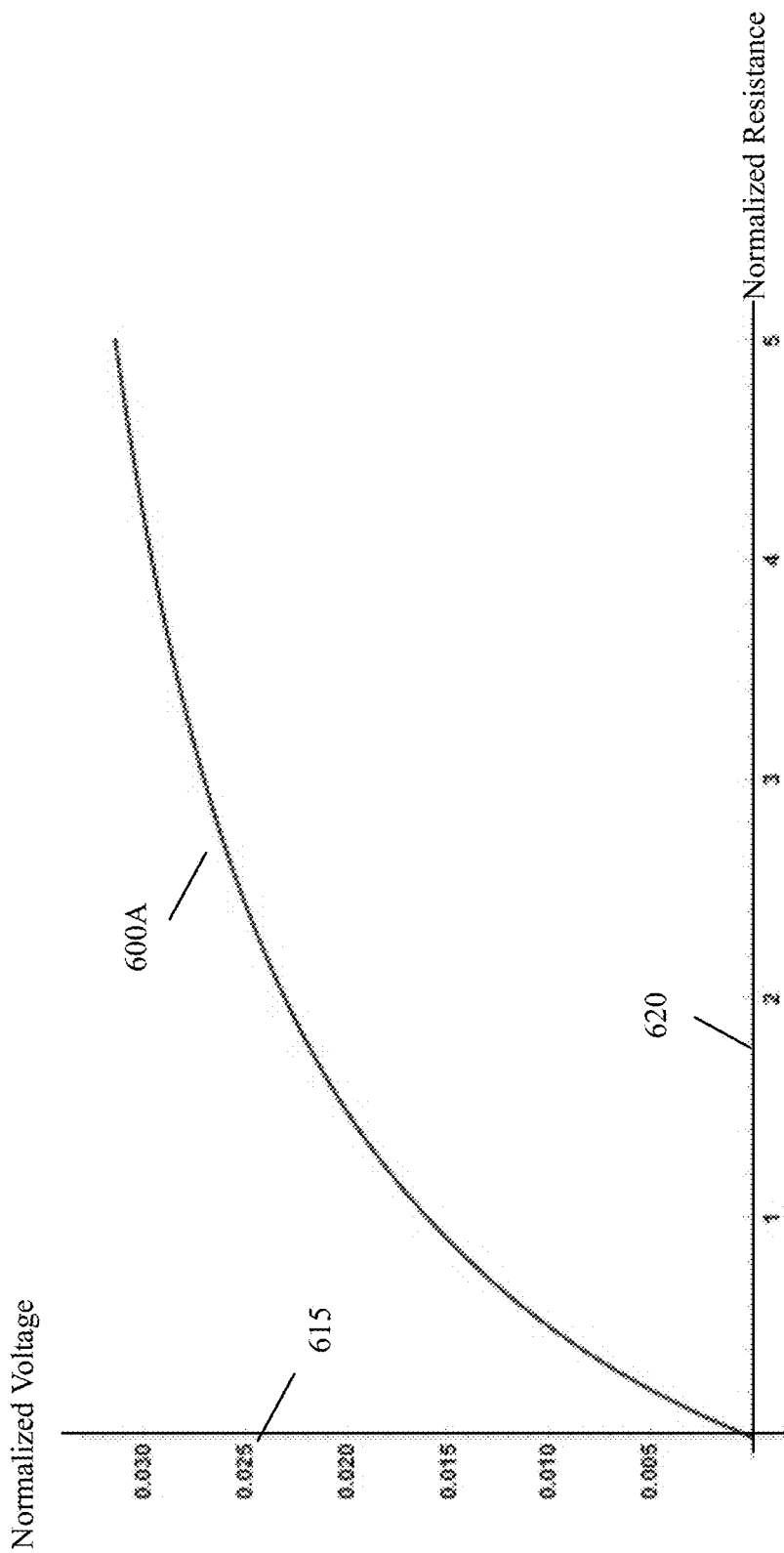

FIG. 6A is the plot of the normalized voltage for a nano piezoelectric cantilever for energy harvesting, according to various aspects of the present disclosure. With reference to FIG. 6A, the plot 600A depicts the normalized voltage 615 as a function of normalized resistance 630 using Equation (3).

Figure 6B:
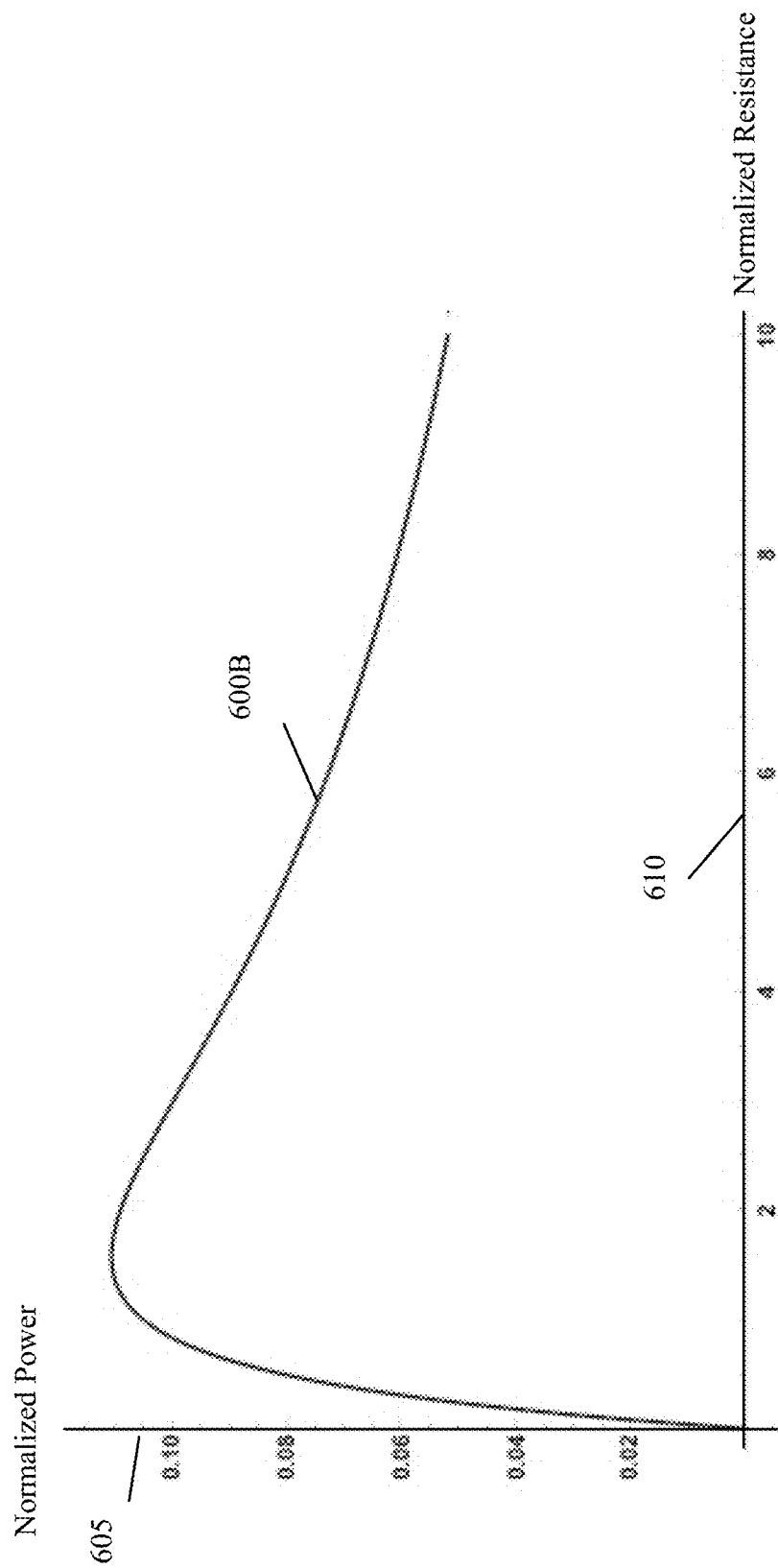

FIG. 6B is the plot of the normalized power for a nano piezoelectric cantilever for energy harvesting, according to various aspects of the present disclosure. With reference to FIG. 6B, the plot 600B depicts the normalized power 605 as a function of normalized resistance 610 using Equation (4).

FIGS. 7A-7B are the perspectives of two Piezoelectric cantilever structures for energy harvesting, according to various aspects of the present disclosure. The basic structures of the piezoelectric energy harvester may have bimorph or unimorph cantilever beam structures. A bimorph structure is composed of two independently polarized piezoelectric layers, and a unimorph structure is composed of a single piezoelectric layer and an elastic substrate layer attached to a mass at the end of the cantilever. In FIG. 7A, in bimorph structure 750 with two independently polarized piezoelectric layers 704, 705, the layers 701, 702, and 703 are metal layers with the layers 702 and 703 acting as ground planes, metal electrodes, and the layer 701 acting as the voltage supply's source electrode (i.e., the voltage that is provided by the energy harvesting device and can be used as a voltage source by another device). The layers 704 and 705 are piezoelectric layers and the mass 711 may be the flat metal plate or a sphere.

In FIG. 7B, the unimorph structure 760 has a single piezoelectric layer and the metal layer 707 acts as the ground plane electrode and the layer 709 acts as the voltage supply's source electrode. The layer 708 is the piezoelectric layer stacked over a metallic layer 707 with an elastic layer 706 at bottom of stack attached to the mass 710 which may be the flat metal plate or a sphere. In small scale processes in microfabrication, the unimorph configuration may be preferable as opposed to the bimorph structure, which requires depositing multiple layers of piezoelectric material.

Typical thickness of the piezoelectric layers 704, 705, and 708 may be less than 0.5 micrometer. The form factors of a piezoelectric MEMS energy harvesters may be different and is characterized by the power density, defined as the ratio of the generated power over the material volume, expressed in volume power density in units of microwatts/mm³. The design goal shall be maximizing the power density for a given volume and available area to implement the cantilever. The resonating beam structure, in some embodiments, is designed to maximize the harvested energy for a target frequency range and an acceleration rate set for design considerations, since the extractable power is also proportional to the acceleration and the mass in 710 and 711 in bimorph or unimorph structures.

Figure 8:
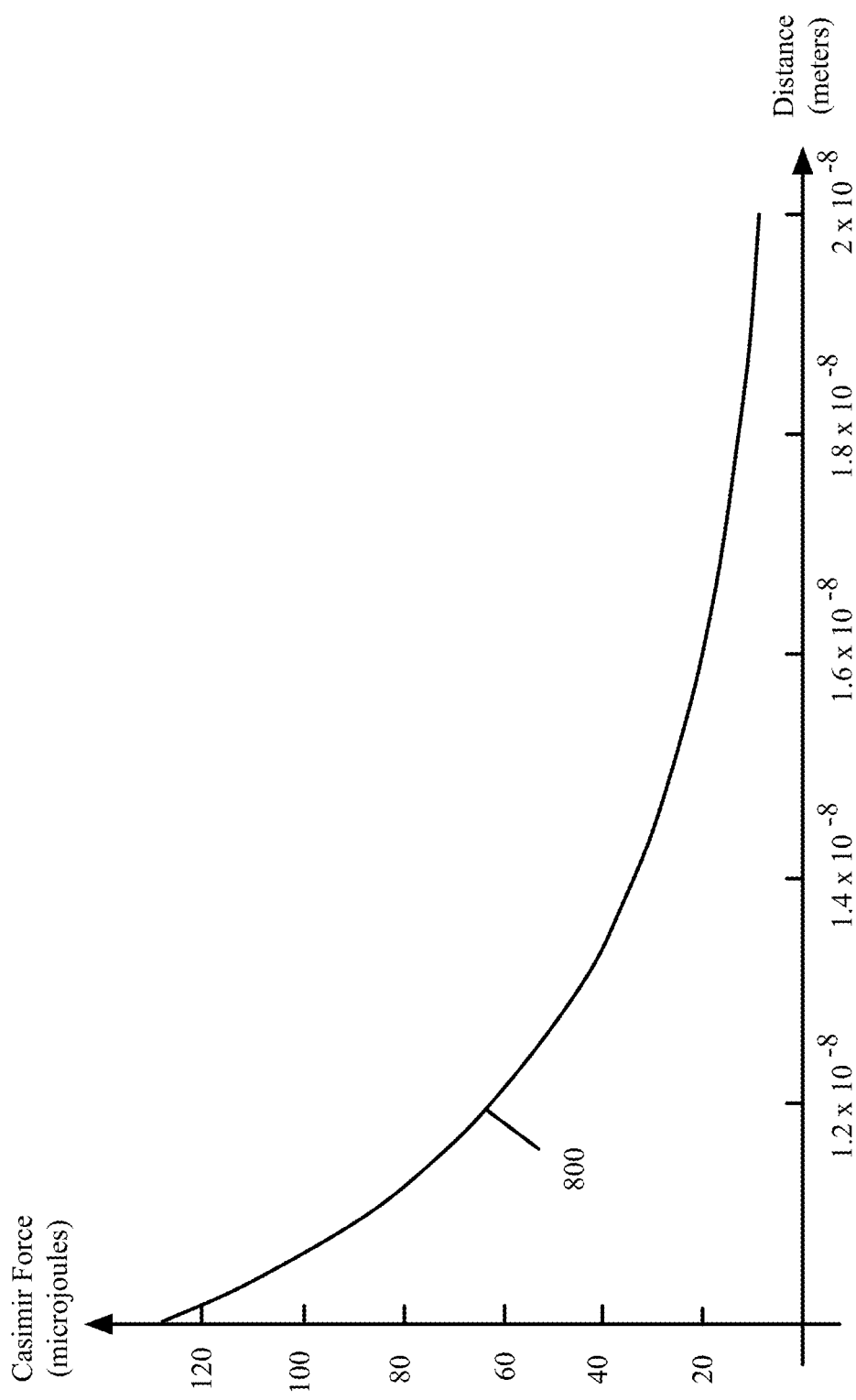

FIG. 8 illustrates a curve 800, where the Casimir force is characterized as a function of distance between two plates, according to various aspects of the present disclosure. The Casimir force may be expressed as shown in Equation (5):

$$F_c \approx \frac{1.3 * 10^{-30}}{d^4} \qquad \text{Eq. (5)}$$

where $F_c$ is the Casimir force in microjoules and d denotes the distance in meters between two metal plates with infinite boundaries. As shown in FIG. 8, the Casimir forces drops as the distance between the plates increases.

With reference to FIGS. 2A-2B, in normal mode of operation, the metal plate 215 is attracted by Casimir force to the metal plate 210. The strain on the carbon nanotubes 235 connected between two parallel plates 210 and 215 translates into potential energy. The potential energy stored in the carbon nanotubes after sufficient separation of the two metal plates 210 and 205. A repulsive force is exerted to the upper plate 215 with spring action by the carbon nanotubes 235, releasing the potential energy by decompressing the carbon nanotube array 235 to a new position. With periodic behavior of this process, a mechanical harmonic oscillator is realized.

The motion from the mass-spring action of the metal plate is harvested by the nano piezoelectric cantilever(s) 270 attached to upper plate 215. The piezoelectric cantilever(s) 270 convert(s) the mechanical energy into electrical energy, which in turn is rectified by the rectifier 220 and stored in a storage capacitor 230. The voltage level across the storage capacitor 230 is regulated by the voltage regulator 225, producing the output voltage $V_{ME}$ 133. Optimizing the power density and efficiency of the system 140 requires maximizing the elastic potential energy in carbon nanotubes in 235 while concurrently minimizing the mechanical loss due to mismatch in mechanical impedance of carbon nanotube array 235 and electromechanical loss of the cantilever(s) 270 converting the mechanical action to electrical current. This conversion is primarily dependent on the magnitude of the electromechanical coupling factor of the piezoelectric material. The electromechanical coupling factor represents the ratio of input mechanical energy to the output electrical energy. This factor varies widely in both natural and synthetic material that exhibit piezoelectric property. The material used in nonpiezoelectric cantilever 270 shall be chosen judiciously for maximizing the magnitude for coupling factor, with consideration of cost and manufacturability.

In FIGS. 2A-2B, the total energy is preserved in the carbon nanotubes 235 acting as coils, with a spring constant chosen for interaction with the Casimir force between the two plates 210 and 215. The energy harvesting system in FIGS. 2A-2B may be primed at power up by initially pre-charging the surface of the cantilever(s) 270, such that the vibration of upper plate 215 is initiated at a desired displacement in axial direction of carbon nanotube arrays 235. This is shown as the exciter 290.

In the excitation mode, also referred herein as the ignition mode, the exciter 290 drives an electrical current into the nano piezoelectric cantilever 270, which in some embodiments may be an array of cantilevers, converts the electrical energy into mechanical energy, exerting a compressive force onto the carbon nanotubes arrays 235. The exciter 290 may be any of the possible harvested energy subsystems shown in FIG. 1, such as the optical energy harvesting system 130 from the optical source 102, or the RF energy harvesting system 120, driven by the RF source 101. The switch 295 of FIG. 2A or the switches 296-297 of FIG. 2B remain(s) open during the normal mode of operation. The switch(es) is/are closed whenever excitation is desired to re-excite the device 140. This can be to assure optimal harvested power level from the mechanical vibration of the moving plate 215. During the design phase of the device, the required periodicity for excitation of the device is determined. The limits may be set by considering the maximum and minimum needed output power from the device and the resulting time duration taken to discharge from the maximum to minimum power level. When this duration is met, the excitation is initiated by closing the switch 295 of FIG. 2A or switches 296-297 of FIG. 2B. In some embodiments, the switches may be coupled to a voltage dividing circuit with reference voltages as to minimum and maximum required voltage of the energy harvesting device, such that when the output voltage of the device drops below the minimum value, the switch 295 (e.g., a diode with forward bias mode) is thrown or shorted (to enable excitation circuit from RF or solar energy to charge the super-capacitor). Once the maximum voltage is reached, driving a comparator's reference voltages as input with the output controlling the state of the switch 295, which is opened (e.g., the diode in reverse bias mode) to terminate the excitation period.

C. Fractal Metal Plates

Figure 9:
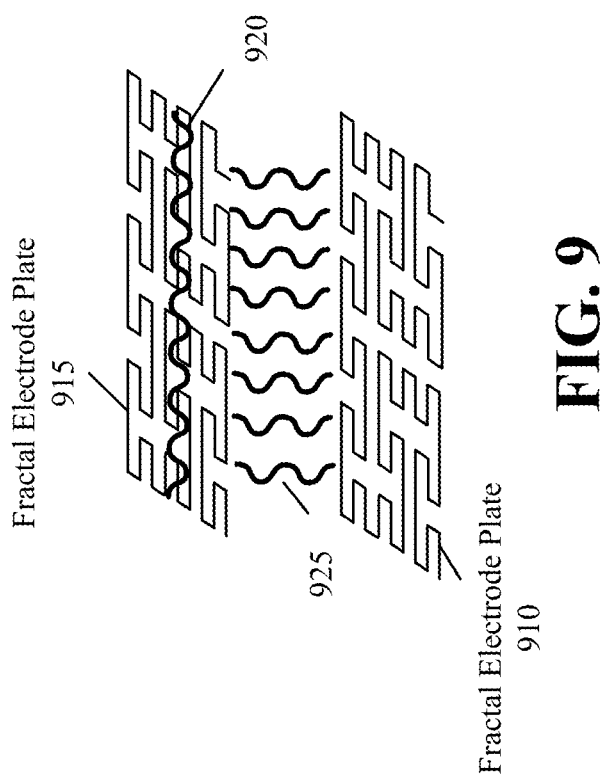

FIG. 9 is a functional diagram illustrating one example implementation of the electrodes of a mechanical based energy harvesting system using fractal geometry, according to various aspects of the present disclosure. With reference to FIG. 9, some of the present embodiments may employ fractal geometry in the form of space filling curves for the electrode plates 910 and 915, which may be used in place of the metal plates 210 and 215 of FIGS. 2A-2B. A space-filling curve is a curve whose range (i.e., the set of all possible values of the curve) contains an entire n-dimensional hypercube. Some of these embodiments may utilize space filling curves in two dimensions, including but not limited to, Peano Curve or Hilbert Curve, in order to shape the flat metallic surfaces.

The energy harvesting or storage device which employs fractal geometry to embed in the flat metallic surfaces 910 and 915, may maximize the conductive region, while minimizing the mass of the parallel metallic plates 910 and 915. The geometry may be subject to the specific desired power level. The geometry may be subject to constraints of thickness and proximity of each region 910 and 915 to the other.

Figure 10:
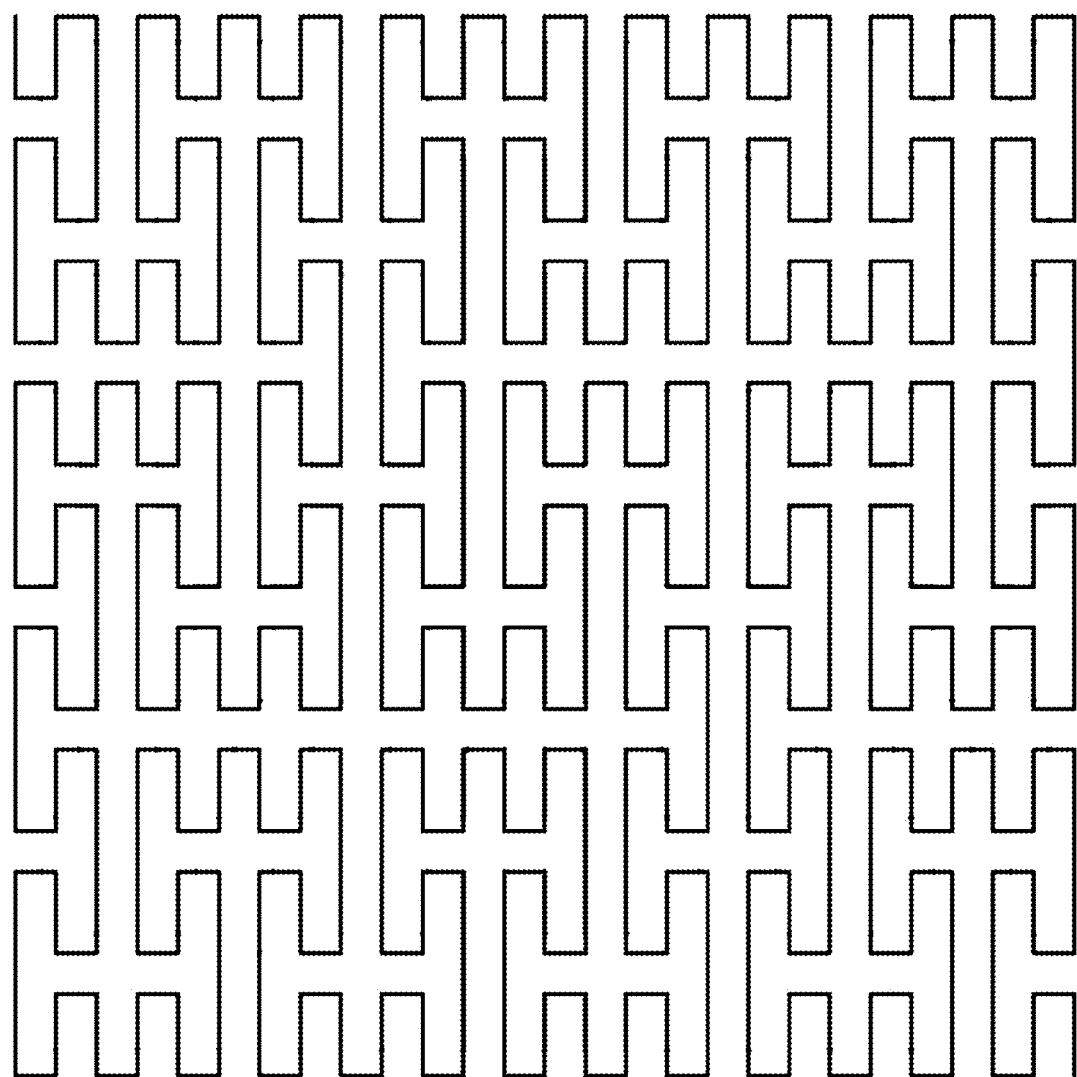

FIG. 10 illustrates one example implementation of the electrodes of a mechanical based energy harvesting system using a Peano 1000, according to various aspects of the present disclosure. The figure shows a Peano curve that may be used for the upper plate 915 as well as the lower plate 910 of FIG. 9. The mass of a plate using the fractal geometry of FIG. 10 is clearly less than the mass of a solid plate of the same dimensions. The particular geometry also maximizes the conductive region.

Figure 11:
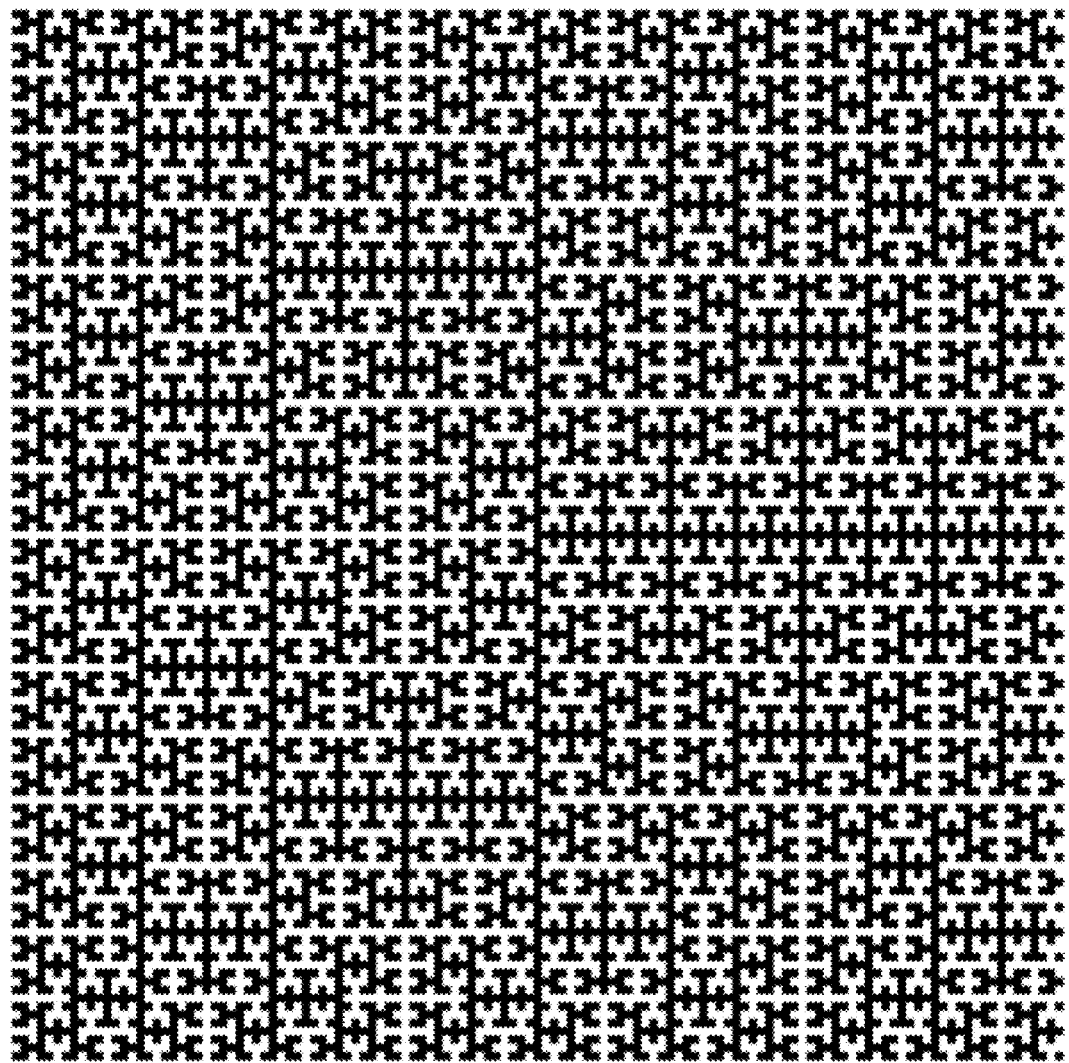

FIG. 11 illustrates one example implementation of an electrode 1100 of a mechanical based energy harvesting system using a Hilbert curve, according to various aspects of the present disclosure. A Hilbert curve is a continuous space-filling curve, which is a compact set homeomorphic to the closed unit interval. The same fractal pattern may be used for both the upper plate 915 and the lower plate 910 of FIG. 9. The mass of a plate using the fractal geometry of FIG. 11 is clearly less than the mass of a solid plate of the same dimensions. The particular geometry also maximizes the conductive region.

The fractal geometries such as Peano curve and Hilbert curve may provide sufficient conductive surface for impinging signals to harvest electromagnetic field constructively in both lateral and vertical directions (illustrated as magnetic flux 920 and the Casimir force 925 in FIG. 9), in relation to the flat surface of the two parallel electrode plates.

Employing space filling curves (such as Peano or Hilbert curves) to form a flat metallic surface exploits both lateral and vertical electrical fields to increase the force exerted per unit area. In an energy harvesting or storage device that employs fractal geometry for the vibrating electrode plate 915 and the stationary plate 910, the conductive region is maximized, while the effect of gravity (i.e., the weight of the plates) is minimized. That is coupled to further desired constraints of thickness and proximity of each region to the neighboring region and boundary of the surface of the plates 910 and 915.

In production phase, the thickness and length of each segment of the curve is pre-determined by design requirement for covering the available surface, with specific boundary specifications, and desired total permeability and conductivity. The fabrication of nanostructured fractals is based on a combination of anisotropic etching and corner lithography, where etching must progress perfectly vertical to the surface and corner lithography is incorporates the ability to inject sharp features in the process. The fractals emerging from repeated edge lithography can multiply and scale down to specific patterns such as the patterns shown in FIGS. 10 and 11. Both wet or dry etching techniques for fabrication of the fractal metal plates in nanoscale are well known. In wet etching, the etch material is removed through chemical reaction between a liquid etchant (Iodine-based for gold) and the metal to be etched. In dry etching, the etch material is removed through a chemical reaction and/or physical interaction between etchant gasses and the exposed material. Alternative can be considered with wet etching using metal assisted chemical etching, or Reactive Ion Etch (RIE), a dry etching technique that uses a low-pressure plasma to remove the etch materials by means of both chemical and physical etch.

The absolute value of the vacuum energy is non-zero due to the presence of vacuum fluctuations in quantum field theory. Zero-point energies arise because the canonical quantization scheme does not fix the ordering of non-commuting operators in the field Hamiltonian. The attractive force arises due to the change in the zero-point energy of the electromagnetic field. When two parallel metal plates are sufficiently close, in orders of a few hundreds of nanometers or less, an attractive force arises from the ground state of quantum electrodynamics. Forcing the field to satisfy certain boundary conditions such as in interaction with matter or other external fields is related to the interaction of a fluctuating electromagnetic field with real materials. Essentially, the electromagnetic modes that have nodes on both plates may exist within the cavity between the two plates. The zero-point energy depends on the separation between the plates, giving rise to an attractive force. This result, in fact, may be interpreted as due to the differential radiation pressure associated with zero-point energy (virtual photons) between the plates "inside" and the "outside" of the plates, which leads to an attraction because the mode density in free space is higher than the density of states between the plates.

A key property of the Casimir effect is its highly non-trivial nature of the vacuum state in quantum field theory. Generally, the Casimir effect is the response of the vacuum of quantized fields caused by the change of the zero-point energy of a quantum field due to the presence of static, geometric boundary conditions. The concept of the Casimir energy, i.e., of physical vacuum energy as the difference of zero-point energies, has a defined counterpart for situations of quantized fields interacting with classical, static background fields, namely dielectric media, external electromagnetic and gravitational fields. The Casimir effect has been measured and proven for all the various phenomena associated with the response of the vacuum in constrained quantum fields.

Expressing analytically the expression for Casimir effect requires expressing vacuum expectation value of the energy operator in the ground state of the quantum field, between two parallel metal plates 910 and 915 in FIG. 09, while considering the effective action due to the influence of the boundary condition and moving plates. The general regularization and renormalization procedures in quantum field theory under the influence of boundary conditions is well understood, where the divergent part of the vacuum state energy is found in an arbitrary quantization domain and different representations for the regularized vacuum energy are obtained and infinities dealt with re-normalization procedure for handling electrodynamics of vacuum with moving boundaries.

The following discussions assume the system is in thermal equilibrium at room temperature and the metal plates are smooth surfaces for the purpose of characterizing the field between the two plates. Among the various numerical methods, the finite difference methods have the flexibility to handle arbitrarily complex material configurations, including anisotropic and continuously varying dielectrics and using boundary element methods. Combination of finite difference and boundary element methods have the further advantage to treat bodies with arbitrarily complex shapes. In order to simulate Casimir force field between two parallel plates, the space between the two plates is divided into uniformly equally-spaced square cells, referred herein as grid cells. The square quantized grid structure in three-dimensional Euclidean space forms the underlying ambient geometry for computation of the Casmir force between the two plates where one of the plates is free to move continuously in the z-direction (i.e., towards or away from the other plate). The Casimir forces on each plate are computed using the Casimir-Polder interaction energy between two polarizable atoms i and j, which is approximated by Equation (6):

$$U(r) \equiv -\frac{23hc\alpha^i\alpha^j}{8\pi^2 r^7} = p\alpha^i\alpha^j \qquad \text{Eq. (6)}$$

Where r denotes the distance between two atoms, h is the plank constant, c is the speed of light, and a is the electrostatic polarizability of the metal. For the purpose of estimating the field strength, a grid cell is a square area that contains a fixed number of atoms. The homogenous metal plate is quantized into a square grid, indexed by i, j. U represents the energy of an atom within a grid cell as a function of electrostatic polarizability a of the metal. Let $N_i$ represent the number of atoms in the grid cell, the total energy for a given grid cell accounting for the interaction from all other grid cells to the i-th cell may be represented by Equation (7):

$$U_i = p\alpha^i N_i \left( \sum_j \frac{\alpha^l N_l}{|r_i - r_j|} + \sum_j \frac{\alpha^{l+1} N_{l+1}}{|r_i - r_j|} + \ldots \right) \qquad \text{Eq. (7)}$$

Figure 12A:
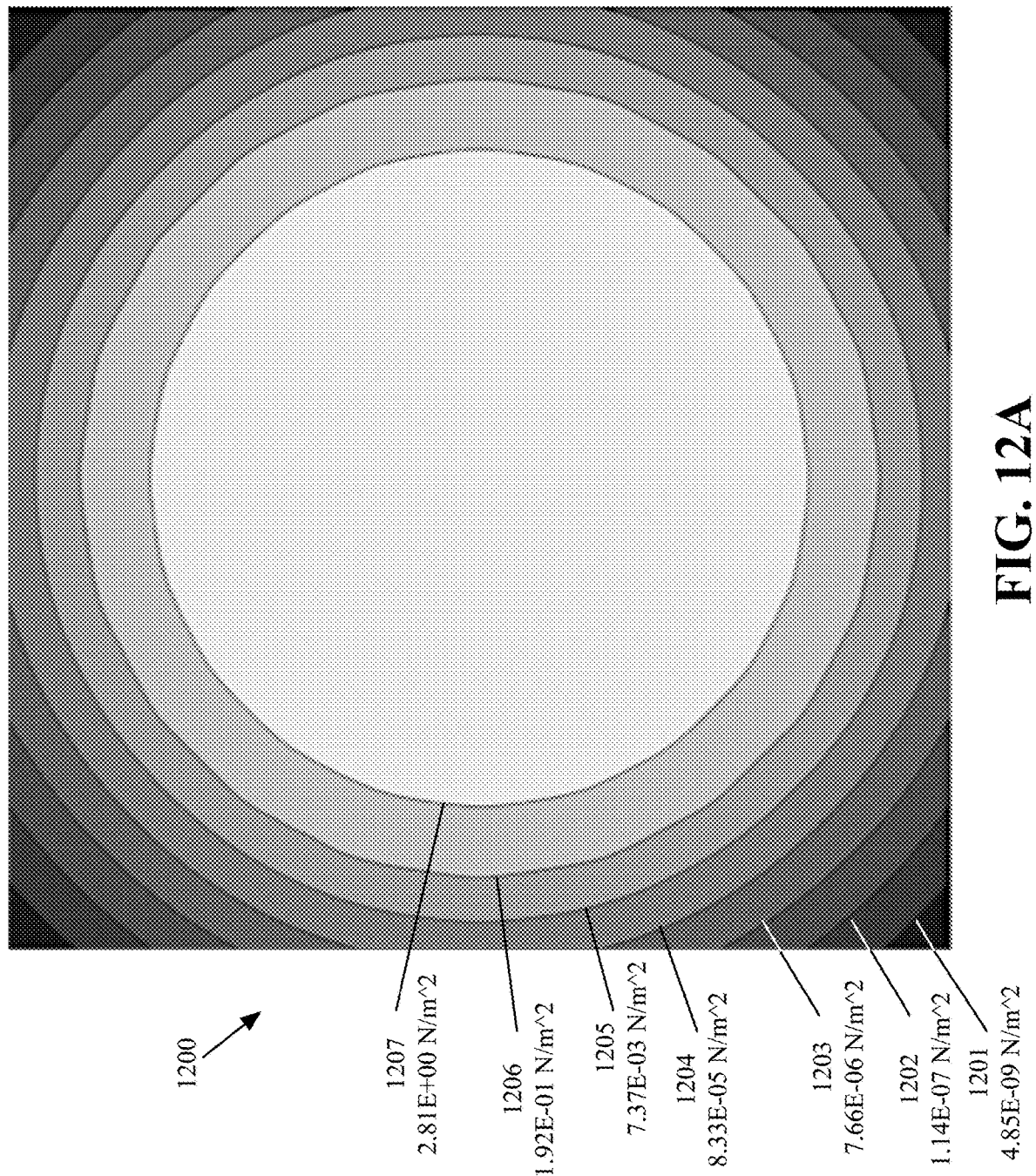

FIG. 12A is a contour map with the Casimir potential computed from the equation 7 for two metal plates with homogenous smooth surfaces, according to various aspects of the present disclosure. FIG. 12B is a table 1220 showing the parameters used to compute the field distribution of FIG. 12A. The contour map 1200 illustrates the intensity of the field for the simulation parameters of FIG. 12B, where the plate dimensions considered by way of example are 5×5×5 micrometer^3, the number of grid points (Ni) is 500×500× 500 for a given polarizability of silver with 1.88×10^−30 m^3/atom with a density of 5.8×10^28 atoms/m^3. The absolute value of the field potential in units of Newton per meter square is depicted by the contour map 1200, with values taken in each contour region 1201-1207 are shown in the figure. This results clearly demonstrates the concentration of the force towards the center of the plate, smoothly falling off towards the boundary.

D. Using Spherical Metal Cavities Instead of Metal Plates

Figure 13A:
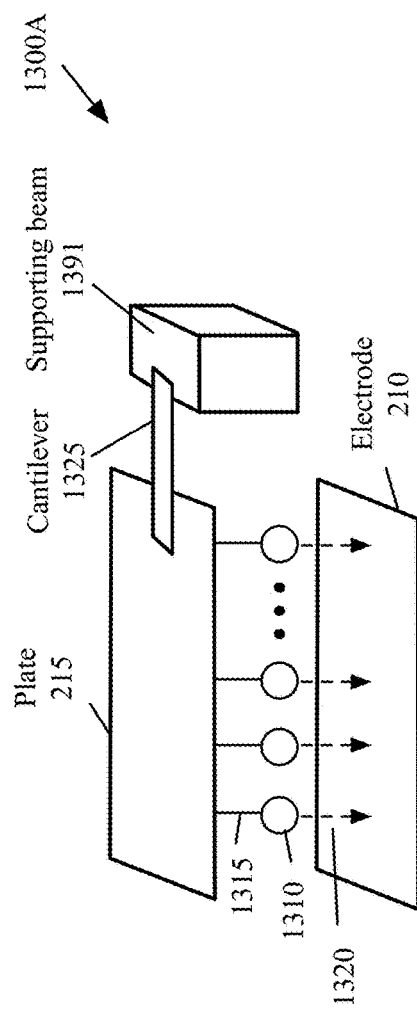

In some of the present embodiments, the mechanical energy harvesting may employ an array of spherical metal cavities suspended in stationary state in parallel to the flat metallic surface of the electrodes. FIG. 13A is a functional diagram illustrating one example of an energy harvesting device 1300A that employs an array of spherical metal cavities 1310 instead of a flat metal plate, according to various aspects of the present disclosure.

In some of the present embodiments, each sphere may have a radius between 100 micrometers to a few hundred nanometers (e.g., 100 micrometers, 50 micrometers, 1 micrometer, 500 nanometers, 100 nanometers, etc.). With reference to FIG. 13A, the energy harvesting device 1300A may include an array of spherical metal cavities 1310, connected to the carbon nanotubes 1315 and suspended in stationary state in parallel to the flat metallic surface of the electrodes 210 and 215, in the form of a uniformly spaced grid in two dimensions. The role of the plate 215 in the embodiments of FIG. 13A is to act as a supporting structure for suspending the spheres 1310 to a group of carbon nanotubes. The supporting beam 1391 may be used to support the cantilever 1325. The supporting beam 1391, in some embodiments, may be attached to the packaging or an interior protrusion of the packaging.

In the excited state, a single or multiple MEMS cantilever 1325 may be deployed to harvest energy from oscillations of spheres 1310 by moving the spheres 1310 towards the plate 210. The attractive forces are shown as 1320 in the figure. While a single MEMS actuator is shown in 215, some embodiments may use multiple MEMS cantilever 1325 and the spheres 1310 either individually or as separate groups may be dedicated to each MEMS actuator.

Figure 13B:
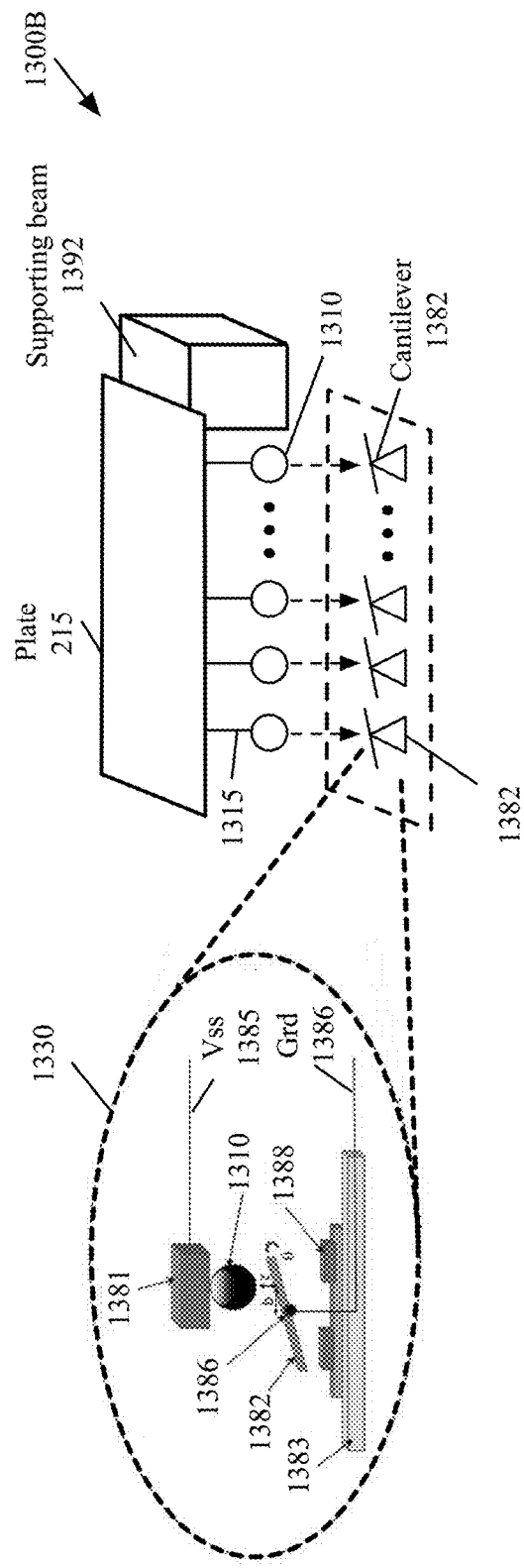

FIG. 13B is a functional diagram illustrating one example of an energy harvesting device 1300B that employs an array of spherical metal cavities and an array of cantilevers instead of two parallel plates, according to various aspects of the present disclosure.

In some of the present embodiments, each sphere may have a radius between 100 micrometers to a few hundred nanometers (e.g., 100 micrometers, 50 micrometers, 1 micrometer, 500 nanometers, 100 nanometers, etc.). The spheres 1310 may be glued onto the end of a copper wire 1381 with conductive epoxy. A 200 nanometers thick film of gold with a thin chromium adhesion layer evaporated on both the sphere and the top plate 1381 during manufacturing process. An additional 10 nanometers layer of gold may be sputtered onto each sphere to provide electrical contact with the wire.

FIG. 13B shows a different configuration where the lower parallel plate is replaced by individual small plates 1382. With reference to the expanded section 1330 in FIG. 13B, the flat electrode 1388 (as shown in the expanded section 1330) is mounted below the arm of the torsion pendulum 1382, while the spherical electrode 1310 is placed vertically at a prescribed distance from the pendulum plate 1386, hereinafter simply referred to as plate. The role of the plate 215 in the embodiments of FIG. 13B is to act as a supporting structure for suspending the spheres 1310 to a group of carbon nanotubes. The supporting beam 1392 may be used to support the plate 215. The supporting beam 1392, in some embodiments, may be attached to the packaging or an interior protrusion of the packaging.

The plate 215, in the embodiment of FIG. 13A is moving (in order for the cantilever 1325 to vibrate) while the plate 215, in the embodiment of FIG. 13B is stationary since the energy is harvested from the cantilevers 1382.

The sphere 1310 may be covered by a gold film and glued onto the end of a copper wire 1381 with conductive epoxy and positioned close to one of side of the plate 1382. The polysilicon plate 1382 is suspended from two of its opposite sides by thin torsional rods 1386. The two fixed polysilicon 1388 electrodes are located symmetrically under the plate 1382. The plate 1382 is free to rotate about the torsional rod 1386 in response to an external torque. The torsional rod 1386 provides the restoring torque to counter the external torque rotation angle, denoted as 0 about the center of the torsional rod 1386. The voltage applied to the sphere 1310 at distance z, the distance closest approach to the sphere, attracts the plate 1382, whereby the torsion rod 1386 counteracts the attraction and the plate 1382 returns to its initial position. The action of rotation of the plate 1382 induces an electrical current in the piezo electrical layer of the plate 1382, which may be harvested for generating power. The harvested output voltage as denoted as Vss 1385 and Grd 1386.

Figure 14:
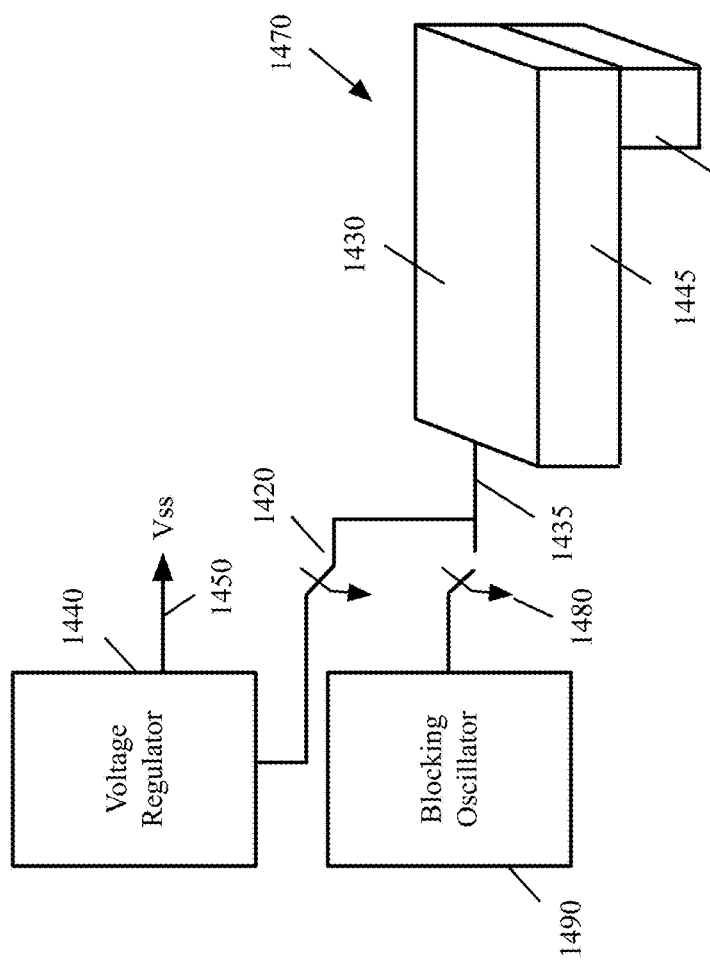

In some of the present embodiments, the mechanical energy harvesting device may use a nano piezoelectric based substance as a cantilever. FIG. 14 is a functional diagram illustrating one example of a portion of an energy harvesting device that uses a nano piezoelectric based substance as a cantilever 1470, according to various aspects of the present disclosure. For simplicity, the movable electrode plate connected to the cantilever 1470 is not shown in FIG. 14.

With reference to FIG. 14, a MEMS nano piezoelectric based substance is used for harvesting power from the motion of the upper electrode plate 215 (FIGS. 2A-2B). Utilizing a nano-piezoelectric structure interacting with the flat conductive plate 215 also acting as electrode is chosen for the vibration modes such to exert optimum strain in the appropriate direction, denoted as z-direction in FIGS. 7A-7B. Piezoelectric materials with appropriately chosen electromechanical coupling factor for power harvesting have anisotropic behavior, which depends upon the direction of the strain and the direction of the polarization and with respect to the position of the electrode. In certain embodiments, it is possible to use a bimorph piezoelectric energy harvester based on a cantilever beam. In which case, two piezoelectric layers are fixed to a non-piezoelectric elastic layer in this case to create a cantilever. A layered perspective of the cantilever 1470 is shown, where the piezoelectric plate 1430 is mounted on a plane of silicon 1445 which is placed on top of a layer of gold or silver (for high conductivity), acting as electrode 1450.

The electrical switch 1420 is closed when energy is harvested from the cantilever 1470. When the switch 1420 is closed, the MEMS cantilever output 1435 drives the voltage regulator 1440 to maintain a constant voltage 1450. The electrical switch 1480 is closed when the blocking oscillator 1490 is used to excite the system, the oscillator 1490 may drive a square wave. The blocking oscillator is only used during excitation period to create a square wave for synthesizing mechanical vibration to prime the carbon nanotube arrays 235 (FIGS. 2A-2B) by forcing the upper electrode plate 215 to reach resonant frequency.

Figure 15:
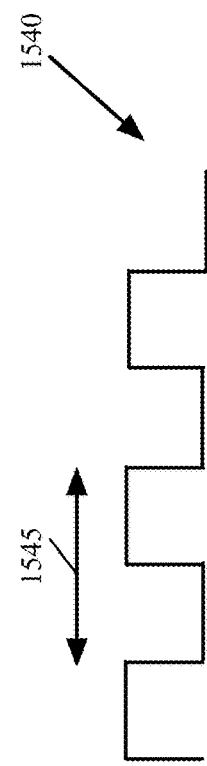

FIG. 15 illustrates an example of a simple square wave 1540 generated by the oscillator 1490 of FIG. 14. With reference to FIG. 15, the square wave 1540 has a periodicity as shown by 1545. The wave 1540 generated by the blocking oscillator 1490 may be used to drive the cantilever 1470 for periodically compressing the carbon nanotube array 235 (FIGS. 2A-2B), forced by the cantilever 1470. Once the piezoelectric cantilever 1470 reaches the resonant frequency of the oscillation mode, the switch 1480 is opened and the blocking oscillator 1490 is powered down. The device enters its normal mode of operation and the switch 1420 is closed to draw the electrical current from the cantilever and regulate the voltage by the voltage regulator 1440 connected to the output 1435 of the cantilever 1430. The switch 1480 may be opened and the switch 1420 may be closed in order to output the voltage $V_{ss}$ 1450 harvested from the cantilever 1470.

Figure 16:
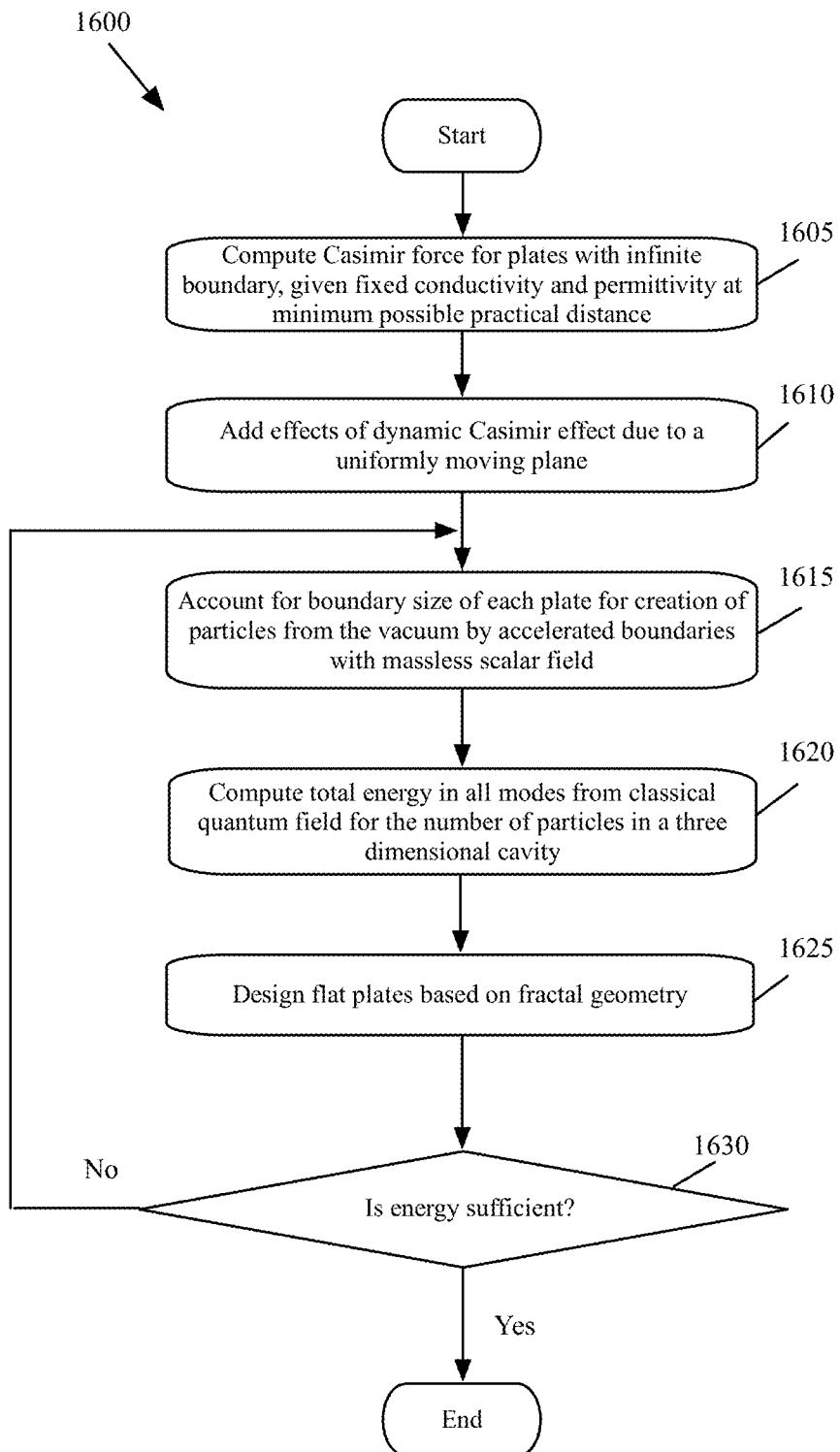

The Casimir energy and force may change at room temperature depending on the geometry of the configuration and the type of boundary conditions. FIG. 16 is a flowchart illustrating an example process 1600 for the design of the mechanical energy harvesting device, according to various aspects of the present disclosure. The process 1600 is an iterative method that some embodiments use to come up with a design for the mechanical harvesting device to match the performance parameters. The process uses the algorithms and formulas that are written for ideal conditions in order to come up with the design that matches a desired set of performance parameters.

The design process begins by considering the metal plates at a fixed distance. The process considers practical constraints and computes the Casimir force. The process, at block 1605 computes the Casimir force for plates with infinite boundary, given fixed conductivity and permittivity at minimum possible practical distance between the two plates.

Next, the process adds (at block 1610) the effects of dynamic Casimir effect due to a uniformly moving plane. At block 1610, the dynamical behavior of Casimir effect is considered, with one plane in stationary state and the other plate accelerates moving in the positive direction downward towards the stationary plate. For a massless scalar field, the vacuum energy density is obtained using Green's function method, after subtracting the contribution from free Minkowski space (i.e., the three-dimensional Euclidean space and time), the Casmir pressure between two plates is computed as a function of velocity.

Next, the process accounts (at block 1615) for boundary size of each plate for creation of particles from the vacuum by accelerated finite boundaries with massless scalar field. Modification is made (at block 1615) to account for the dynamical Casimir effect which arise from the movement of the plate (235). For a uniformly moving plane, the Casimir force acquires a velocity dependent correction. For an accelerated plane, the Casimir force is accompanied by creation of particles from the vacuum. Material boundary is viewed as a kind of concentrated external field, and moving boundaries act as nonstationary external field. The creation of particles from the vacuum by nonstationary external fields is familiar in the S-matrix (or scattering matrix) theory of particles, characterizing the temporary change in the amount of energy in a point in space. This allows the creation of particle-antiparticle pairs of virtual particles due to the uncertainty principle. While the energy conservation law accounts for creation of positive energy particles and dissipative part accounts for the energy of the remaining part of particles when the plate returns to rest. Several renormalization prescriptions may be used in order to obtain the total energy corresponding to whole trajectory of the plate displacement, and to calculate the radiation-reaction force that acts on the moving plate in emission and absorption of the particles.

The process then computes (at block 1620) the total energy in all modes from classical quantum field for the number of particles in a three-dimensional cavity. In the block 1620, the case of an electromagnetic field in a three-dimensional oscillating cavity is considered. In this case both the total number and the total energy of the created photons grow exponentially with time. The periodically oscillating boundary is well known to be mathematically equivalent to an external electric field periodic in time. Bosonic particles form the carriers of the field between two parallel metal plates that collectively manifest into the Casimir force. The number of bosonic particles created by such a field from the vacuum depends on time, given the condition of parametric resonance is satisfied.

Next, the geometry of flat metallic plates is modified (at block 1625) to fractal geometry as described above with reference to FIG. 9 and the total energy is re-calculated. If the energy is sufficient, the design process may end, otherwise the design process iterates back (at block 1630) to block 1615, by adjusting the plate sizes and repeating blocks 1620-1625 until the desired energy level is reached.

II. Using RF Energy to Ignite a Mechanical Energy Harvesting Device

RF and solar energy, in some embodiments, provide effective sources for complementing the operation of device. That is to assure that energy harvesting device always outputs sufficient power for the intended application. Furthermore, whenever either sources are present, these sources may complement constructively, to add to the total power harvested from the device.

Figure 17:
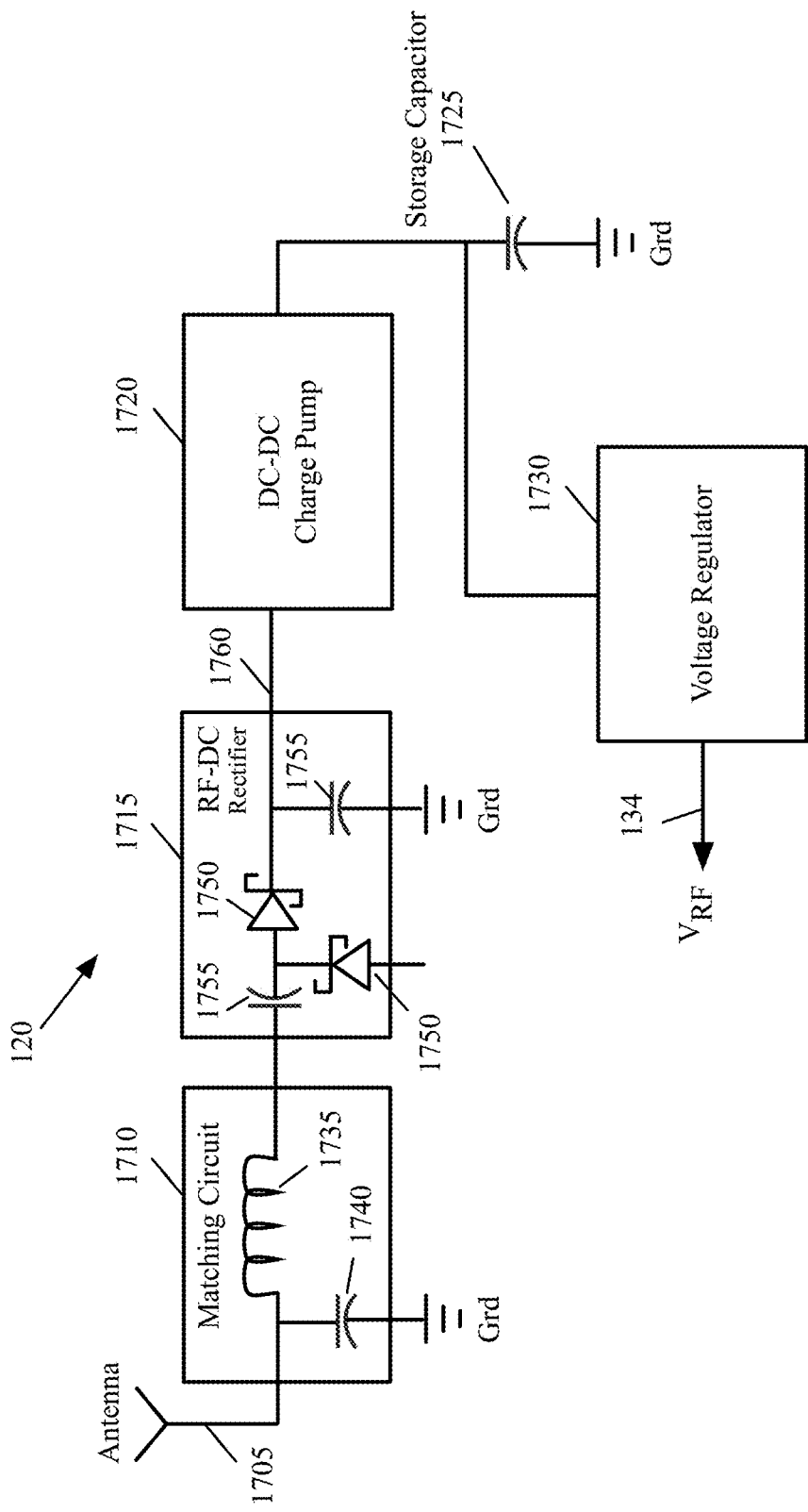

Energy harvesting from electromagnetic force is realized by converting RF signals to DC power. The RF signals may be ambient or judiciously designed waveform for power harvesting. FIG. 17 is a functional diagram illustrating one example embodiment of an RF based energy harvesting system 120, according to various aspects of the present disclosure. The system may include an antenna 1705, an impedance matching circuit 1710, an RF to direct current (DC) rectifier 1715, a DC-DC charge pump 1720, a storage capacitor 1725, and a voltage regulator 1730.

An RF signal may impinge on the antenna 1705 as input to the impedance matching circuit 1710. The output of the impedance matching circuit 1710 may drive the RF-DC rectifier 1715, which may convert the RF to DC. The output of the RF-DC rectifier circuit 1715 may be input to the DC-DC charge pump 1720 to convert the DC to a desired voltage level, which stored in a capacitor 1725. The voltage regulator 1730 may be used to assure a constant steady voltage level at the $V_{RF}$ output 134.

In some of the present embodiments, the antenna 1705 (sometimes referred to as rectenna when specifically designed for energy harvesting, as described below) may be a dipole antenna (e.g., and without any limitations, a 50 ohms resistance dipole antenna). The RF-DC rectifier 1715, the DC-DC charge pump 1720, the storage capacitor 1725, and the voltage regulator 1730 make a four-stage voltage amplifier. The impedance matching circuit 1710 may include a solenoid 1735 and a capacitor 1740 and may be used to match the impedance of the diploe antenna 1705 to the impedance of the voltage amplifier. The antenna 1705 coupled with the impedance matching circuit 1710 may drive the RF-DC rectifier circuit 1715. The RF-DC rectifier circuit 1715 may include one or more rectifying devices such as Schottky diodes 1750 (that has a metal and n-type semiconductor junction) or a normal barrier diode (that has a p-n semiconductor junction). The RF-DC rectifier circuit 1715 may include one or more capacitors 1755.

The DC output 1760 of the RF-DC rectifier circuit 1715 may drive the DC-DC charge pump 1720. The DC-DC charge pump 1720 may step-up the output voltage of the RF-DC circuit 1715. The output energy of the DC-DC charge pump 1720 may be stored in the storage capacitor 1725. The storage capacitor 1725 may be connected to the voltage regulator 1730, which may regulate the output voltage $V_{RF}$ 134 at a constant output voltage (e.g., at a voltage level required by a particular application). The output $V_{RF}$ 134 of the RF based energy harvesting system 120 may be supplied to the input 101 of the energy harvesting device 100 of FIG. 1.

The rectifying circuit 1715 may be optimized for appropriate excitation signal. Typically, the efficiency of the conversion process is related to receive antenna's 1705 gain, rectification efficiency, impedance matching 1710, bandwidth, power and peak-to-average ratio of the excitation signal. An option by combining the antenna and rectification function is referred to as rectenna, which is a rectifying antenna, a special type of receiving antenna designed specifically for converting electromagnetic energy into direct current (DC) electricity 1760. The charge pump 1720 also steps up the voltage to usable level and stored for driving the voltage regulator 1730 to maintain a constant voltage output level $V_{RF}$ 134.

Figure 18:
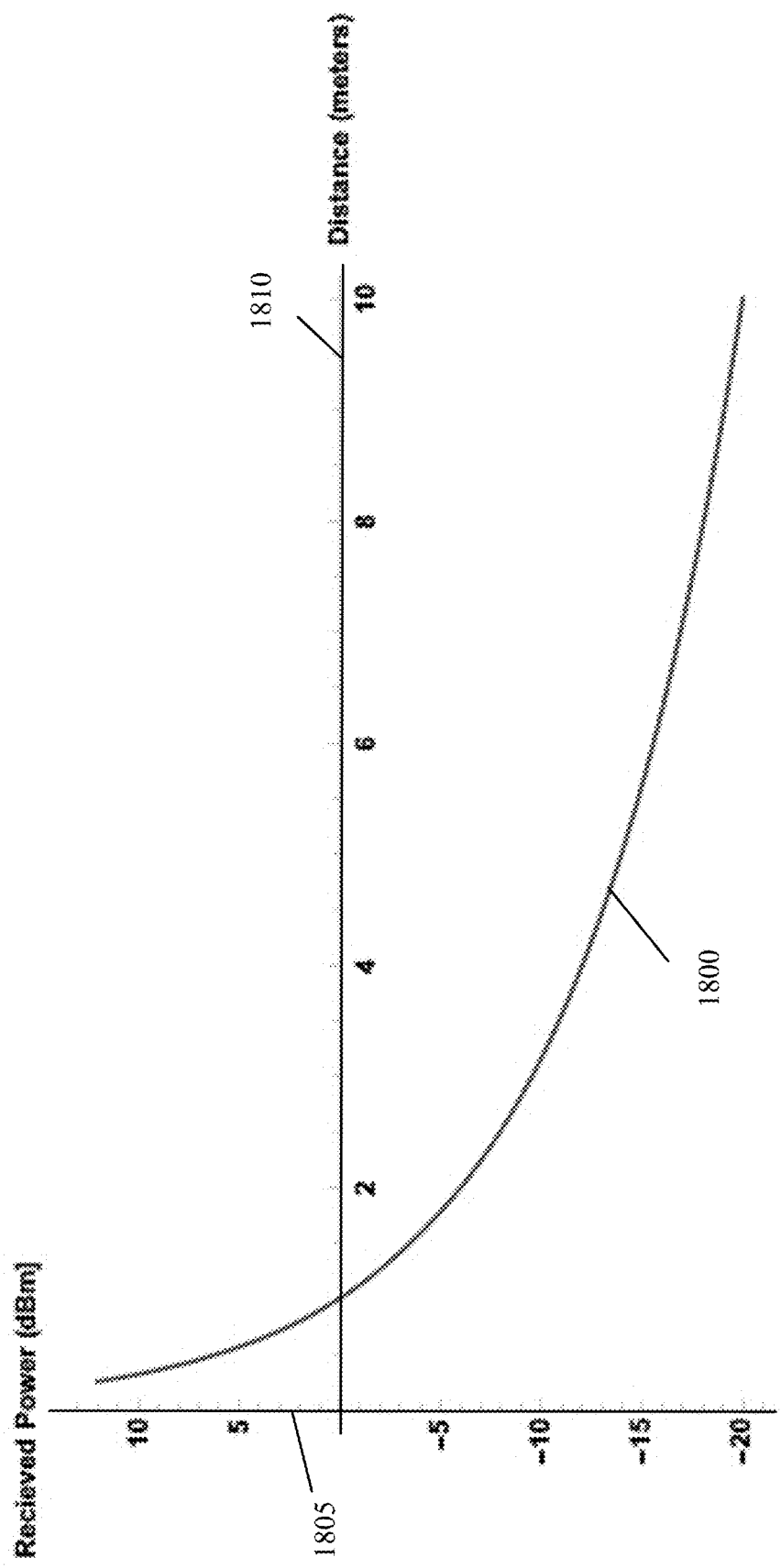
FIG. 18 is a graph depicting the amount of received RF power available for harvesting, according to various aspects of the present disclosure.

FIG. 18 is a graph 1800 depicting the amount of received RF power available for harvesting, according to various aspects of the present disclosure. FIG. 18 is the plot for the received power in dBm (1850) impinging on the antenna for RF power harvesting, as a function of distance 1810 in meters, from a source in UHF band with transmitted power of 4 Watts. This is the maximum allowable power in US in 900 MHz frequency band. With reference to FIG. 18, the received RF power available for harvesting 1805 is plotted for the industrial, scientific, and medical radio band (ISM band) 915 MHz as a function of distance 1810 to the signal source of the excitation signal. The excitation signal may be expressed in Equation (8).

$$P_R = P_T \left(\frac{\lambda}{4\pi r}\right)^2 \qquad \text{Eq. (8)}$$

where $P_R$ is the received power, $P_T$ is the transmitted power, $\lambda$ is the wavelength of the signal, and r is the range in meters. Efficiency of percentage power from $P_R$ converted to actual usable DC power may be dictated by a number of design selections such as the gain and reflection coefficient of the antenna and the selection of semiconductor technology, (e.g., complementary metal-oxide-semiconductor (CMOS) versus Gallium arsenide (GaAs)) and the overall design of the system shown in FIG. 17 to achieve target price and performance.

Figure 19A:
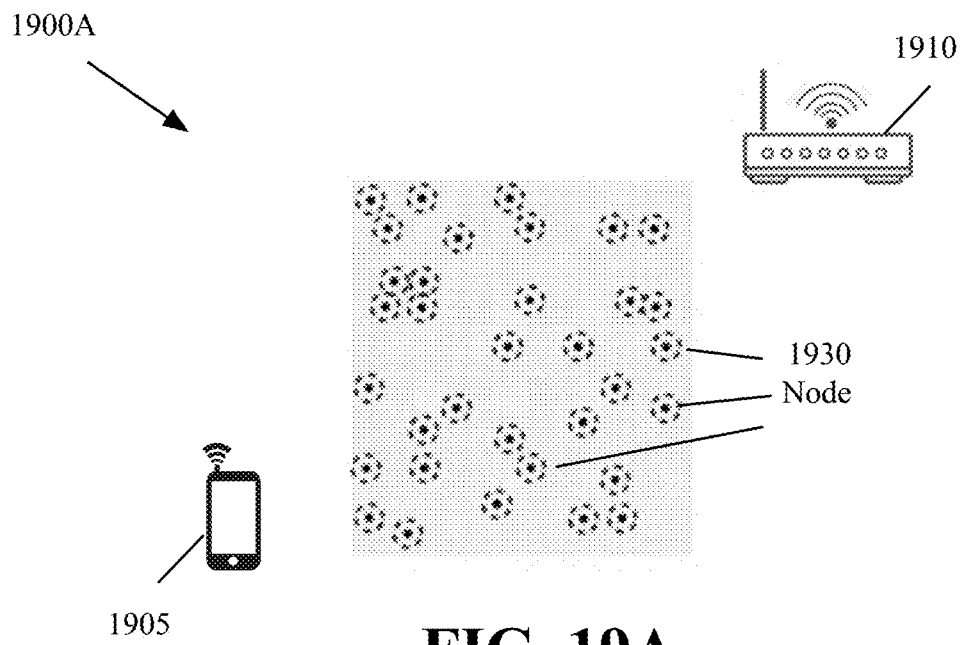
FIG. 19A is a functional diagram illustrating one example embodiment of RF remote charging using a client device, according to various aspects of the present disclosure.

FIG. 19A is a functional diagram illustrating one example embodiment of RF remote charging using a client device, according to various aspects of the present disclosure. Each node 1930 in FIG. 19A may be an energy harvesting device (e.g., the energy harvesting device 140 of FIGS. 1 and 2) and a corresponding electronic device that is using the energy harvesting device as a power source. On an as needed basis, the remote excitation system 1900A of FIG. 19A may be used for remote excitation of one or more energy harvesting devices, associated with the nodes 1930, with a synthesized signal from a client device 1905 and/or a wireless access point (or wireless base station) 1910. The client device 1905 may be, for example and without aby limitations, be a smartphone, a cellular telephone, a tablet computer, a laptop computer, a desktop computer, a personal digital assistant (PDA) device, etc. The client device 1905 and/or the access point 1910 may be used from a distance to excite the device for RF power harvesting.

Figure 19B:
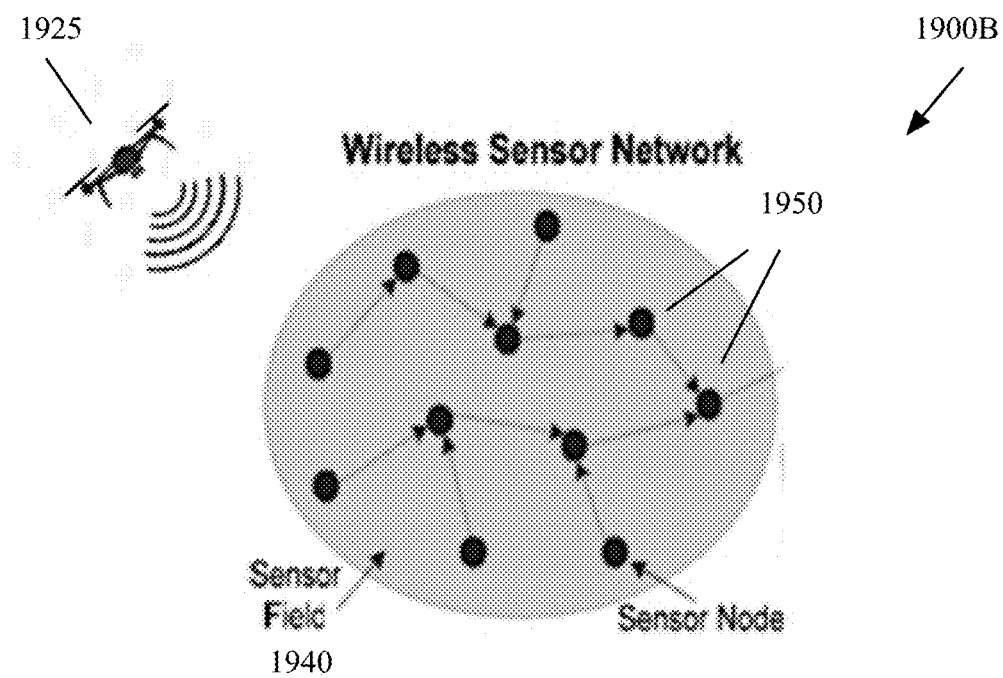
FIG. 19B is a functional diagram illustrating one example embodiment of RF remote charging using a flying object, according to various aspects of the present disclosure.

FIG. 19B is a functional diagram illustrating one example embodiment of RF remote charging using a flying object, according to various aspects of the present disclosure. Each sensor node 1930 in FIG. 19A may include an energy harvesting device (e.g., the energy harvesting device 140 of FIGS. 1 and 2) and a corresponding electronic device (e.g., and without any limitations a sensor or other type of electronic device) that is using the energy harvesting device as a power source. On an as needed basis, the remote charging system 1900B of FIG. 19B may be used for remote charging with a synthesized signal from the flying object

1925 such as, for example and without any limitations, a drone, a balloon, an airplane, a helicopter, or a space-based platform such as without any limitations, a satellite. The flying object 1925 may be used to fly by a sensor field 1940 in inaccessible or remote areas to energize the energy harvesting devices that are providing power to the sensors in each node 1950. The periodicity of remote charging of the device may be dependent on multiple variables such as peak-power, duration of average power consumption when bursting, power profile in sleep and wake mode, operating temperature, and size and weight of the overall system.

Figure 20:
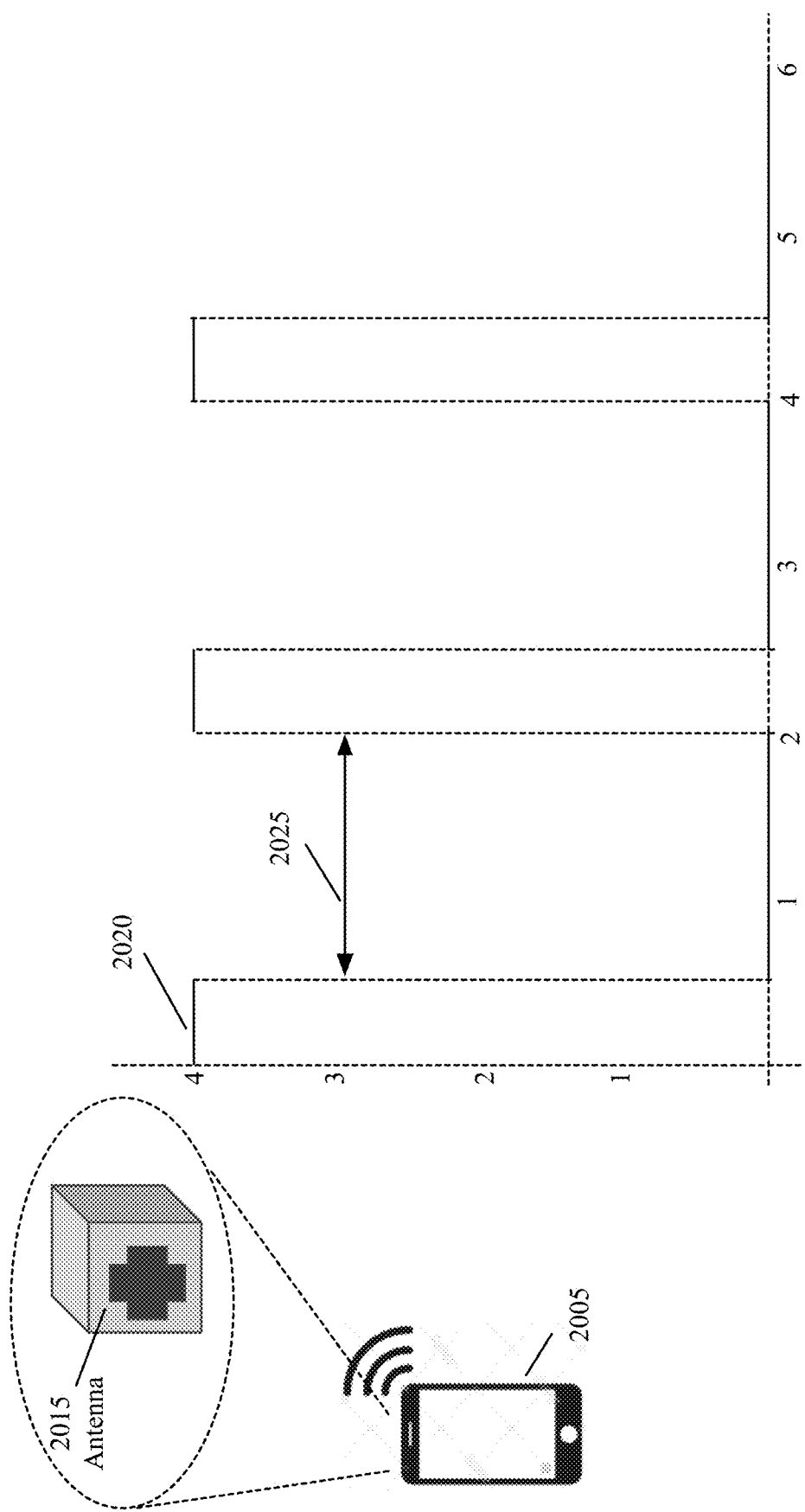
FIG. 20 is a functional diagram of the triggering excitation waveform with duty cycle displayed over time, according to various aspects of the present disclosure.

FIG. 20 is a functional diagram of the triggering excitation waveform with duty cycle displayed over time, according to various aspects of the present disclosure. With reference to FIG. 20, the excitation from a mobile device 2005 (e.g., the mobile device 1905 of FIG. 19A) is shown with the device antenna as 2015, being driven with a square waveform, illustrating the duty cycle over time in driving the excitation with an active excitation period 2020 and powered down to inactive state during normal operation cycle 2025.

Figure 21:
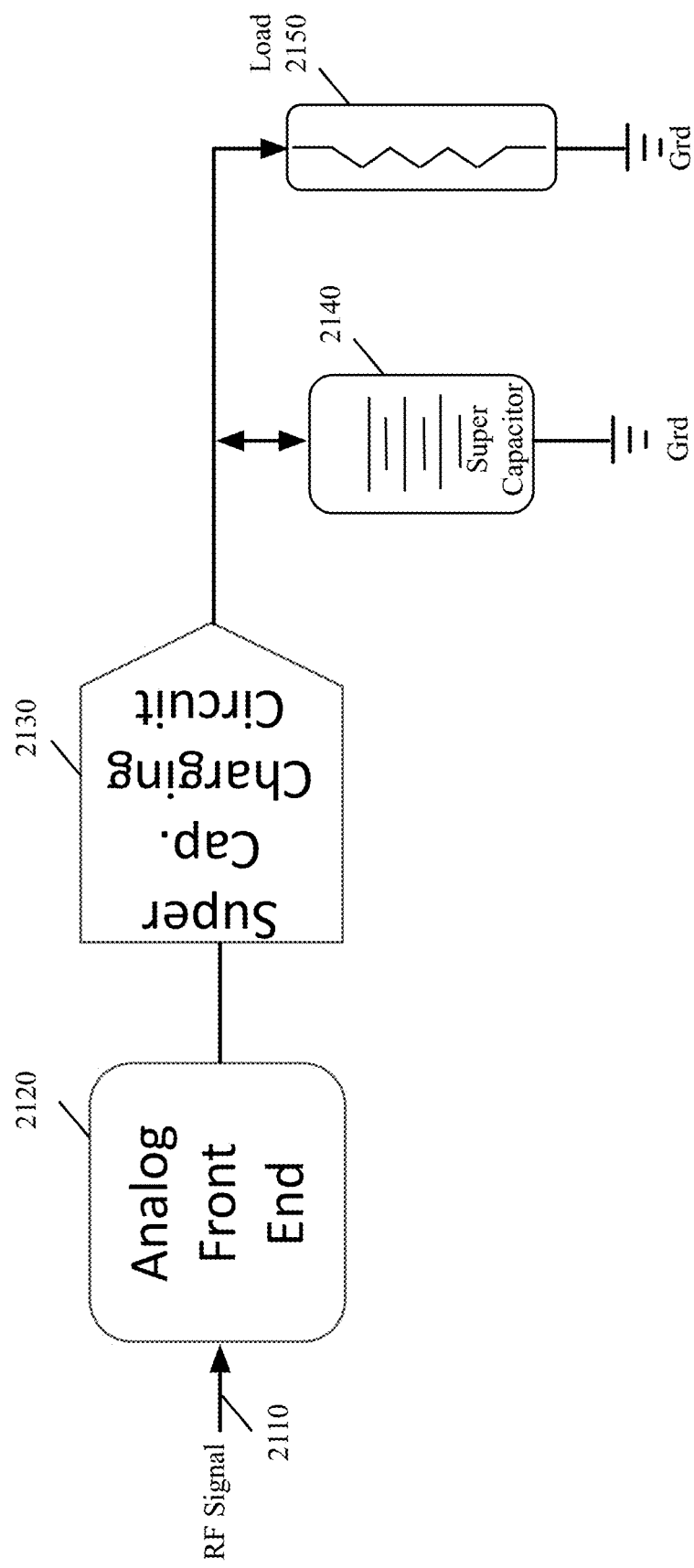
FIG. 21 is a functional diagram illustrating one example embodiment of an RF based energy harvesting system, according to various aspects of the present disclosure.

FIG. 21 is a functional diagram illustrating one example embodiment of an RF based energy harvesting system, according to various aspects of the present disclosure. With reference to FIG. 21, the input RF signal 2110 is processed by the analog front end (AFE) 2120 and the energy is stored in a supercapacitor 2140 using the supercapacitor charging circuit 2130. A supercapacitor is a high-capacity capacitor with much higher capacitance values (but lower voltage limits) than the electrolyte capacitors. A supercapacitor may include two electrodes separated by an ion-permeable membrane and an electrolyte that ionically connects both electrodes.

The load 2150 presents the impedance for the driving the current into the target circuitry, including the piezoelectric cantilever for kick starting the oscillation of metal plates. The signal source 2110 for the AFE 2120 may be an RF signal, for example and without any limitations, in the ISM bands such as 915 MHz band, 2.4 GHz band, or solar power.

Figure 22:
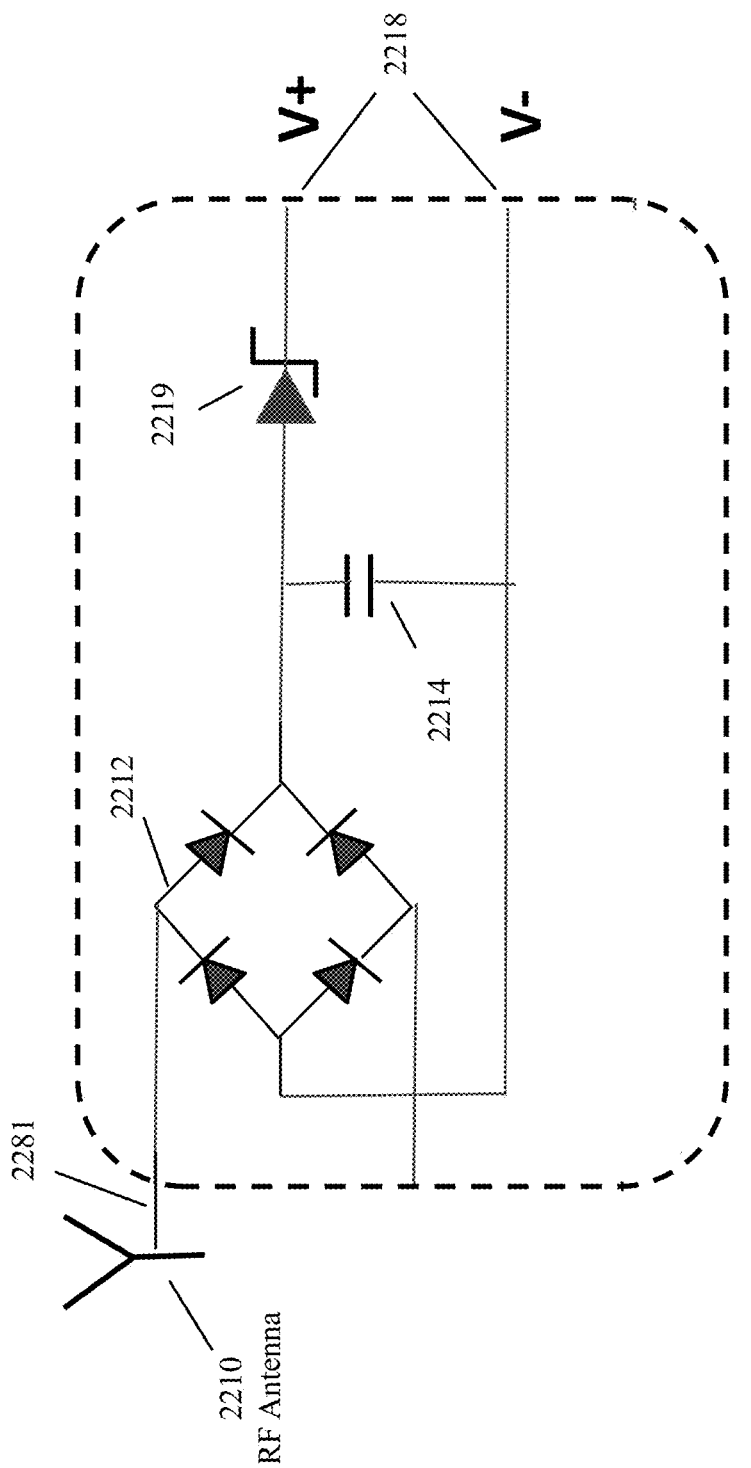
FIG. 22 is a functional diagram illustrating one example embodiment of a harvester analog front end circuit and a supercapacitor, according to various aspects of the present disclosure.

FIG. 22 is a functional diagram illustrating one example embodiment of a harvester analog front end circuit and a supercapacitor, according to various aspects of the present disclosure. With reference to FIG. 22, the output of the antenna 2210 my drive the diode circuitry (e.g., without any limitations, using Schottky diodes, e.g., Skyworks SMS7630-061 diodes) 2212 to rectify the energy to a DC level for charging the supercapacitor 2214, while the diode 2219 (e.g., without any limitations, a BAT54 series Schottky diode) prevents discharge back into source. For power harvesting to initiate, it is necessary to provide impedance transformation to enable charging a supercapacitor from ground state (zero volts). In some embodiments the supercapacitor charging circuit may be used in both RF and solar power harvesting circuit.

Figure 23:
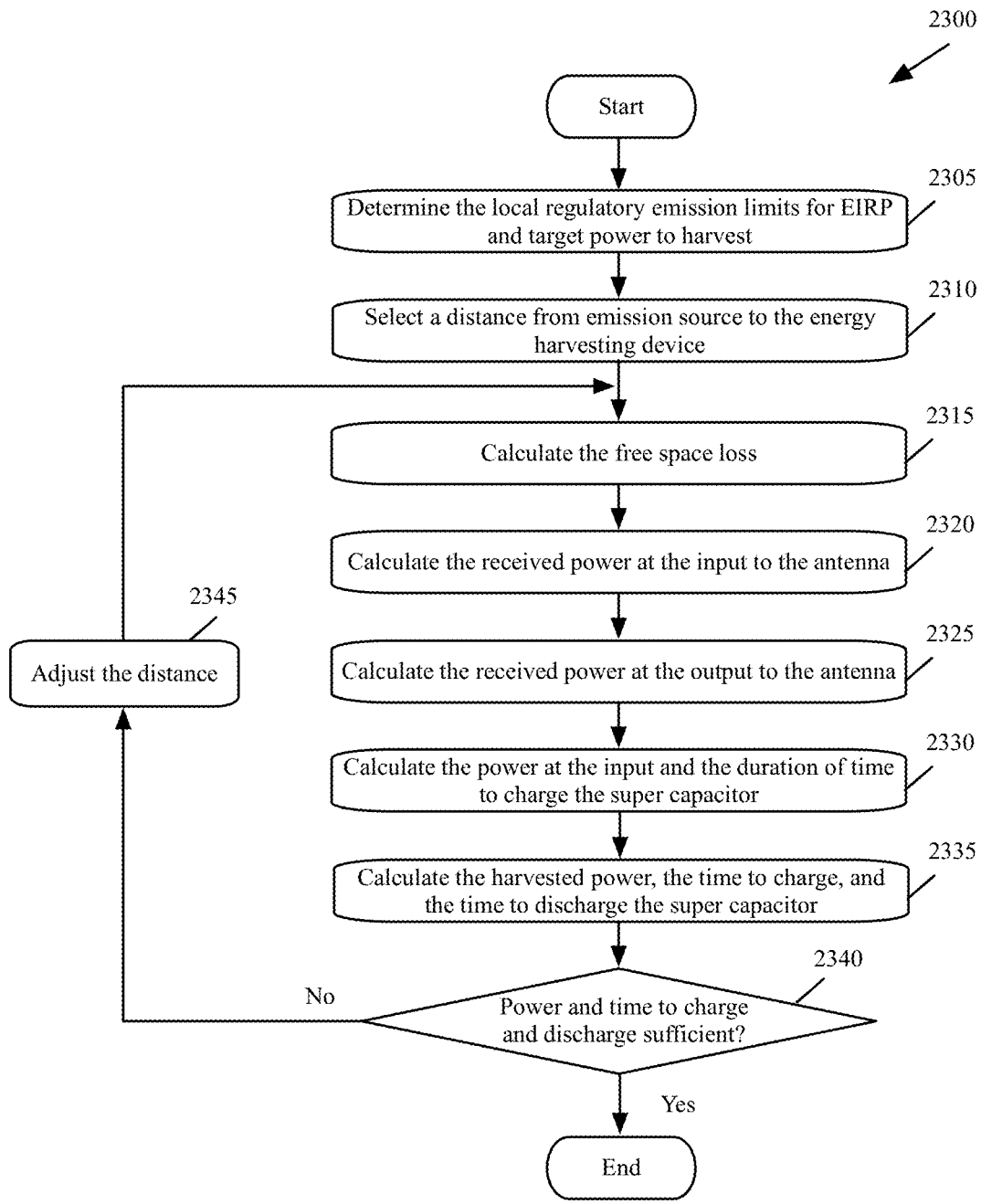
FIG. 23 is a flowchart illustrating an example process for determining the optimal distance to energize an energy harvesting device, according to various aspects of the present disclosure.

The maximum allowable energy harvested from RF energy may be dependent on the distance from the signal source to the device. FIG. 23 is a flowchart illustrating an example process 2300 for determining the optimal distance to energize an energy harvesting device, according to various aspects of the present disclosure. With reference to FIG. 23, the process may determine (at block 2305) the local regulatory emission limits for the Equivalent Isotropically Radiated Power (EIRP) and the target power to harvest. The EIRP is the product of the transmitter power and the antenna gain in a given direction relative to an isotropic antenna of a radio transmitter.

Next, a distance is selected (at block 2310) from the source (i.e., the RF device that is providing excitation energy) to the energy harvesting device. Next, the process calculates (at block 2315), the free space loss. The process then calculates (at block 2320) the received power at the input of the antenna used in the emission device by taking account of the antenna gain and insertion losses associated with the particular antenna. The process then calculates (at block 2325) the received power at the output of the antenna by taking the account of the antenna gain and the insertion losses associated with the particular antenna.

The process then calculates (at block 2330) the power, voltage, and current to the supercapacitor computed from the power calculated at the output of the antenna 2210. The process then calculates (at block 2335), the amount of harvested power, the time to charge the supercapacitor, and the time to discharge the supercapacitor. The process then determines (at block 2340) whether the power, the time to charge, and the time to discharge are acceptable for a particular use case. If yes, the process ends. Otherwise, the process may adjust (at block 2345) the distance (e.g., by reducing the distance between the source device and the energy harvesting device). The process then returns to block 2315 to repeat blocks 2315-2340.

Figure 24:
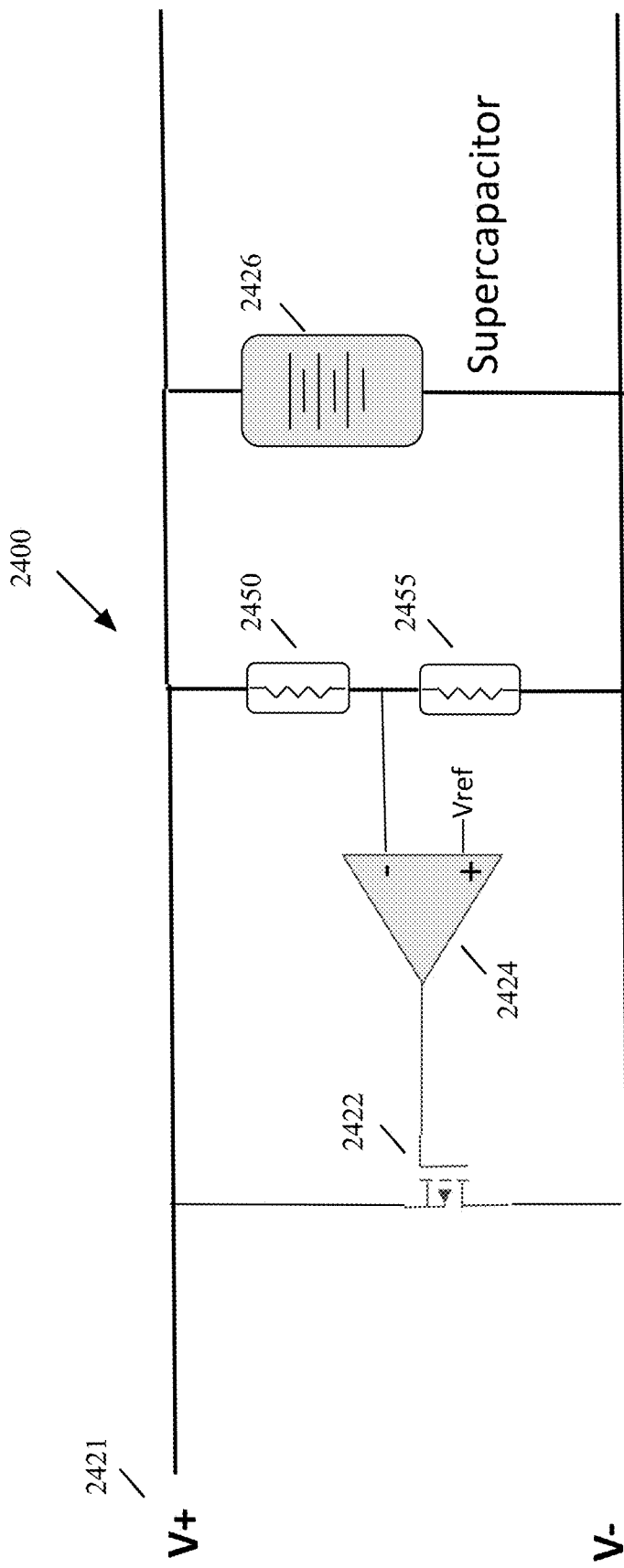
FIG. 24 is a functional diagram illustrating one example embodiment of a supercapacitor charging circuit, according to various aspects of the present disclosure.

Using the circuit shown in FIG. 22 as the model for a harvester AFE, the current and voltage may be characterized by Equation (9):

$$I_l(t) = (V_{sc}(t) - \sqrt{(V_{sc}(t) - 4E_sP)})/(2E_s) \qquad \text{Eq. (9)}$$

Where $I_l(t)$ represent the current at the output 2421 of FIG. 24. FIG. 24 is a functional diagram illustrating one example embodiment of a supercapacitor charging circuit, according to various aspects of the present disclosure. With reference to FIG. 24, the circuit diagram for the interface circuitry to the supercapacitor is shown. The circuit may include the resistive network 2450, 2425, 2424, and 2422 to assure the capacitor 2426 is not discharged and the output load is not driven until sufficient voltage is accumulated across the capacitor 2426. In the following equations, $V_{sc}(t)$ is the voltage at the supercapacitor 2426, $E_s$ is equivalent series of resistance (ESR) of the capacitor 2426, and P is the power required to drive the output 2421 voltage or current. The voltage at the load may be expressed by the Equation (10) and the voltage at the supercapacitor may be expresses by the Equation (11):

$$V_l(t) = (V_{sc}(t) - I_l(t)E_s) \qquad \text{Eq. (10)}$$

$$V_{sc}(t_2) - V_{sc}(t_1) = -I_l(t_2 - t_1)/C \qquad \text{Eq. (11)}$$

Where $t_2 > t_1 \geq 0$ and C is the capacitance in Farads and R is the resistance in ohms. The voltage across a capacitor ma be characterized by Equation (12) as a damped exponential:

$$V_c(t) = V(t)\left(1 - e^{-\frac{t}{C \cdot R}}\right) \qquad \text{Eq. (12)}$$

Thus, the charge time may be expressed by the Equation (13):

$$t_c = -\left(\ln\left(1 - \frac{V_c(t)}{V(t)}\right)\right) \cdot C \cdot R \qquad \text{Eq. (13)}$$

For estimating the amount of discharge time of the capacitor the Equation (14) may be used:

$$t_D = C/\bar{I}$$ Eq. (14)

where $\bar{I}$ is the average current, the average being computed by considering maximum and minimum current. Here, $t_c$ represents the time duration to charge the capacitor and $t_d$ represents the time duration to discharge the energy into the load, which in some embodiments is the nano-piezoelectric cantilever (e.g., the nano-piezoelectric cantilever 270 of FIGS. 2A-2B).

With reference to FIG. 24, the supercapacitor charging circuit 2400 may include a load switch 2422 and a comparator 3224 for power monitoring. A specific example is provided herein for selecting the components of the supercapacitor charging circuit to excite the energy harvesting device with using 915 MHz frequency band, which is the UHF ISM-band. The U.S. Federal Communications Commission (FCC) regulations allows emission of up to 4 Watts emitted EIRP in the unlicensed band in 915 MHz. For this band, the following selection of parts may made. An Infineon IRLML6401, P-Channel MOSFET load switch may be used as the load switch 522 and a Texas Instrument TLV3011 open drain output push-pull comparator may be used as the comparator 2424. An AVX BZ05FB682ZSB, ultra-low ESR high power pulse supercapacitor may be used as the supercapacitor 2426.

In excitation of the energy harvesting device from a signal source, the key parameter to consider is the distance of the signal source to the device to deliver sufficient power in the signal impinging on the antenna embedded on the device. The farther the distance, the less power is made available for the purpose of RF energy harvesting. Sample calculations are followed in a case with emission from 20 feet distance from the device. The power level at the pin in the harvester input 2281 of FIG. 22 (which is the signal at the output of antenna 2210) is 36−47+2=−9 dBm (0.126 mW) (79 mV into 50 ohms), where 36 dBm is calculated input power, 47 dB is free space loss and an antenna gain of 2 dB is considered. For determining the capacitor size using the part selected for the supercapacitor 2426, 6.8 mF with 500 milli-Ohm ESR is used. Assuming fairly high and conservative choices for 100 micro Watts with one second load requirement (i.e., one second continuous delivery of excitation energy to the load), and voltage requirement with Vmax=2.7V (frequently used voltage level in low power CMOS), Vmin (frequently minimum voltage that low power CMOS can operate) equal to 2.4 V which respectively translate into a maximum current Imax=100 uW/2.4=41.7 uA, minimum current Imin=100 uW/2.7=37.1 uA, and average current Iave=39.4 uA, the voltage drop is 39.4 uA(147+ 0.5)=5.81 mV.

Time to discharge by 0.3V is 51.8 sec. Approx. (for 100 uW of power requirement) establishes the maximum duration of excitation period allowable in 900 MHz frequency band with the design choices described herein. From equation (13), then the time to charge the supercapacitor is calculated as (6.8 mF, 500 mohm ESR) (78 mV)=15 ms. That is the time to charge the supercapacitor (6.8 mF, 500 mohm ESR) (78 mV) is equal to 15 ms.

Calculations herein illustrates where a 4 W EIRP signal at 20 feet may charge a 6.8 mF supercapacitor in about 15 msec to 78 mV. This in turn may provide a 100 uW power to a load for 51 sec. If necessary, a voltage boost circuit may be added to the circuit 2400 of FIG. 24, which is a DC-to-DC power converter that steps up voltage from its input supply, to get the higher voltage levels and/or multiple capacitors may be used in series to increase the required voltage for a particular use case.

Figure 25:
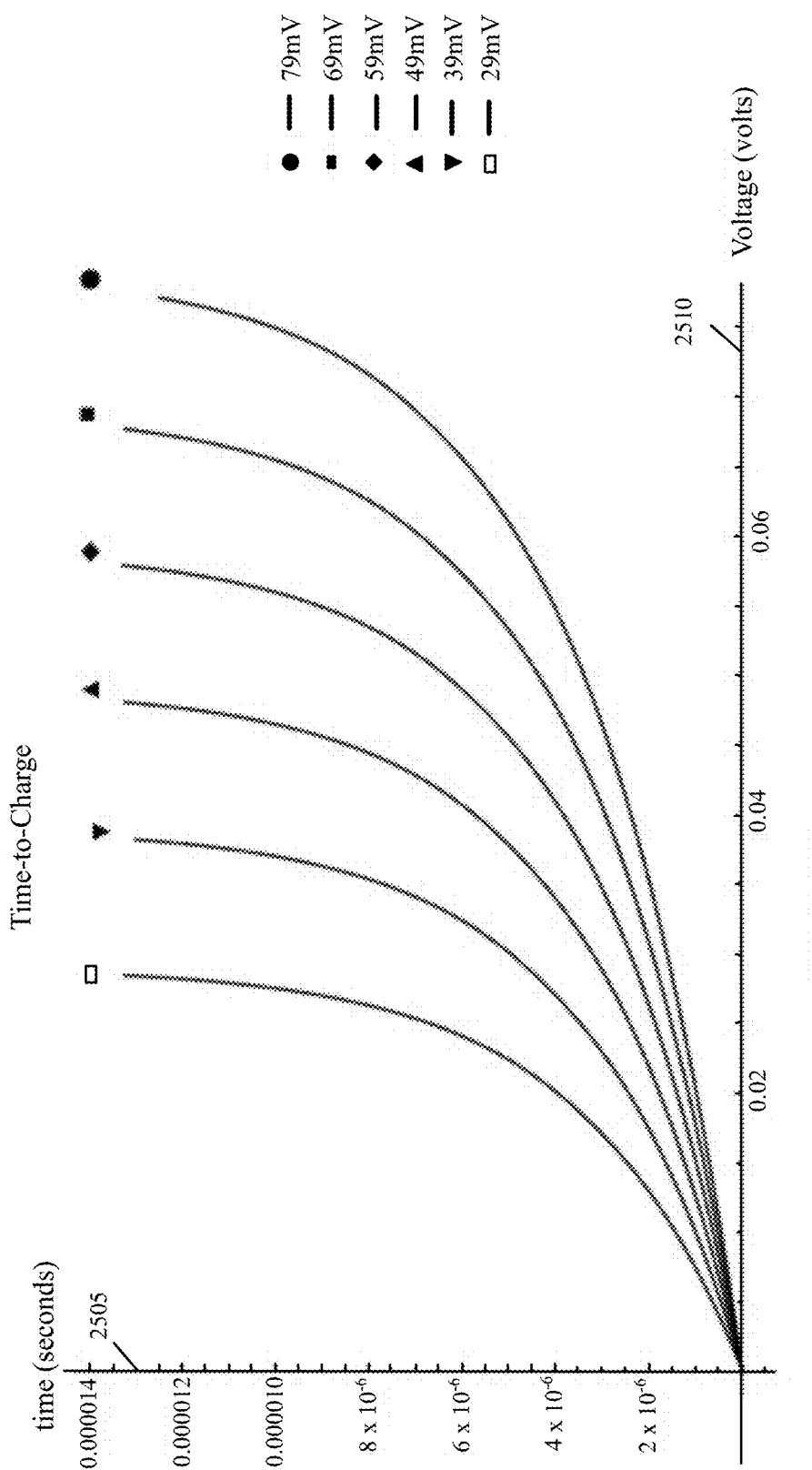
FIG. 25 is a graph depicting time-to-charge for different output voltage levels and the required harvested voltage levels into the load, according to various aspects of the present disclosure.

FIG. 25 is a graph 2500 depicting the duration for time-to-charge for different output voltage levels in millivolts as a function of the output voltage 2510, according to various aspects of the present disclosure. Power harvesting with RF energy employing the circuit model described in FIGS. 22 and 24, with Equations (09) to (14) are used to calculate the time-to-charge 2505 in FIG. 25.

Figure 26:
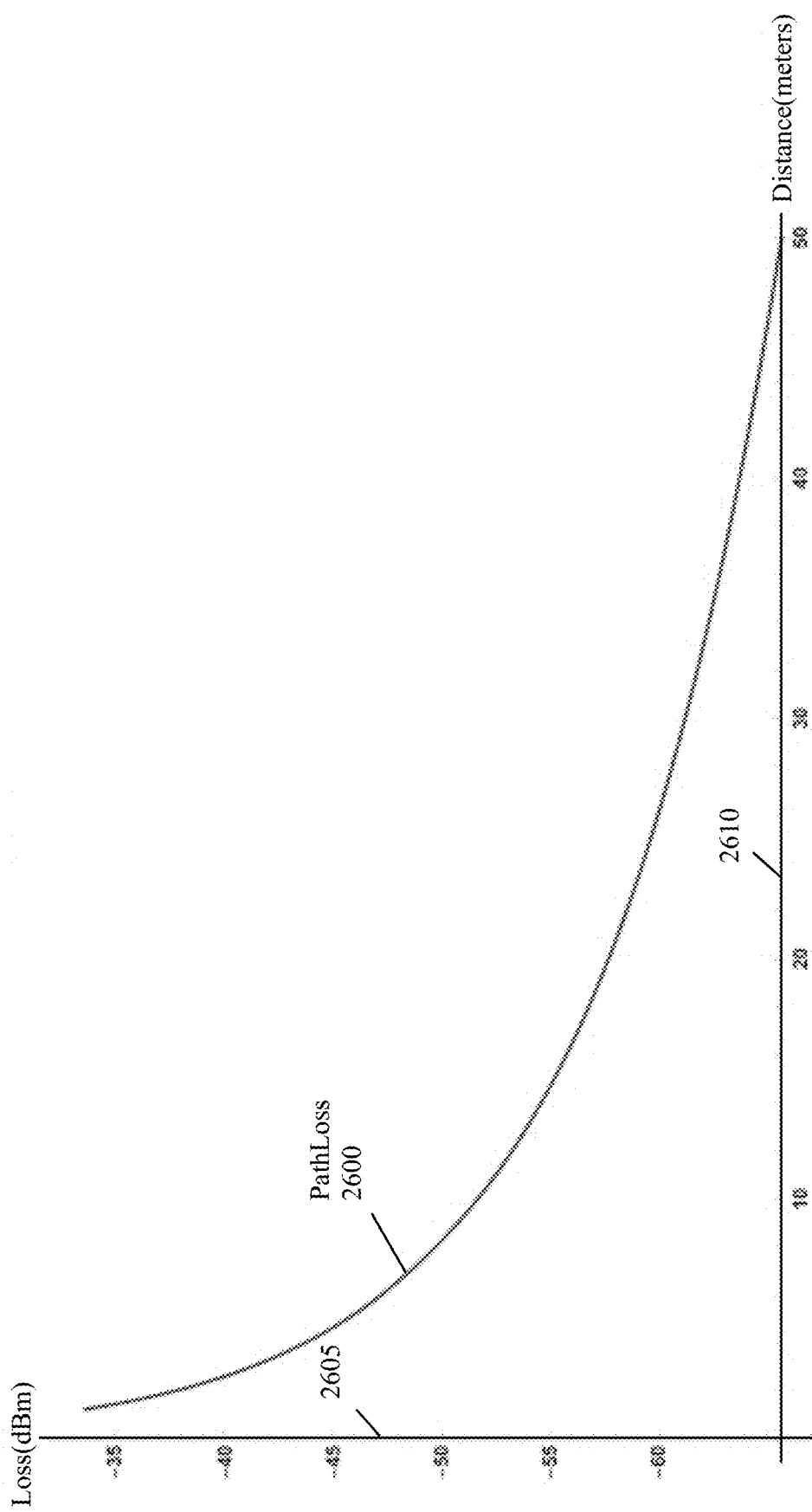
FIG. 26 is a graph depicting the computed path loss, according to various aspects of the present disclosure.

FIG. 26 is a graph 2600 depicting the computed path loss, according to various aspects of the present disclosure. In the example of FIG. 26, the path loss 2605 is calculated versus the distance 2610 according to block 2315 of FIG. 23.

Figure 27:
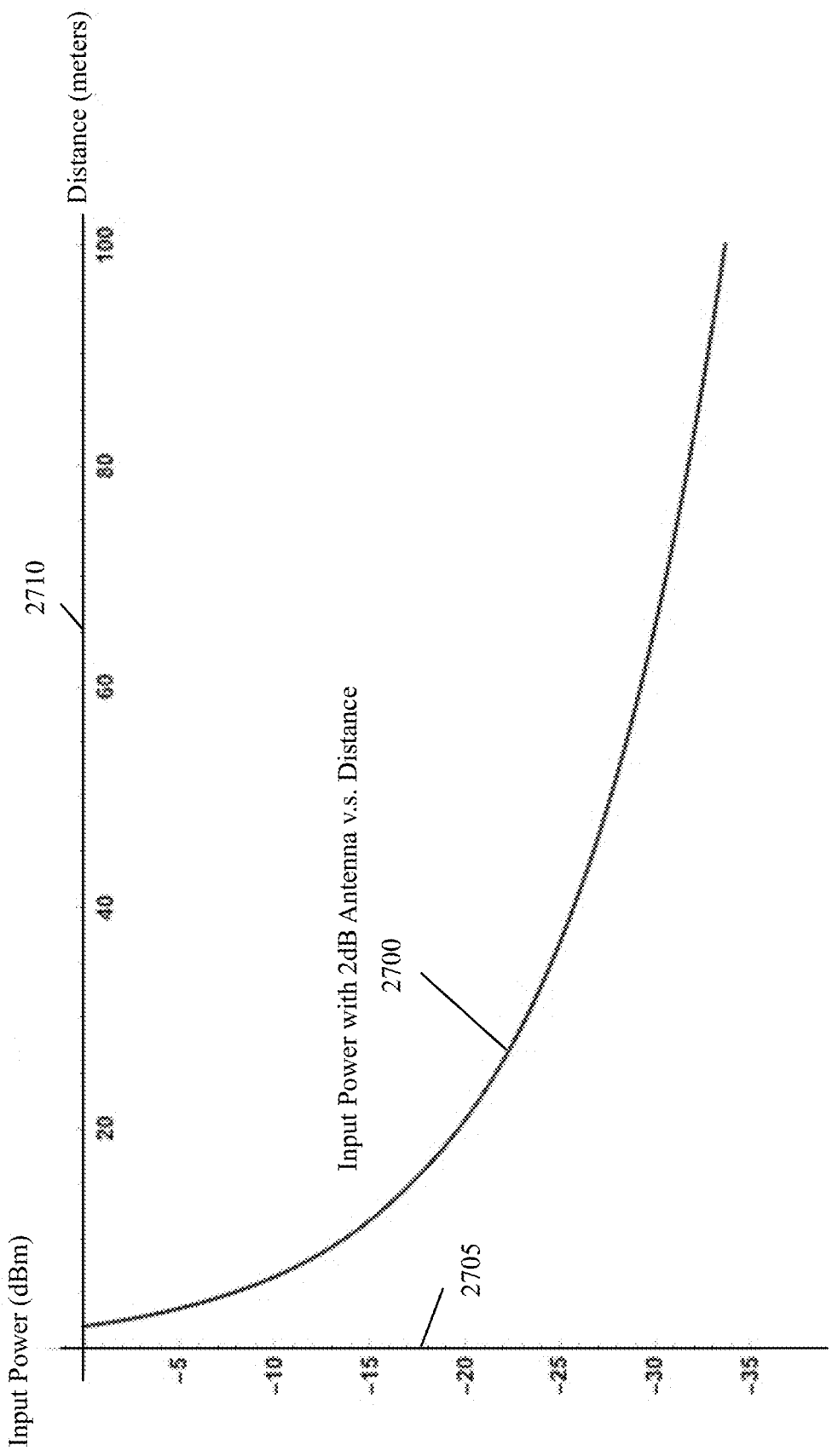
FIG. 27 is a graph depicting the input power of an antenna versus the distance, according to various aspects of the present disclosure.

FIG. 27 is a graph 2700 depicting the input power of an antenna versus the distance, according to various aspects of the present disclosure. In FIG. 27, the input power 2705 using a 2 dB antenna is shown versus distance 2710 in meter.

Figure 28:
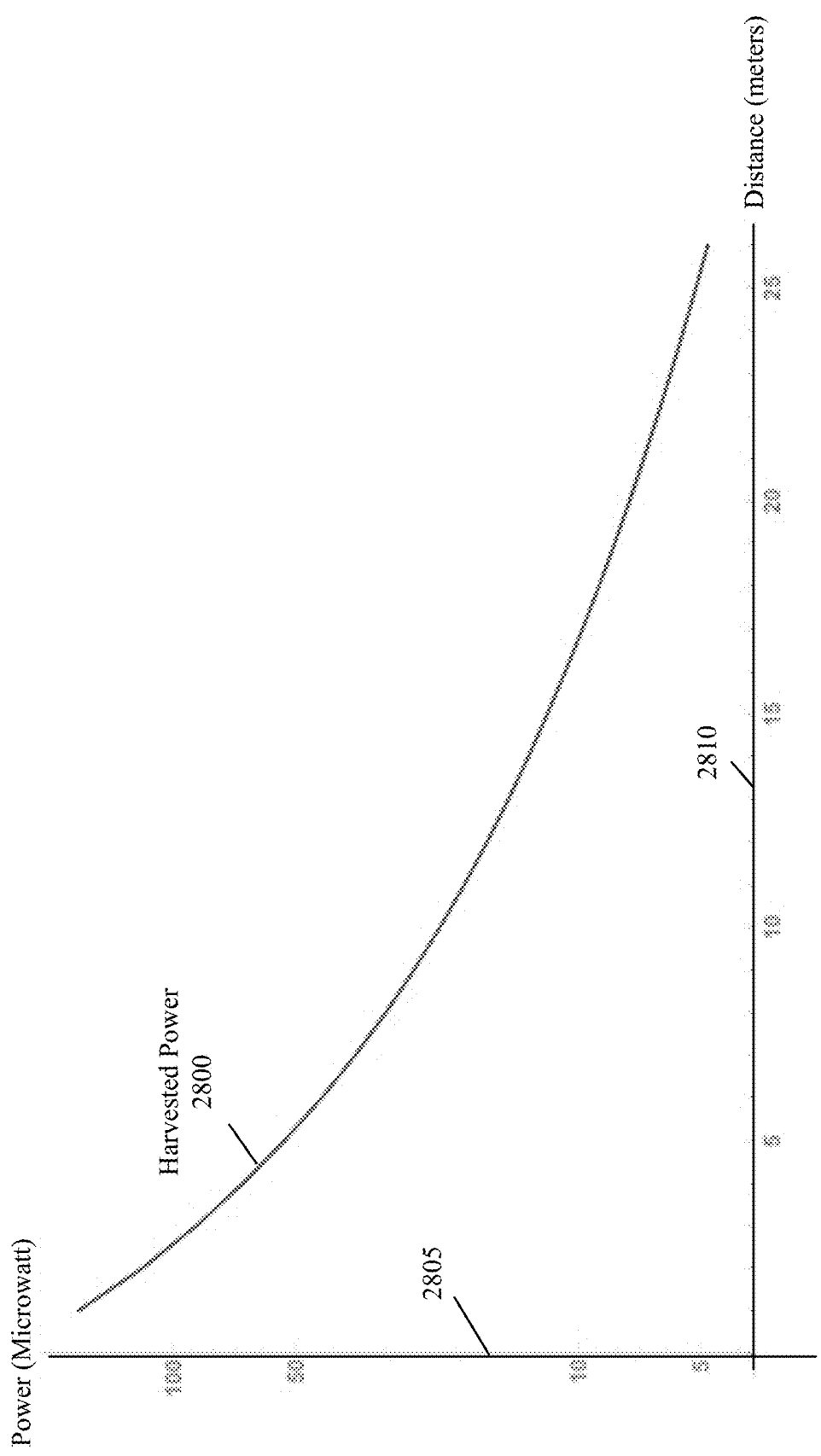
FIG. 28 is a graph depicting the harvested power versus distance, according to various aspects of the present disclosure.

FIG. 28 is a graph 2800 depicting the harvested power versus the distance, according to various aspects of the present disclosure. The allowable maximum harvested power in micro-watts 2805 is shown in FIG. 28 as a function of distance in meters 2810. This means the distance to remotely excite the energy harvesting device for re-ignition or power-up shall be adjusted to accommodate the desired power level.

Figure 29:
FIG. 29 is a bar chart showing the time to discharge as a function of the required total harvested power, according to various aspects of the present disclosure.

FIG. 29 is a bar chart showing the time to discharge as a function of the required total harvested power, according to various aspects of the present disclosure. With reference to FIG. 29, the time to discharge 2905 from 2.7 Volts for 0.3 Volts is shown as a function of required total harvested power in a bar chart.

Figure 30:
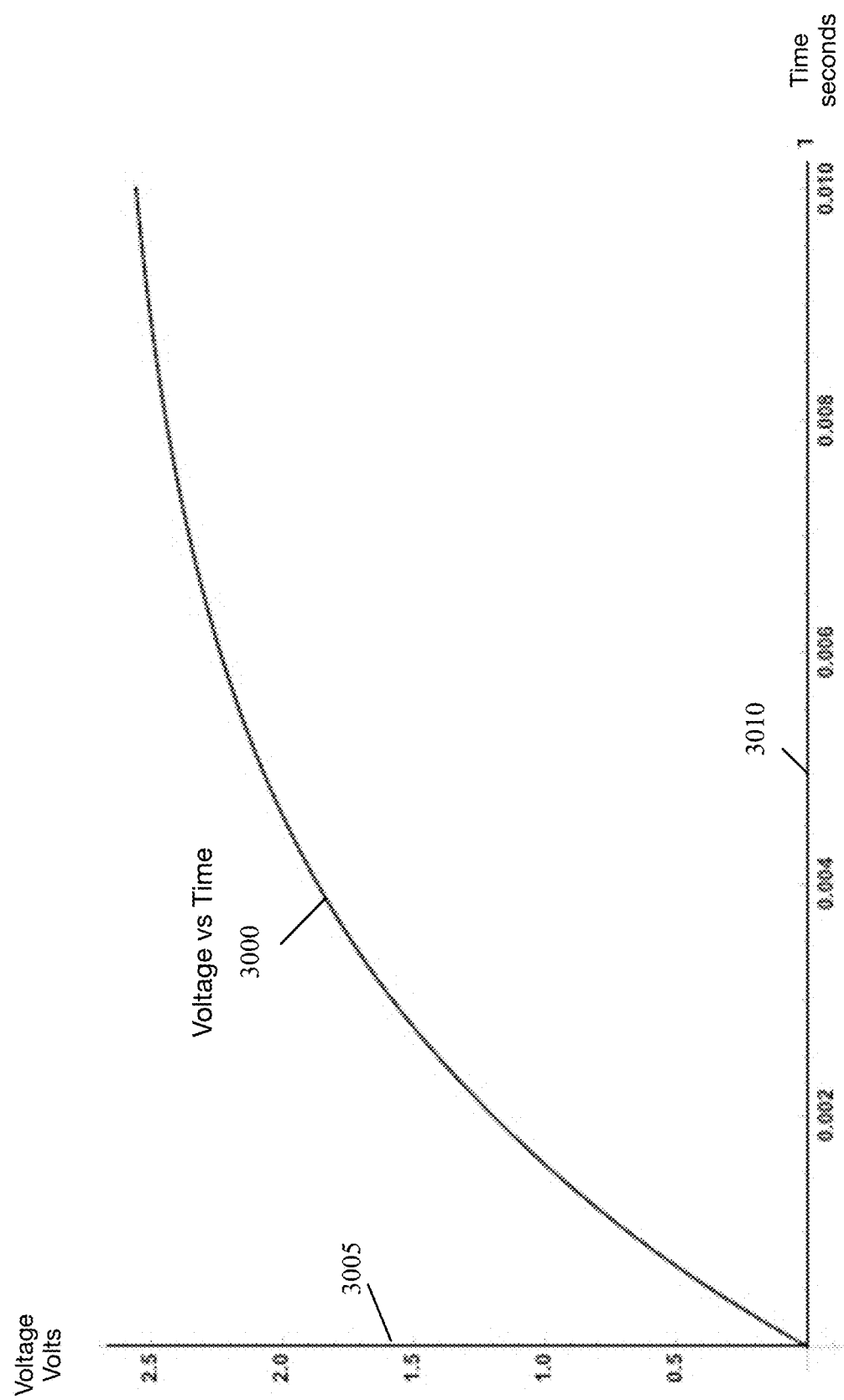
FIG. 30 is a graph depicting the voltage into the device as a function of time, according to various aspects of the present disclosure.

FIG. 30 is a graph 3000 depicting the voltage into the device as a function of time, according to various aspects of the present disclosure. With reference to FIG. 30, the voltage (in volts) 3005 into the device is depicted as a function of time 3010 (seconds).

Figure 31:
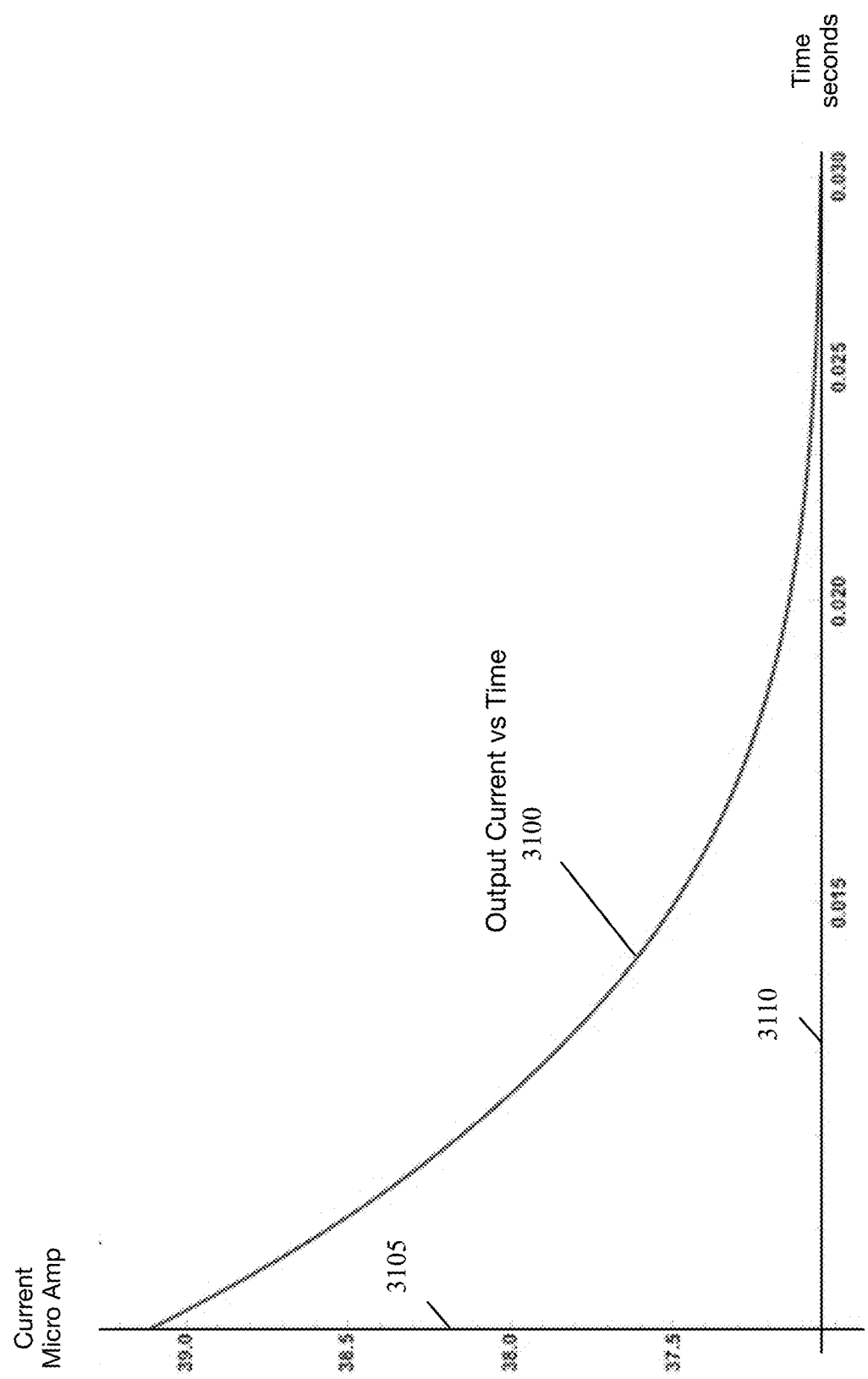
FIG. 31 is a graph depicting the output current versus time according to various aspects of the present disclosure.

FIG. 31 is a graph 3100 depicting the output current versus time according to various aspects of the present disclosure. With reference to FIG. 31, the output current 3105 in microamps into the device is shown as a function of time 3110 in seconds.

III. Using Solar Energy to Ignite and/or to Complement a Mechanical Energy Harvesting Device FIG. 32 is a functional diagram illustrating one example embodiment of a solar based energy harvesting device 130, according to various aspects of the present disclosure. The solar based energy harvesting device 130 may be integrated with the RF based energy harvesting system 1700 of FIG. 17, and the mechanical based energy harvesting system 200 of FIGS. 2A-2B in a single package (e.g., as described below with reference to FIG. 33).

The visible light may also be considered as an optional source for outdoor applications for maximizing total harvested energy. In some embodiments, augmenting any solar cell with the kinetic energy harvesting, enables the solar panel to continue to act as a power source even when dark or clouded, effectively acting as an energy storage module backing up the power produced by the solar cell.

Some embodiments may use for graphene as a conductive anode in a solar cell, featuring a flexible organic photovoltaic cell. The main performance parameter is power conversion efficiency (Pce) for any solar cell is given by Equation (15):

$$P_{ce} = \frac{V_{max} J_{max}}{P_{in}} \qquad \text{Eq. (15)}$$

Where $P_{in}$ is the incidental optical power density, $V_{max}$ and $J_{max}$ are the voltage current density at the maximum power operating point respectively. A power conversion efficiency of 10.04% has been achieved with appropriate choice of parameters for doping, thickness of various layers and fill factor of the graphene sheet. The I-V characteristic of the junction is a linear function of the contact area between the graphene layer and the doped semiconductor technology used in the process, with GaAs having demonstrated superior performance.

In some embodiments, the size of the metal plates 210 and 215 of FIGS. 2A-2B is set to reach the desired power level for the specific application (e.g., the power required by an electronic device that is receiving power from the energy harvesting device that is using the metal plates 210 and 215. If the solar cell exceeds the size of the metal plates for energy harvesting, the individual support system needs to anchor and keep each individual solar cell at a sufficient distance from the moving plate 215 to deter any interference with the mechanical oscillation of the plate and piezoelectric cantilever. The process of structural parameters includes GaAs thickness, graphene work function and transmittance, and n-type doping concentration in GaAs crystal.

Figure 32:
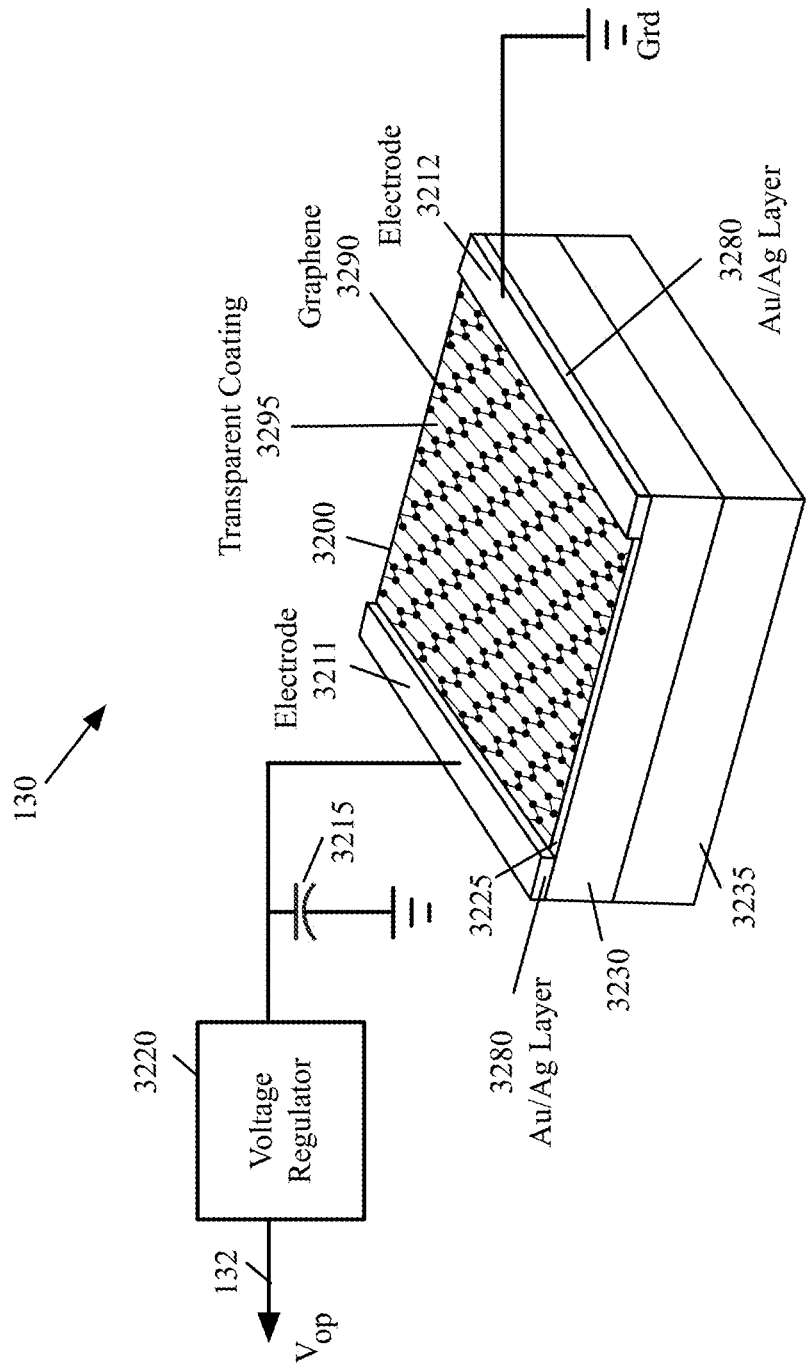
FIG. 32 is a functional diagram illustrating one example embodiment of a solar based energy harvesting device, according to various aspects of the present disclosure.

With reference to FIG. 32, the solar based energy harvesting device 130 may use the impinging light on the device 130 to harvest energy. In some of the present embodiments, a layer 3225 of graphene 3290 may be used as the primary conduit to harvest optical energy illuminating the surface of the device 130. As described above, graphene is a form (or allotrope) of carbon that is formed from a single layer of carbon atoms arranged in a hexagonal lattice. Graphene conducts heat and electricity efficiently and is nearly transparent. The device's top layer may be covered with a transparent coating layer 3295 (e.g., titanium deuteride TiD2) to protect against any damage to the layer of graphene underneath.

Graphene, in some embodiments, may be the primary component which interacts with incident photons and extract energy from impinging light. The electrodes 3211-3212 are connected to the graphene over a layer 3280 of gold (or silver) and may be used to drive the output stage, which may include a storage capacitor 3215 and a voltage regulator 3220.

For bonding material, the metallization layer 3280 plays important roles in bonding reliability. The gold or silver may be utilized for metal-dielectric-metal (MDM) nanostructure. For example, a thin solar cell structure may be comprised of graphene deposited on two shallow gold gratings acting as metallic plasmons. Metallic plasmons are metals that support surface plasmons and oscillation of electron density with respect to the fixed positive ions in a metal. It has been demonstrated that the traveling direction of the surface waves may be controlled. A dielectric or semiconductor spacer 3230 of explicit thickness may be unified beneath metal gratings. The graphene layer 3225 may be stacked on top of a layer 3230 of dielectric or semiconductor (e.g., silicon dioxide, SiO2) stacked on top of a bottom layer 3235 of material such as titanium (Ti) or silver. The graphene layer 3225 may have dual contact with metallic gratings 3280 and dielectric spacer 3230 that may offer a channel for incident light to accelerate through and transfer the entire stored induced current loops harvested from incident wave, from the spacer to the semiconductor layer 3230 placed between the dielectric spacer and the back metal reflector layer 3235. The electrodes 3211-3212 connected to the graphene are used to drive the output stage, which may include the storage capacitor 3215 and the voltage regulator 3220.

The output $V_{op}$ 132 of the solar based energy harvesting device 130 may be supplied to the input 102 of the energy harvesting device 100 of FIG. 1. In applications that use solar based energy, when the environment is dark (e.g., at night in an outdoor environment), the energy harvesting device may cease to harvest sufficient energy to power a corresponding electronic device. Using the energy harvesting device 100 of FIG. 1 provides for continuous operation by relying on the alternative power sources as described herein.

IV. Packaging

Figure 33:
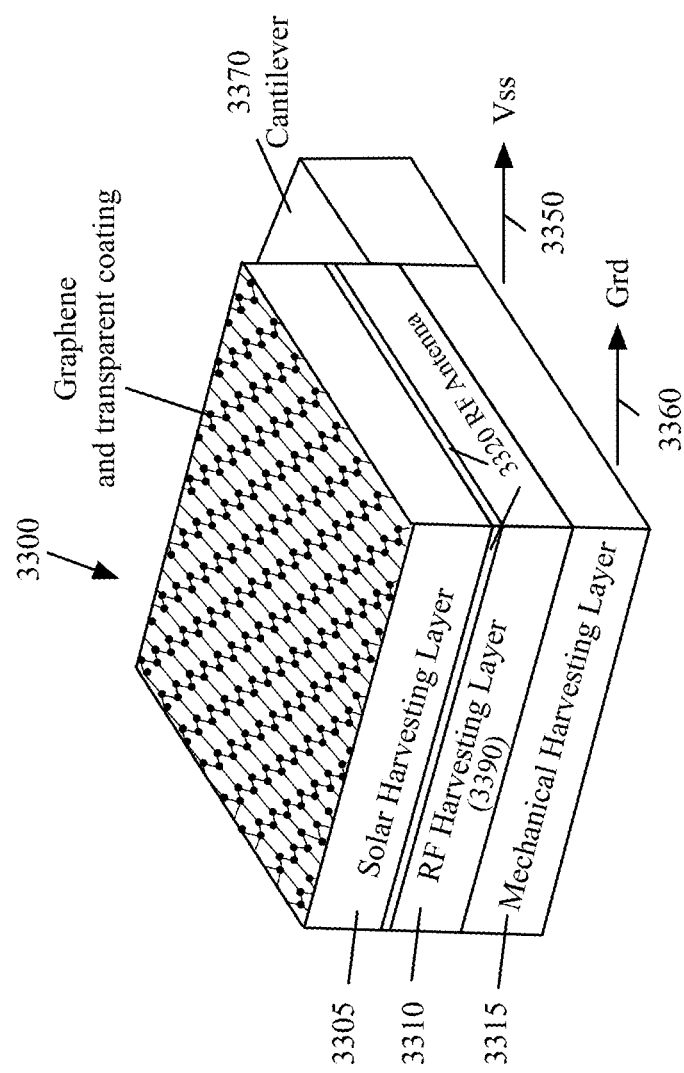
FIG. 33 illustrates an example packaging for the energy harvesting device that combines the RF, optical, and mechanical harvesting devices of FIGS. 2A, 2B, 17, and 32, according to various aspects of the present disclosure.

FIG. 33 illustrates an example packaging for the energy harvesting device 3300 that combines the RF, solar, and mechanical harvesting devices of FIGS. 2A, 2B, 17, and 32, according to various aspects of the present disclosure. With reference to FIG. 33, the energy harvesting device 3300 may include some or all components of the energy harvesting device 100 of FIG. 1. The packaging for the device 3300 may be organized as a three-dimensional stack, where the optical energy harvesting layer 3305 may be placed on the top layer, followed by the radio frequency energy harvesting layer 3310, followed by the mechanical harvesting layer 3315, coupled to one or more cantilevers 3370 as described above with reference to FIGS. 2A-2B. In some embodiments, two near-planar interacting surfaces in the mechanical harvesting layer 3315 is required with distances less than 100 nanometer to effectively create a platform for manifestation of Casimir force. The interior of the package 3300 may be vacuum sealed.

The output of the device 3300 is the voltage supply source, Vss 3350 and ground connection, Grd 3360. In application for wireless sensor networks, the RF harvesting circuit embedded in RF layer 3310 may be complemented with a transceiver 3390 coupled with an RF antenna 3320, and power level reporting circuit embedded in the RF harvesting layer 3310. There may be multiple uses of a transceiver in the system, including remote power monitoring of the device and collection of telemetry data produced by wireless sensors or IoT type devices. In some embodiments, in the same package with the device, sensors, for example and without any limitations, temperature sensors, gyros, magnetometer, accelerometer, chemical sensors, electrical sensors, nuclear sensors, or optical transducers are included for environmental or location monitoring and transmission of the telemetry data to a base station.

By way of example, the telemetry data payload in addition to power level of the device may include sensory data, ranging from an identification code to ambient temperature or pressure, and the device may be quarried wirelessly on a as needed basis or transmitted periodically.

Figure 34:
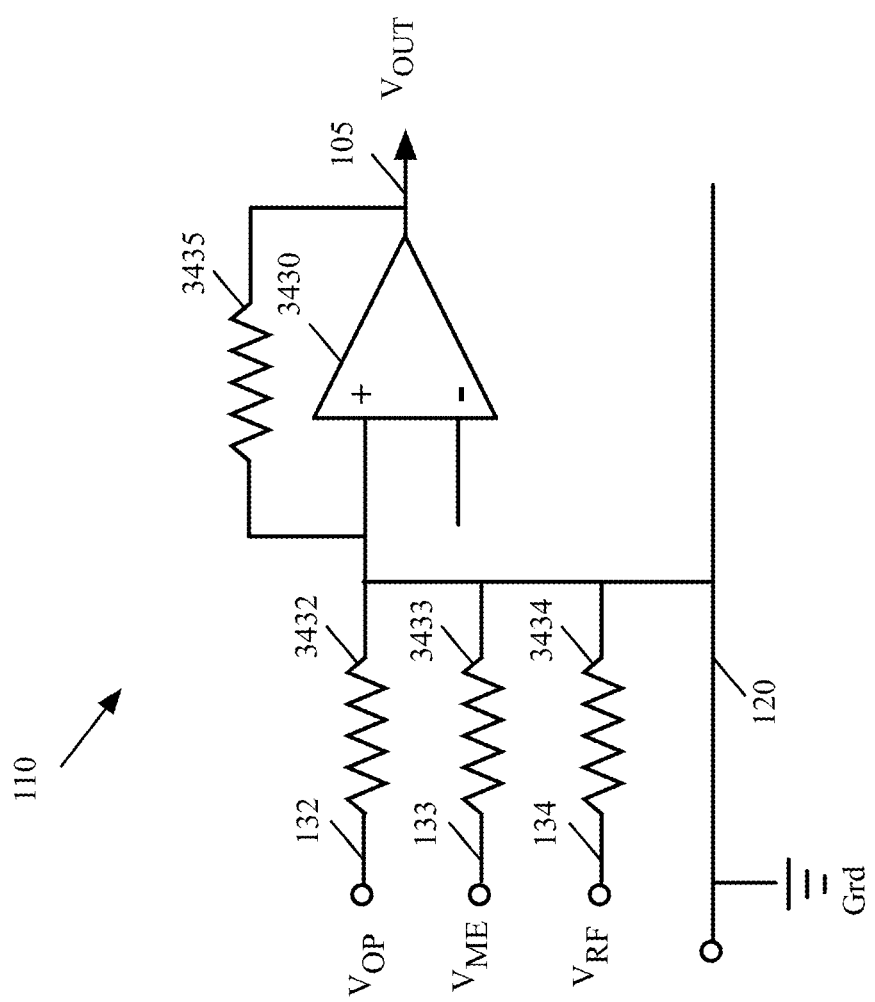
FIG. 34 is a functional diagram illustrating one example implementation of the voltage adder of FIG. 1, according to various aspects of the present disclosure.

FIG. 34 is a functional diagram illustrating one example implementation of the voltage adder 110 of FIG. 1, according to various aspects of the present disclosure. The voltage adder 110 and the output load 115 of FIG. 1 are implemented by the operational amplifier 3430 and resistors 3432-3435 to provide the output voltage $V_{OUT}$ 105. $V_{OP}$ 132, $V_{ME}$ 133, and $V_{RF}$ 134 may be equalized to the same voltage level with different currents by using the resistors 3431-3433 and adding the currents together to produce a combined output $V_{OUT}$ 105 (the current in the resistor 3435 is the sum of the currents in the resistors 3432-3434).

The $V_{OP}$ 132 may be the voltage level harvested from solar radiation or optical sources, for example, energy harvested in optical frequencies (e.g., 330-770 THz). The $V_{ME}$ 133 may be the voltage level harvested from mechanical sources by combining piezoelectric and Casimir force. The Casimir force may be accounted for and harvested to constructively add to the efficiency of the overall device output power. The $V_{RF}$ 134 may be the voltage level harvested from the RF sources such as the ambient electromagnetic radiation in a prescribed radio frequency range (e.g., 200 MHz to 5 GHz) in the licensed or unlicensed bands. With reference to FIG. 33, the voltage adder 110 may be included in any of the layers 3305, 3310, or 3315.

Figure 35:
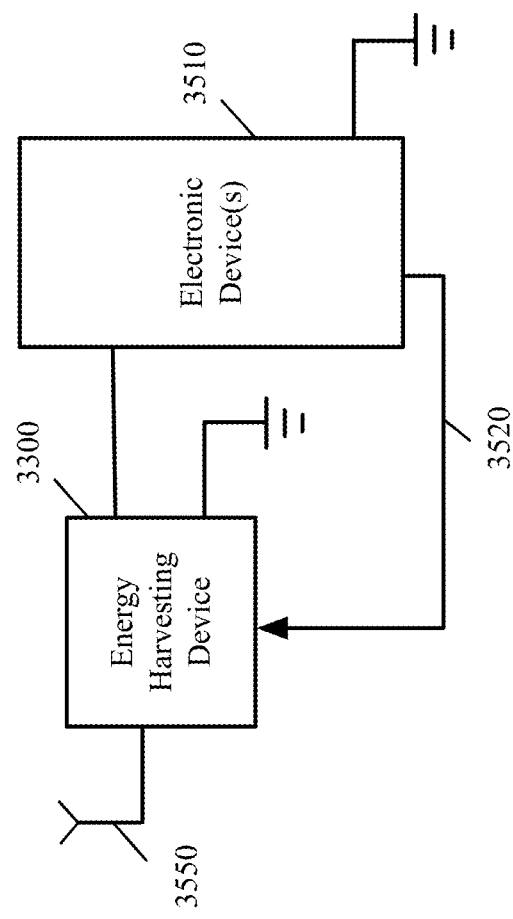
FIG. 35 is a functional diagram illustrating one example of the use of the energy harvesting device of FIG. 33 as a power supply source for electronic devices such as transducers, sensors, communication devices, and/or IoT devices, according to various aspects of the present disclosure.

FIG. 35 is a functional diagram illustrating one example of the use of the energy harvesting device of FIG. 33 as a power supply source for electronic devices such as transducers, sensors, communication devices, and/or IoT devices, according to various aspects of the present disclosure. With reference to FIG. 35, the device 3300 may be employed to energize and act as a power supply source to one or more electronic devices 3510 such as transducers, sensors, communication and/or IoT devices. As an example, the device 3300 may provide sufficient power to act as a power supply for a low power transducer or sensor device 3510 to conduct chemical/optical/ambient transduction of transforming a reaction in the transducer or sensor to an output signal 3520. With the option of using the RF energy circuitry, with addition of an optional transceiver integrated in the energy harvesting device 3300, the electronic device 3510 may conform to waveforms defined in international standards (e.g., ISO-6805) to transmit back to a base station, using the antenna 3550, a telemetry signal (e.g., an information bearing signal such as temperature, pressure, toxicity, etc.) produced by the transducer or sensor 3510.

Figure 36:
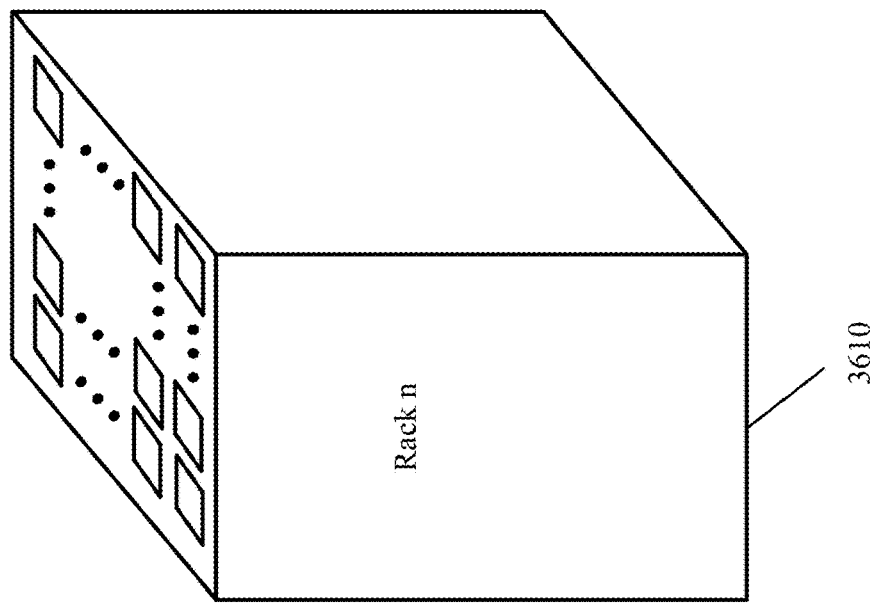
FIG. 36 is a functional diagram illustrating the replication of energy harvesting devices, according to various aspects of the present disclosure.
Figure 36:
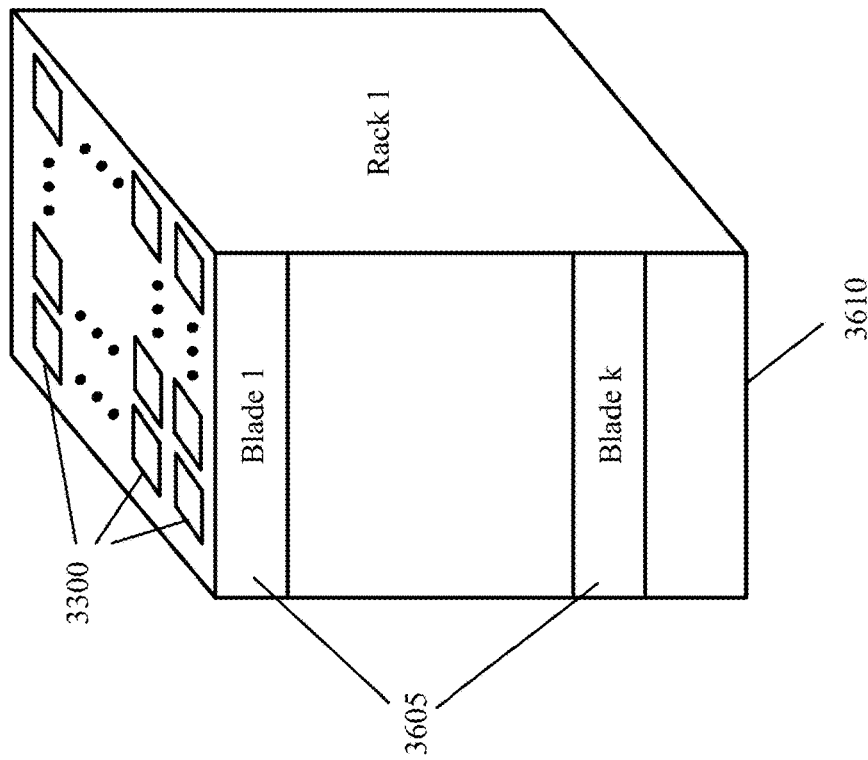

In large scale, the device 3300 of FIG. 33 may be replicated and housed in large packages, such as blades and racks to scale and produce sufficient energy for residential or industrial applications such as, for example and without any limitations, home appliances, computer networks for businesses and homes, office buildings, small office/home of office (SOHO), etc. FIG. 36 is a functional diagram illustrating the replication of energy harvesting devices, according to various aspects of the present disclosure. With reference to FIG. 36, multiple energy harvesting devices 3300 are replicated to form a blade 3605. Multiple blades 3605 are replicated to form a rack 3610. Multiple racks 3610 may be used to provide power for residential and/or industrial applications.

Figure 37:
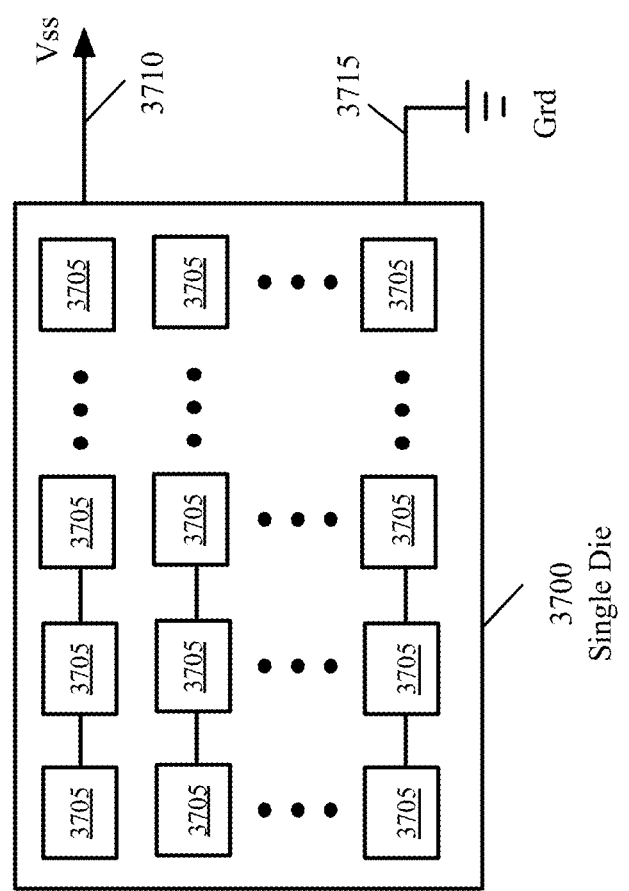
FIG. 37 illustrates a conceptual diagram for a multicell configuration of energy harvesting devices, according to various aspects of the present disclosure.

In some aspects of the present embodiments, multiple energy harvesting devices may be fabricated into a single die. FIG. 37 illustrates a conceptual diagram for a multicell configuration of energy harvesting devices, according to various aspects of the present disclosure. With reference to FIG. 37, multiple energy harvesting devices 3705 are cascaded and are fabricated on a single die in a two-dimensional configuration. The die may sum up the voltages generated by all the individual energy harvesting devices 3705 to provide the aggregate output voltages Vss 3710, with respect to the ground pin 3715.

V. Temperature & Vibration

In some embodiments, the energy harvesting device may operate at room temperature and used in an environment without any physical vibration. In other embodiments, the energy harvesting device may operate in environments with more extreme temperatures or high temperature gradients. In these embodiments, the re-ignition of the energy harvesting device may be required more frequently.

In design of the nano piezoelectric cantilever (e.g., the cantilever 270 of FIGS. 2A-2B), it is possible to further enhance the energy harvesting efficiency by considering ambient vibrations present around where the device is used. This additional energy may be harvested, as vibration may add constructively to the overall oscillation experienced by the cantilever architecture. These vibrations may be present from multiple sources, such as a human motion in walking or running, vehicle or aircraft movements, structural movements such as bridges or tunnels due to periodic stress, industrial movements such as conveyors, pumps and fans. Design considerations may be taken into account in the nano piezoelectric cantilever for additional acceleration and oscillation modes due to ambient vibration present in the environment where the device may be used.

It has been successfully demonstrated that the synthesis of vertically aligned carbon nanotubes may be achieved on iron, cobalt or nickel-deposited quartz plates by chemical vapor deposition with ethylenediamine as a precursor to act as both the etching reagent for the formation of metal nanoparticles and carbon source for the growth of aligned carbon nanotubes. The deposited metal film determines the density and diameter of carbon nanotubes. The duration of the reaction time impacts the thickness of and the length of the tubes. The synthesized carbon nanotubes are multiwalled with a bamboo-like structure confirmed by electron microscopy and Raman spectroscopy.

Fabrication of vertically aligned carbon nanotubes between two parallel plates may be realized by catalytic chemical vapor deposition (CVD). The most common and efficient catalysts are the mono- or bimetallic transition metals (Fe, Co, Ni), while $Al_2O_3$, $SiO_2$ or MgO are generally applied as supports. Careful consideration is given to choosing the catalyst layer and the support. The properties of both the support and the catalytic layer considerably affect the properties of carbon nanotube arrays in terms of density, orientation, length, thickness and graphitization of the product. High density carbon nanotube arrays may also be fabricated by using high quantity of iron oxide clusters to enable the growth in the desired orientation perpendicular to both plates. The objective in some of the present embodiments may be to have a geometry of the carbon nanotube array that is aligned in the axial direction with no deformation between two end points. It is well known that the alignment of carbon nanotube forests is mainly due to van der Waals interactions between growing nanotubes, and the steric hindrance between neighboring carbon nanotubes. In the carbon nanotube growing process, during the early stage of CVD, the growth begins in random directions to the substrate surface. Sufficient reaction time may be needed to reach desired orientation and length of the array.

Nanoscale printing for patterning of surfaces in two or three dimensions with at least one feature on the submicron length scale has been developing rapidly. Fabrication of fractal pattern metal plates on gold may be realized by electron-beam lithography and polymer-based "soft" nanofabrication methods to transfer arbitrary metallic nanopatterns to the substrates. The spacing resolution is limited only by the resolution of electron-beam lithography. This approach avoids residual doping from ion implantation, as occurs in focused-ion beam milling.

Nanoimprint lithography (NIL) has been used in the production of nanostructured supercapacitors (micro-supercapacitors, MSC). Liquid sucrose- and lignin-precursor are used in printing to produce patterns with liquid-carbonprecursor. NIL-printing approach enables nitrogen doping to achieve an increased supercapacitor performance for aqueous electrolytes.

In a first aspect of the present embodiments, an energy harvesting device comprises: first and second substantially parallel plates; a plurality of nanotubes connected between the first and second plates along an axial direction of the nanotubes; a piezoelectric cantilever connected to the first plate; and a device packaging housing the first and second plates, the plurality of nanotubes, and the cantilever; where the second plate is fixedly connected the device packaging; where the first plate and the cantilever are free to move towards and away from the second plate; where the cantilever oscillates by being attracted towards the second plate in response to the Casimir force and by being repelled from the second plate by a spring action on the axial direction of the nanotubes; and where the oscillations of the cantilever cause the piezoelectric cantilever to convert the oscillations to electrical current.

In an embodiment of the first aspect, the device packaging is vacuum sealed.

In another embodiment of the first aspect, the nanotubes are carbon nanotubes.

In another embodiment of the first aspect, the plates are metallic.

In another embodiment of the first aspect, the plates have a small surface roughness amplitude variation compared to a distance between the plates.

An embodiment of the first aspect further comprises an electrical switch comprising first and second connections, the first connection connected to the piezoelectric cantilever; and a radio frequency (RF) exciter connected to the second connection of the electrical switch, the RF exciter comprising: an antenna for receiving RF signals; a capacitor; and an RF to direct current (DC) rectifier for converting energy from the RF signals received by the antenna into electrical current and charging the capacitor for delivering an electrical current to the piezoelectric cantilever through the electrical switch to initiate or reignite the cantilever oscillations.

In another embodiment of the first aspect, the device packaging houses and vacuum seals the electrical switch and the RF exciter.

Another embodiment of the first aspect further comprises a voltage adder, comprising: a first input for receiving a voltage from the piezoelectric cantilever; a second input for receiving a voltage from the RF exciter; and an output for providing a sum of the voltages received at the first and second inputs to drive an electronic device.

In another embodiment of the first aspect, the antenna is configured to receive the RF signals from one or more of a smartphone, a cellular telephone, a tablet computer, a laptop computer, a desktop computer, a personal digital assistant (PDA) device, and one or more flying object comprising a drone, a balloon, an airplane, a helicopter, and a space-based platform.

In another embodiment of the first aspect, the electrical switch is a first electrical switch, the energy harvesting device further comprising: a second electrical switch comprising first and second connections, the first connection connected to the piezoelectric cantilever; a capacitor; and an optical exciter connected to the second connection of the electrical switch, the optical exciter comprising: a solar cell for receiving optical signals and charging the capacitor for delivering an electrical current to the piezoelectric cantilever through the second electrical switch.

In another embodiment of the first aspect, the device packaging houses and vacuum seals the first and second electrical switches, the RF exciter, and the optical exciter.

Another embodiment of the first aspect further comprises a storage capacitor for storing the electrical energy as a first voltage; a voltage adder comprising: a first input for receiving a voltage from the piezoelectric cantilever; a second input for receiving a voltage from the RF exciter; a third input for receiving a voltage from the optical exciter; and an output for providing a sum of the voltages received at the first, second, and third inputs to drive an electronic device.

In another embodiment of the first aspect, the solar cell is configured to receive signals in optical spectrum comprising one or more of ambient light and solar light.

Another embodiment of the first aspect further comprises a voltage dividing circuit for determining a level of a voltage output of the energy harvesting device; and a transceiver for transmitting the level of the voltage output of the energy harvesting device.

Another embodiment of the first aspect further comprises a transceiver for transmitting telemetry data collected from one or more temperature sensors, gyros, magnetometer, accelerometer, chemical sensors, electrical sensors, nuclear sensors, and optical transducers.

Another embodiment of the first aspect further comprises an electrical switch comprising first and second connections, the first connection connected to the piezoelectric cantilever; and an optical exciter connected to the second connection of the electrical switch, the optical exciter comprising: a capacitor; and a solar cell for receiving optical signals and charging the capacitor for delivering an electrical current to the piezoelectric cantilever through the electrical switch.

Another embodiment of the first aspect further comprises a voltage adder, comprising: a first input for receiving a voltage from the piezoelectric cantilever; a second input for receiving a voltage from the optical exciter; and an output current for providing a sum of the voltages received at the first and second inputs to drive an electronic device.

In another embodiment of the first aspect, the electronic device is one of a sensor and an Internet of things (IoT) device.

In another embodiment of the first aspect, the device packaging houses and vacuum seals the electrical switch and the optical exciter.

In another embodiment of the first aspect, the piezoelectric cantilever is a microelectromechanical system (MEMS) nano piezoelectric cantilever.

In another embodiment of the first aspect, the piezoelectric cantilever is a first piezoelectric cantilever, the energy harvesting device further comprising a plurality of piezoelectric cantilevers connected to the first plate, the plurality of cantilevers comprising the first piezoelectric cantilever.

Another embodiment of the first aspect further comprises a plurality of electrical switches, each electrical switch comprising first and second connections, the first connection of each electrical switch connected to a corresponding piezoelectric cantilever in the plurality of piezoelectric cantilevers; and a radio frequency (RF) exciter connected to the second connection of each electrical switch in the plurality of electrical switches switch, the RF exciter comprising: an antenna for receiving RF signals; a capacitor; and an RF to direct current (DC) rectifier for converting energy from the RF signals received by the antenna into electrical current for charging the capacitor for delivering an electrical current to each of the plurality of piezoelectric cantilevers through the corresponding electrical switch.

In another embodiment of the first aspect, the first and second plates are fractal shape plates.

In another embodiment of the first aspect, the first and second plates are solid plates.

In another embodiment of the first aspect, a distance between the first and second plates is less than a micrometer.

In a second aspect of the present embodiments, a power supply comprises: an output connection for connecting to an electronic device; and a plurality of energy harvesting devices, each energy harvesting device comprising: first and second substantially parallel metallic plates; a plurality of nanotubes connected between the first and second plates along an axial direction of the nanotubes; a piezoelectric cantilever connected to the first plate; and a device packaging housing the first and second plates, the plurality of nanotubes, and the cantilever; where the second plate is fixedly connected the device packaging; where the first plate and the cantilever are free to move towards and away from the second plate; where the cantilever oscillates by being attracted towards the second plate in response to the Casimir force and by being repelled from the second plate by a spring action on the axial direction of the nanotubes; and where the oscillations of the cantilever cause the piezoelectric cantilever to convert the oscillations to electrical current; where the power supply adds the electrical energy of the plurality of energy harvesting devices and provides an electrical voltage to the output connection as a voltage source for the electronic device.

In a third aspect of the present embodiments, an energy harvesting device, comprises: first and second plates; a plurality of nanotubes, each nanotube comprising first and second connections, the first connection of each nanotube connected to the first plate; a piezoelectric cantilever connected to the first plate; a plurality of metallic spheres, each metallic sphere connected to the second connection of a nanotube; a device packaging housing the first and second plates, the plurality of nanotubes, the plurality of spheres, and the cantilever; where the second plate is fixedly connected the device packaging; where the first plate, the cantilever, the plurality of nanotubes, and the plurality of spheres are free to move towards and away from the second plate; where the cantilever oscillates by being attracted towards the second plate in response to the Casimir force and by being repelled from the second plate by a spring action on an axial direction of the nanotubes; and where the oscillations of the cantilever cause the piezoelectric cantilever to convert the oscillations to electrical energy.

In a fourth aspect of the present embodiments, a method of determining a distance between a radio frequency (RF) exciter and an RF energy harvesting device for delivering a predetermined amount of RF power by the RF exciter to the energy harvesting device, the energy harvesting device comprising an antenna and a super capacitor, the method comprising: a) selecting a distance between the RF exciter and the energy harvesting device; b) determining an amount of RF energy lost in free space due to travelling of RF signals from the RF exciter to the RF energy harvesting device; c) calculating an amount of power received at an input of the antenna from the RF exciter based on the RF energy loss; d) calculating an amount of power output from the antenna to the energy harvesting device based on the power received at the input of the antenna; e) calculating, based on the amount of power output from the antenna, an amount of power charged into the super capacitor to reach a predetermined power level; and when the amount of power charged into the super capacitor is below a predetermine level, decreasing the distance between the RF exciter and the energy harvesting device and repeating b) to e) until the power charged into the super capacitor reaches the predetermined level.

An embodiment of the fourth aspect comprises: calculating an amount of power at an input of the super capacitor; where calculating the amount of power charged into the super capacitor further comprises using the amount of power at the input of the super capacitor.

Another embodiment of the fourth aspect comprises: calculating a duration of time to charge the super capacitor; calculating a duration of time to discharge the super capacitor; where calculating the amount of power charged into the super capacitor further comprises using the amount of time to charge the super capacitor and the amount of time to discharge the super capacitor.

Another embodiment of the fourth aspect comprises: determining frequency modes in an oscillatory behavior of the RF energy harvesting device.

In a fifth aspect of the present embodiments, a method of designing a mechanical energy harvesting device comprising first and second plates comprises: calculating a Casimir force between the first and second plates with infinite boundaries; adjusting the Casimir force for effects of the first plate uniformly moving towards the second plate; selecting a finite boundary size for the first and second plates; adjusting the Casimir force for the selected finite boundary size for the first and second plates; computing the Casimir force in a plurality of modes from quantum electrodynamics methods considering a three-dimensional volume between the first and second plates based on the selected finite boundary sizes for the first and second plates; and computing a power level generated by the energy harvesting device based on the computed Casimir force.

An embodiment of the fifth aspect further comprises increasing the finite boundary size for the first and second plates when the power level generated by the energy harvesting device is below of a threshold; and repeating the computing of the Casimir force and increasing the finite boundary size until the power level generated by the energy harvesting device reaches the threshold.

Another embodiment of the fifth aspect further comprises when the power level generated by the energy harvesting device reaches a threshold, selecting a fractal design for the first and second plates; computing the Casimir force in the plurality of modes from quantum electrodynamics methods considering the three-dimensional volume between the first and second plates based on the selected finite boundary sizes for the first and second plates and the fractal design; and computing the power level generated by the energy harvesting device based on the computed Casimir force.

The above description presents the best mode contemplated for carrying out the present embodiments, and of the manner and process of practicing them, in such full, clear, concise, and exact terms as to enable any person skilled in the art to which they pertain to practice these embodiments. While the invention has been described with reference to numerous specific details, one of ordinary skill in the art will recognize that the invention can be embodied in other specific forms without departing from the spirit of the invention. In addition, a number of the figures (including FIGS. 16 and 23) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. An energy harvesting device, comprising:
a radio frequency (RF) energy harvesting layer comprising:
an RF antenna configured to receive RF signals; and
an RF to direct current (DC) rectifier configured to convert RF signals received from the antenna into electrical current;
a mechanical energy harvesting layer comprising:
first and second substantially parallel plates;
a plurality of nanotubes connected between the first and second plates along an axial direction of the nanotubes; and
a piezoelectric cantilever connected to the first plate;
a device packaging housing the RF energy harvesting layer and the mechanical energy harvesting layer, wherein the second plate is fixedly connected to the device packaging, wherein the first plate and the piezoelectric cantilever are free to move towards and away from the second plate, wherein the piezoelectric cantilever is configured to oscillate by being attracted towards the second plate in response to the Casimir force and by being repelled from the second plate by a spring action on the axial direction of the nanotubes, and wherein the oscillations of the piezoelectric cantilever convert to electrical current; and
a voltage adder comprising:
a first input for receiving a voltage from the piezoelectric cantilever;
a second input for receiving a voltage from the RF to DC rectifier; and
an output current for providing a sum of the voltages received at the first and second inputs.

2. The energy harvesting device of claim 1 further comprising:
a DC-DC charge pump configured to:
receive a DC voltage from the RF to DC rectifier; and
step-up the output voltage of the RF to DC rectifier.

3. The energy harvesting device of claim 1 further comprising:
an electrical switch comprising first and second connections, wherein the first connection is connected to the piezoelectric cantilever, and wherein the second connector is connected to RF energy harvesting layer; and
a capacitor;
wherein the RF energy harvesting layer is configured to charge the capacitor for delivering an electrical current to the piezoelectric cantilever through the electrical switch.

4. The energy harvesting device of claim 3, wherein the device packaging houses and vacuum seals the electrical switch and the capacitor.

5. The energy harvesting device of claim 3,
wherein the energy harvesting device is configured to operate in an excitement mode and an operating mode,
wherein, in the excitement mode, the electrical switch is closed and the piezoelectric cantilever is configured to force the first plate to exert strain on the nanotubes, and
wherein, in the operating mode, the electrical switch is open and the oscillations of the piezoelectric cantilever convert into electrical current.

6. The energy harvesting device of claim 2, wherein the radio frequency (RF) energy harvesting layer further comprises a voltage regulator configured to provide a constant voltage level at an output of the DC-DC charge pump.

7. The energy harvesting device of claim 1, wherein the device packaging is vacuum sealed.

8. The energy harvesting device of claim 1, wherein the nanotubes are carbon nanotubes.

9. The energy harvesting device of claim 1, wherein the piezoelectric cantilever is a bimorph cantilever comprising first and second independently polarized piezoelectric layers, wherein the energy harvesting device further comprises first, second, and third electrodes, wherein the first piezoelectric layer is stacked between the first and second electrodes, wherein the second piezoelectric layer is stacked between the second and third electrodes, wherein the first and second electrodes are configured as ground electrodes, and wherein the third electrode is configured as a voltage source electrode.

10. The energy harvesting device of claim 1, wherein the piezoelectric cantilever is a unimorph cantilever comprising one piezoelectric layer, wherein the energy harvesting device further comprises first and second electrodes, wherein the piezoelectric layer is stacked between the first and second electrodes, wherein the first electrode is configured as a ground electrode, and wherein the second electrode is configured as a voltage source electrode.

11. The energy harvesting device of claim 1, wherein the first and second plates are fractal shape plates.

12. The energy harvesting device of claim 1, wherein the first and second plates are solid plates.

13. The energy harvesting device of claim 1, wherein a distance between the first and second plates is less than a micrometer.

14. The energy harvesting device of claim 1, wherein the energy harvesting device is connected to an electronic device, wherein the output current of the energy harvesting device drives the electronic device.

15. The energy harvesting device of claim 14, wherein the electronic device is one of a sensor and an Internet of things (IoT) device.

16. The energy harvesting device of claim 1, wherein the piezoelectric cantilever is a microelectromechanical system (MEMS) nano piezoelectric cantilever.

17. The energy harvesting device of claim 1, wherein the piezoelectric cantilever is a first piezoelectric cantilever, the energy harvesting device further comprising a plurality of piezoelectric cantilevers connected to the first plate.

18. The energy harvesting device of claim 1 further comprising a transceiver for transmitting telemetry data collected from at least one of a temperature sensor, a gyro, a magnetometer, an accelerometer, a chemical sensor, an electrical sensor, a nuclear sensor, and an optical transducers within the device packaging.

* * * * *